United States Patent
Dickson et al.

(10) Patent No.: US 7,123,413 B2
(45) Date of Patent: Oct. 17, 2006

(54) DOE-BASED SYSTEMS AND DEVICES FOR PRODUCING LASER BEAMS HAVING MODIFIED BEAM CHARACTERISTICS

(75) Inventors: LeRoy Dickson, Morgan Hill, CA (US); Timothy A. Good, Blackwood, NJ (US); John Groot, San Jose, CA (US); Thomas C. Amundsen, Turnersville, NJ (US); C. Harry Knowles, Morristown, NJ (US); Thomas Carullo, Marlton, NJ (US)

(73) Assignee: Metrologic Instruments, Inc., Blackwood, NJ (US)

( * ) Notice: Subject to any disclaimer, the term of this patent is extended or adjusted under 35 U.S.C. 154(b) by 349 days.

(21) Appl. No.: 09/907,491

(22) Filed: Jul. 17, 2001

(65) Prior Publication Data

US 2002/0114076 A1  Aug. 22, 2002

Related U.S. Application Data

(63) Continuation of application No. 09/302,790, filed on Apr. 30, 1999, now abandoned, which is a continuation-in-part of application No. 09/071,512, filed on May 1, 1998, now abandoned, and a continuation-in-part of application No. 08/949,915, filed on Oct. 14, 1997, now Pat. No. 6,158,659, and a continuation-in-part of application No. 08/854,832, filed on May 12, 1997, now Pat. No. 6,085,978, and a continuation-in-part of application No. 08/886,806, filed on Apr. 22, 1997, now Pat. No. 5,984,185, and a continuation-in-part of application No. 08/726,522, filed on Oct. 7, 1996, now Pat. No. 6,073,846, and a continuation-in-part of application No. 08/573,949, filed on Dec. 18, 1995, now abandoned.

(51) Int. Cl.
G02B 27/44 (2006.01)

(52) U.S. Cl. .................. 359/566; 359/565; 359/569; 359/15; 359/16

(58) Field of Classification Search ............ 339/15–18, 339/566, 568, 569, 565, 573
See application file for complete search history.

(56) References Cited

U.S. PATENT DOCUMENTS 4,623,225 A   11/1986   Forkner (Continued)

FOREIGN PATENT DOCUMENTS

DE   4214014 A1   4/1992
EP   0 691 622 A1   1/1996

OTHER PUBLICATIONS

Scientific publication entitled "A Substrate-Mode Holographic Collimating and Beam Shaping Element for Laser Diodes" by Jen-Tsorng Chang, Der-Chin Su, and Zhi-Xian Huang, American Institute of Physics, vol. 70, No. 8, 1997, pp. 919-921.

(Continued)

Primary Examiner—Fayez G. Assaf
(74) Attorney, Agent, or Firm—Thomas J. Perkowski, Esq., P.C.

(57) ABSTRACT

Novel methods are disclosed for designing and constructing miniature optical systems and devices employing light diffractive optical elements (DOEs) for modifying the size and shape of laser beams produced from a commercial-grade laser diodes, over an extended range hitherto unachievable using conventional techniques. The systems and devices of the present invention have uses in a wide range of applications, including laser scanning, optical-based information storage, medical and analytical instrumentation, and the like. In the illustrative embodiments, various techniques are disclosed for implementing the DOEs as holographic optical elements (HOEs), computer-generated holograms (CGHs), as well as other diffractive optical elements.

22 Claims, 63 Drawing Sheets

U.S. PATENT DOCUMENTS

| | | | |
|---|---|---|---|
| 4,767,202 | A | 8/1988 | Hata et al. |
| 5,089,903 | A | 2/1992 | Kuwayama et al. |
| 5,237,451 | A | 8/1993 | Saxe |
| 5,422,746 | A | 6/1995 | Aharoni et al. |
| 5,610,734 | A | 3/1997 | Aharoni et al. |
| 5,663,980 | A | 9/1997 | Adachi |
| 6,057,947 | A | 5/2000 | Hobbs et al. |
| 6,072,607 | A | 6/2000 | Tajiri et al. |
| 6,092,728 | A | 7/2000 | Li et al. |

OTHER PUBLICATIONS

Scientific publication entitled "Design of an Optical Pickup using Double Holographic Lenses" by Hiroyasu Yoshikawa, Shin-ya Hasegawa, Fumio Yamagishi and Masato Nakashima, SPIE, vol. 2652, Jan. 1996, pp. 334-340.

Scientific publication entitled "Mode Control of Semiconductor Laser with Diffraction and Dispersion Feedback" by G. Xu, R. Tsuji, K. Fujii, S. Nakayama, M. Amano, H. Kiyono, Y. Uchiyama, Y. Tokita, Y. Hanasawa, S.B. Mirov, M.J. McCutcheon, and J.R. Whinnery, 1996 American Institute of Physics, pp. 849-853.

Scientific publication entitled "Beam-Shaping of Laser Diodes with Binary Diffraction Optics" by J.M. Asfour and T. Tschudi, SPIE, vol. 2041, 1994.

Scientific publication entitled "Beam-Correcting Holographic Doublet for Focusing Multimode Laser Diodes" by A Aharoni, J.W. Goodman and Y. Amitai, Optics Letters, vol. 18, No. 3, Feb. 1993, pp. 179-181.

Scientific publication entitled "Efficient Beam-Correcting Holographic Collimator for Laser Diodes" by A. Aharoni and J. W. Goodman, Optics Letters, vol. 17, No. 18, Sep. 1992, pp. 1310-1313.

Scientific publication entitled "Design and Fabrication of Diffractive Optical Elements for Beam Shaping and Imaging" by H.P. Herzig and R. Dandiker, SPIE, vol. 1718, 1992, pp. 130-139.

Scientific publication entitled "Beam Shaping by Holographic Filters" by Nicholas C. Roberts, Applied Optics, vol. 28, No. 1, Jan. 1998, pp. 31-33.

Scientific publication entitled "Lensless Holographic Line Scanner" by Fumio Yamagishi, Shinya Hasegawa, Hiroyuki, Ikeda and Takefumi Inagaki, SPIE, vol. 615, 1986, pp. 126-132.

Scientific publication entitled "Design Trade-Offs for a Diode Laser Holographic Scanner" by David Doggett, Stephen Barasch, Mary Jane Wagener, SPIE, vol. 299, 1981, pp. 151-156.

Chapter 19 of the textbook entitled "Optical Holography", the chapter being entitled "Computer Generated Holograms" by Robert J. Collier, Christoph B. Burckhardt and Lawrence H. Lin, Bell Telephone Laboratories, Inc., 1971, pp. 542-563.

International Search Report for Application No. PCT/US99/09603.

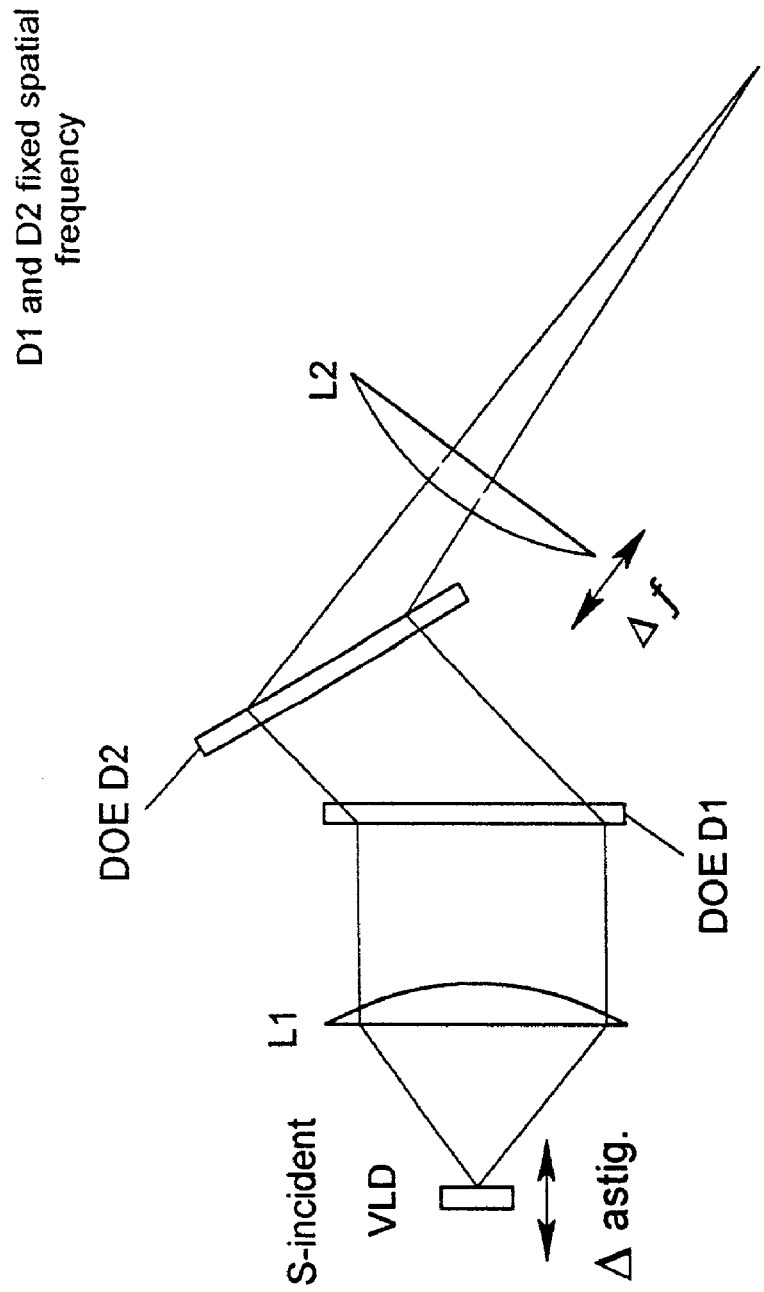
FIG. 2B1

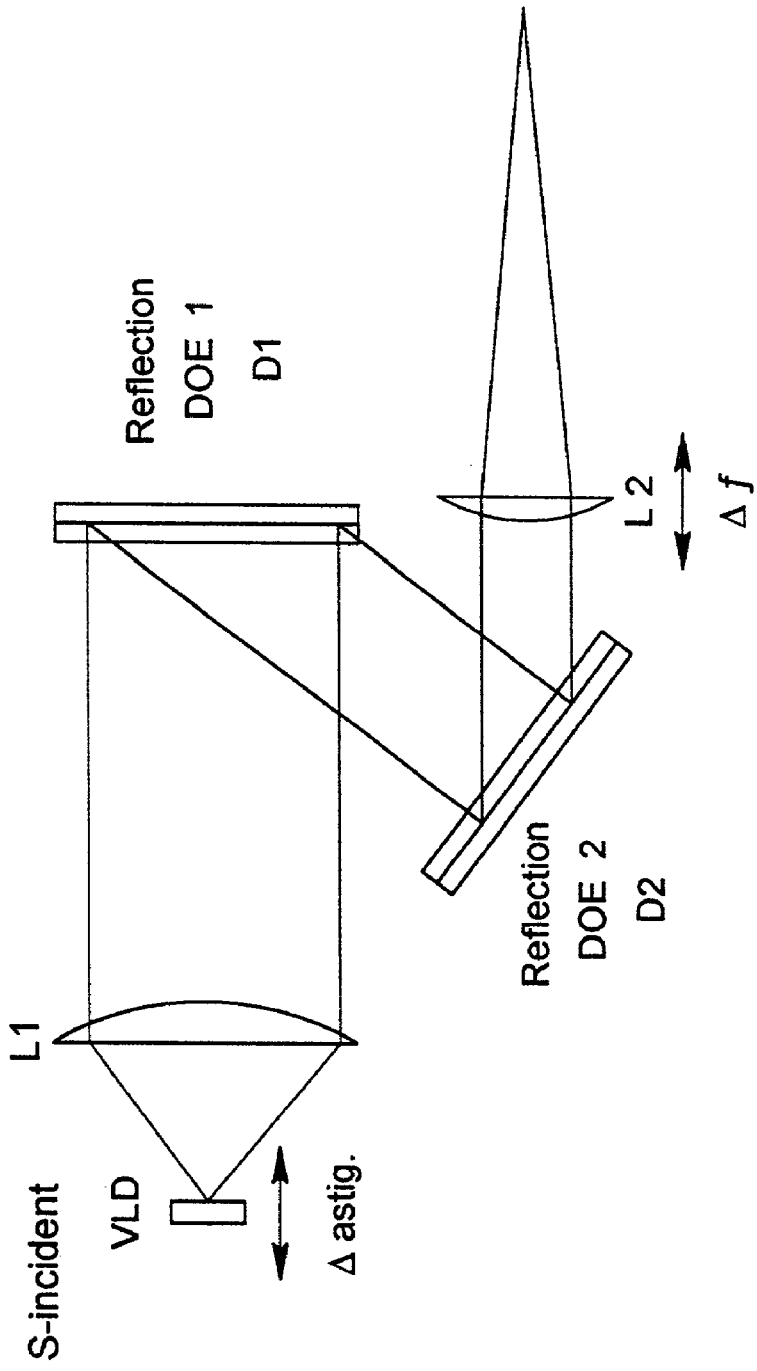
FIG. 2B2
*First Alternative Realization of Embodiment 2*

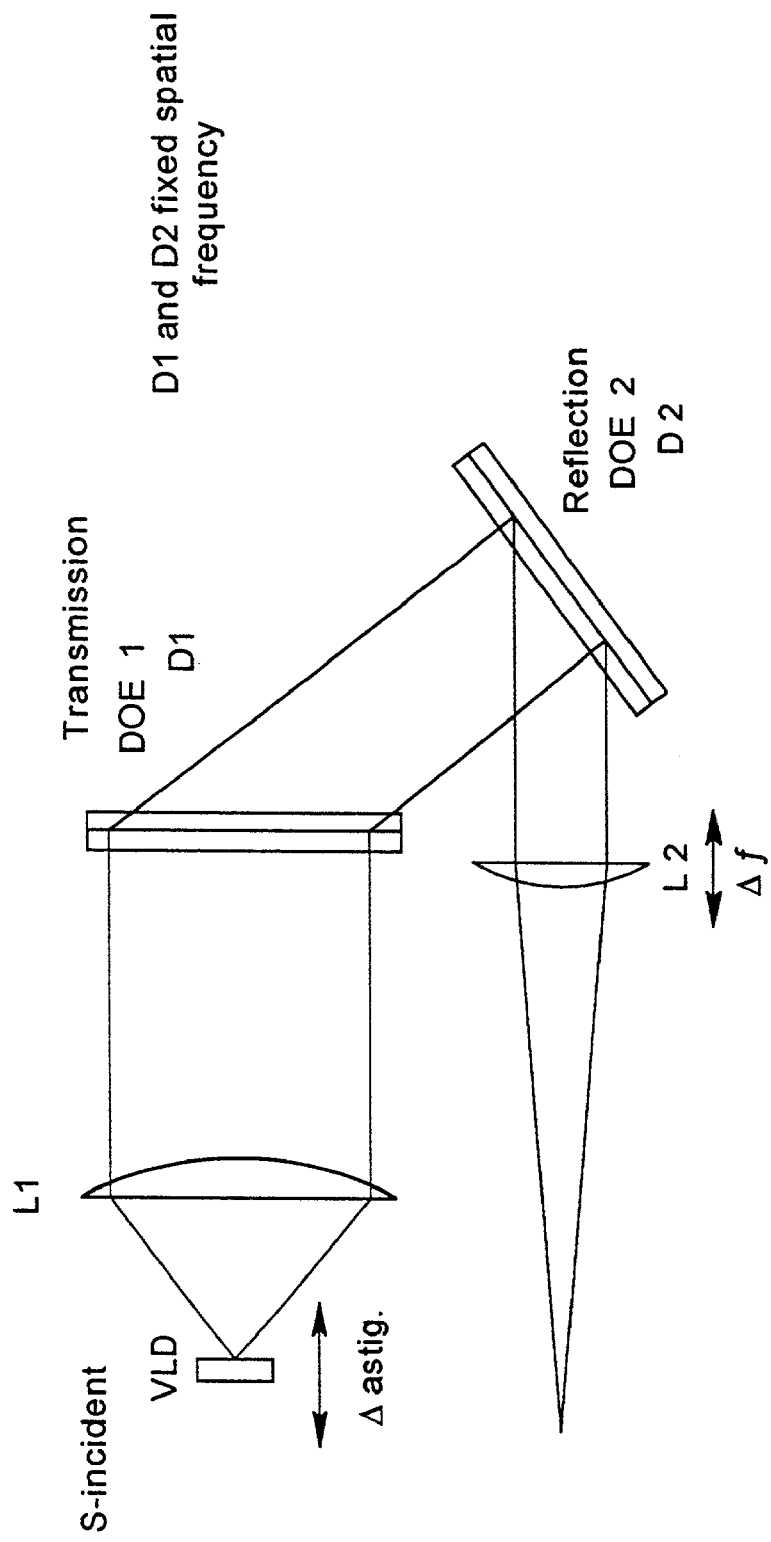
FIG. 2B3
*Second Alternative Realization of Embodiment 2*

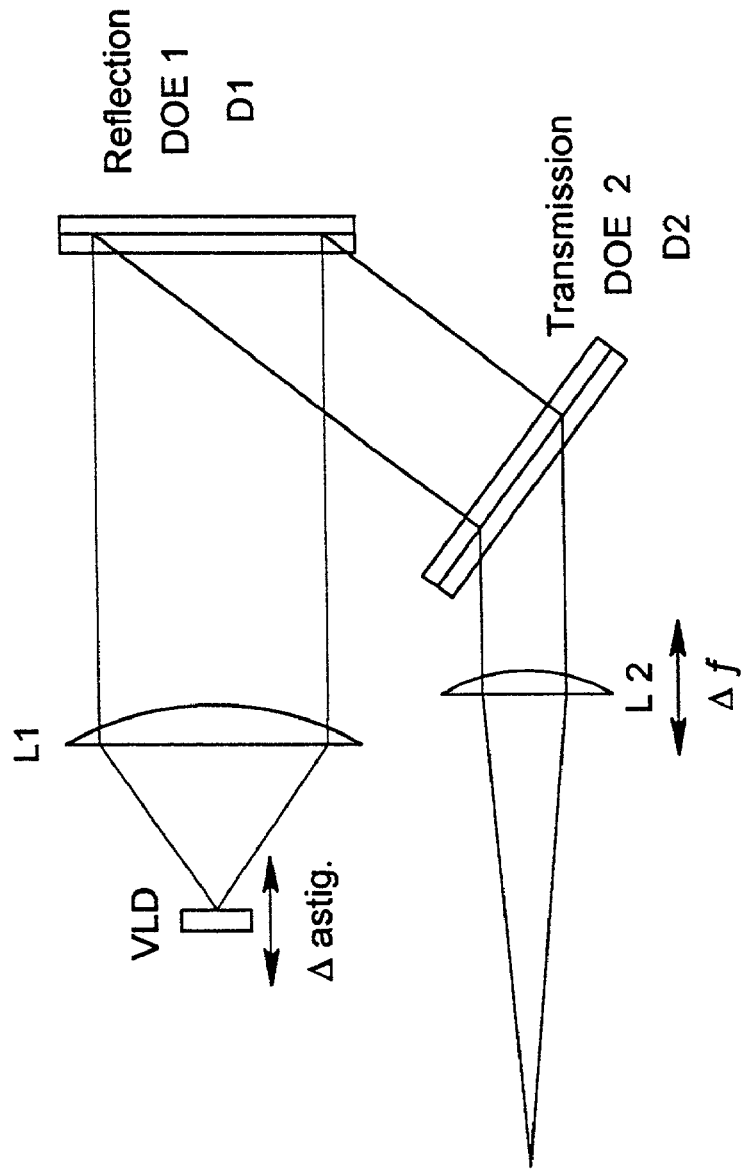
FIG. 2B4
*Third Alternative Realization of Embodiment 2*

Embodiment 3

*Embodiment 4*

*Embodiment 5*

*Embodiment 10*

*Embodiment 11*

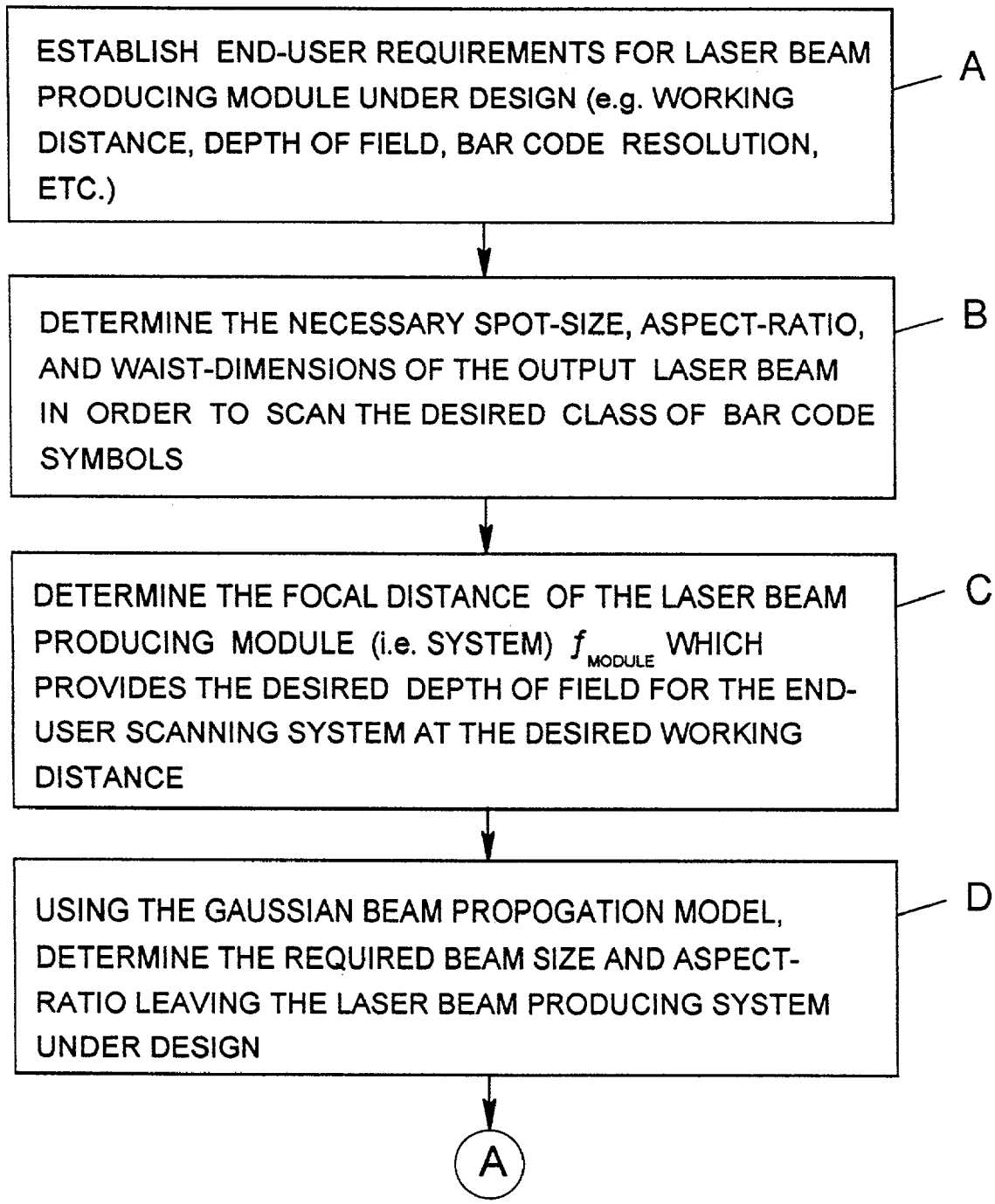
FIG. 3A1

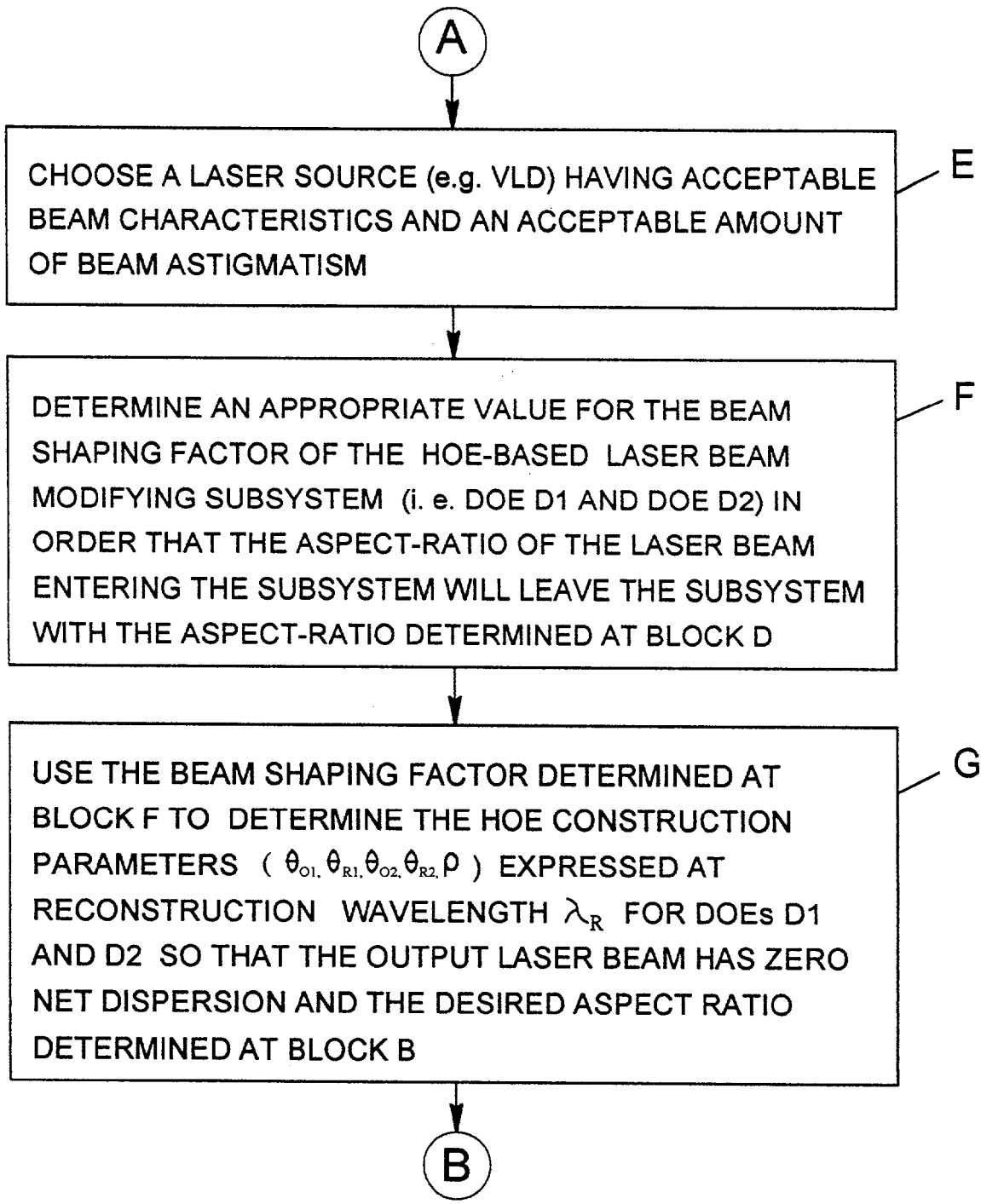
FIG. 3A2

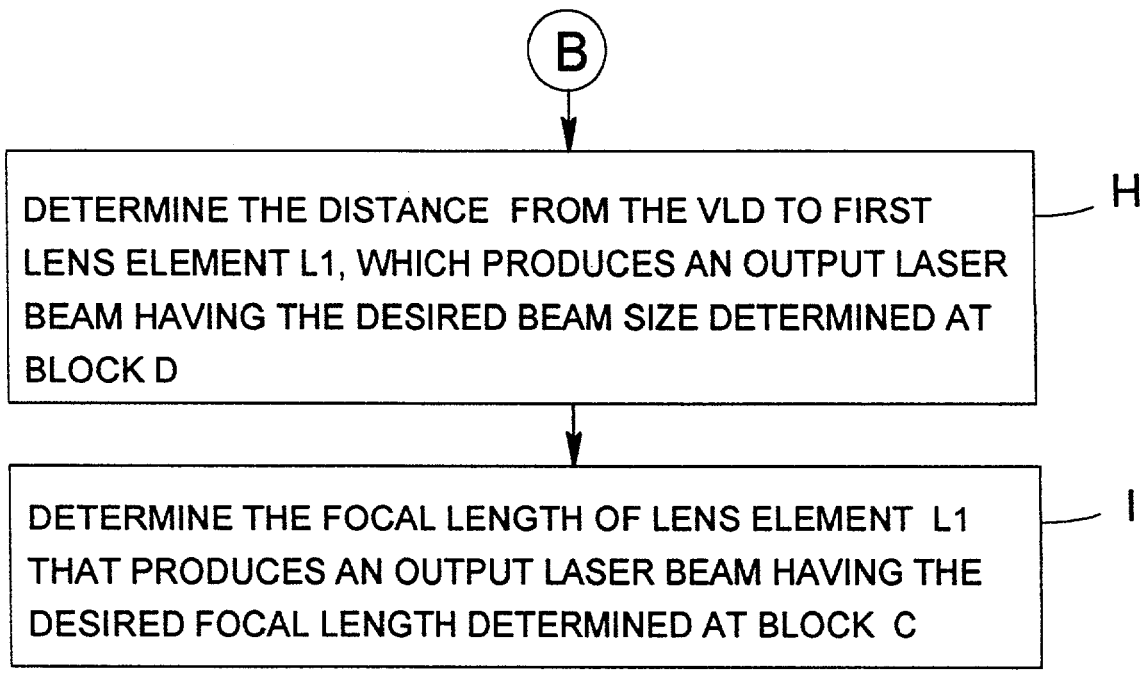
FIG. 3A3

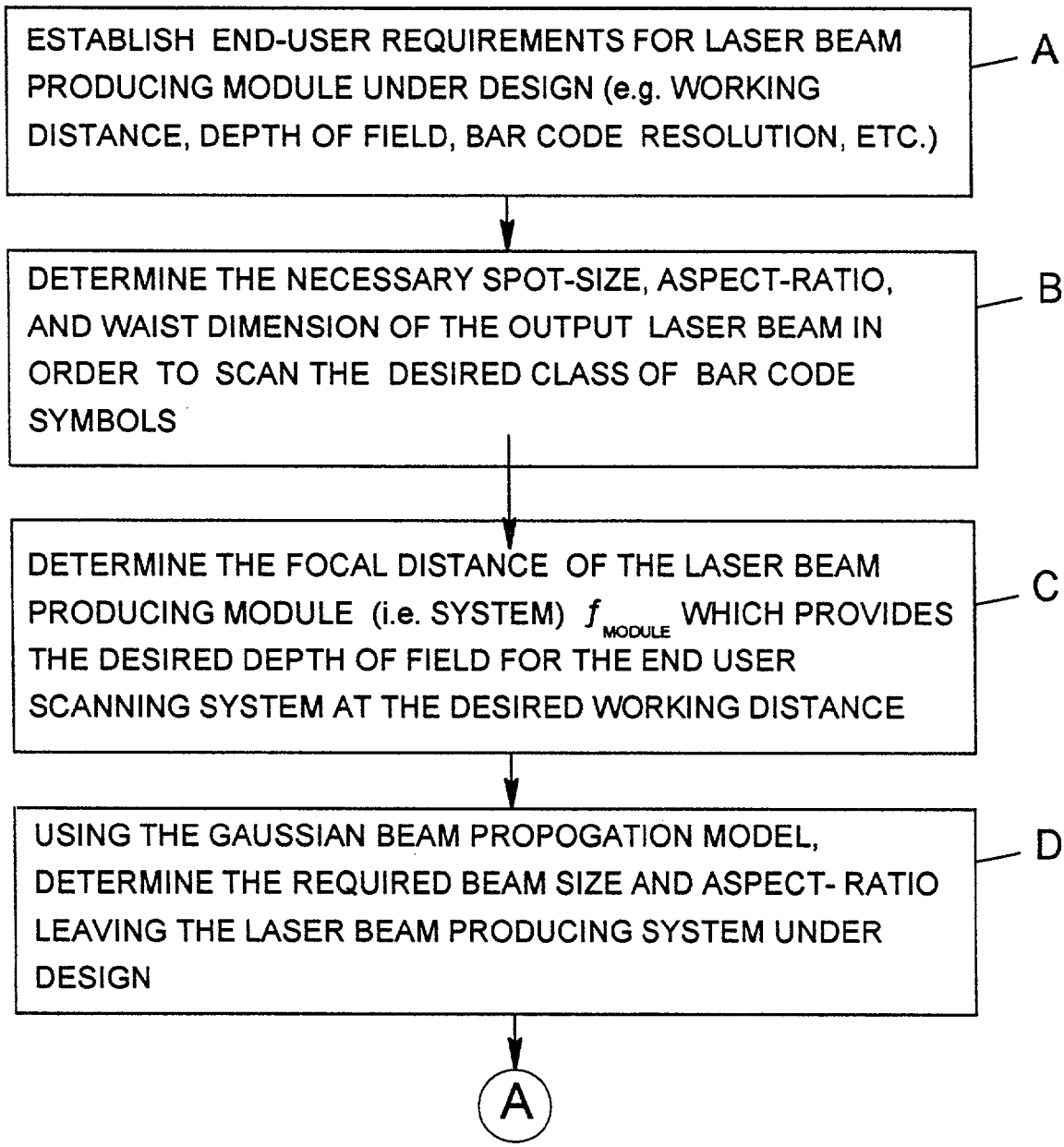
FIG. 3B1

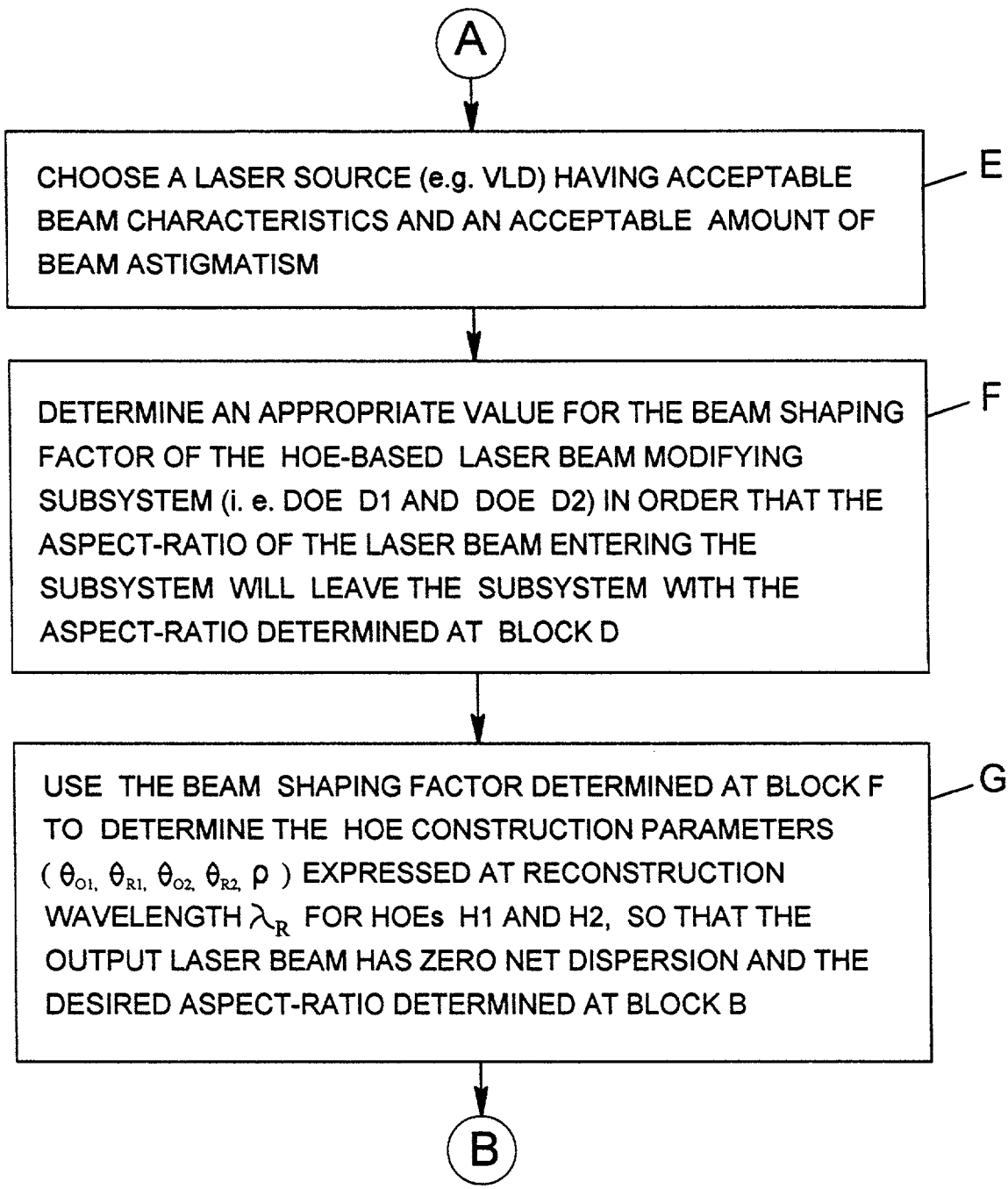
FIG. 3B2

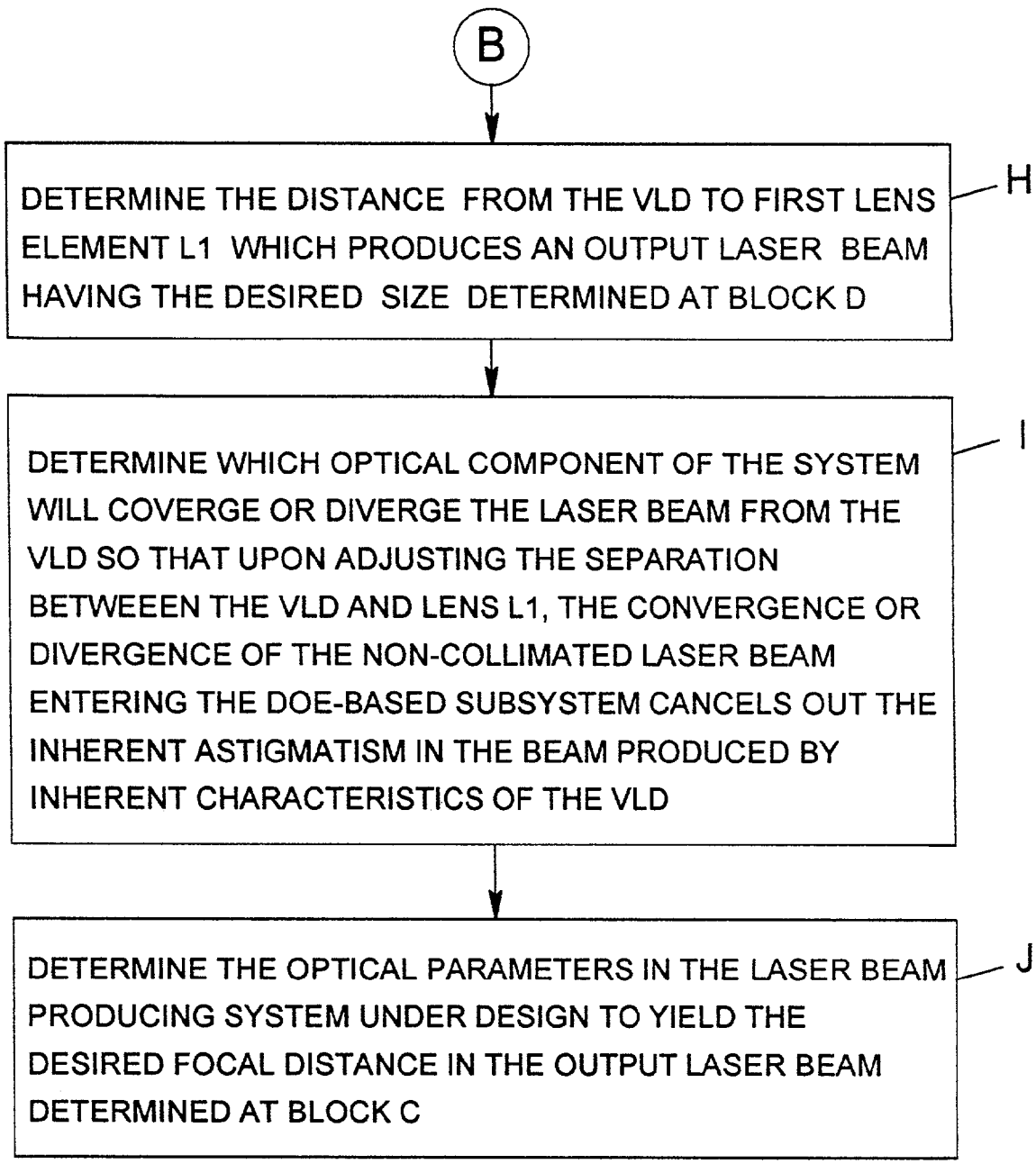
FIG. 3B3

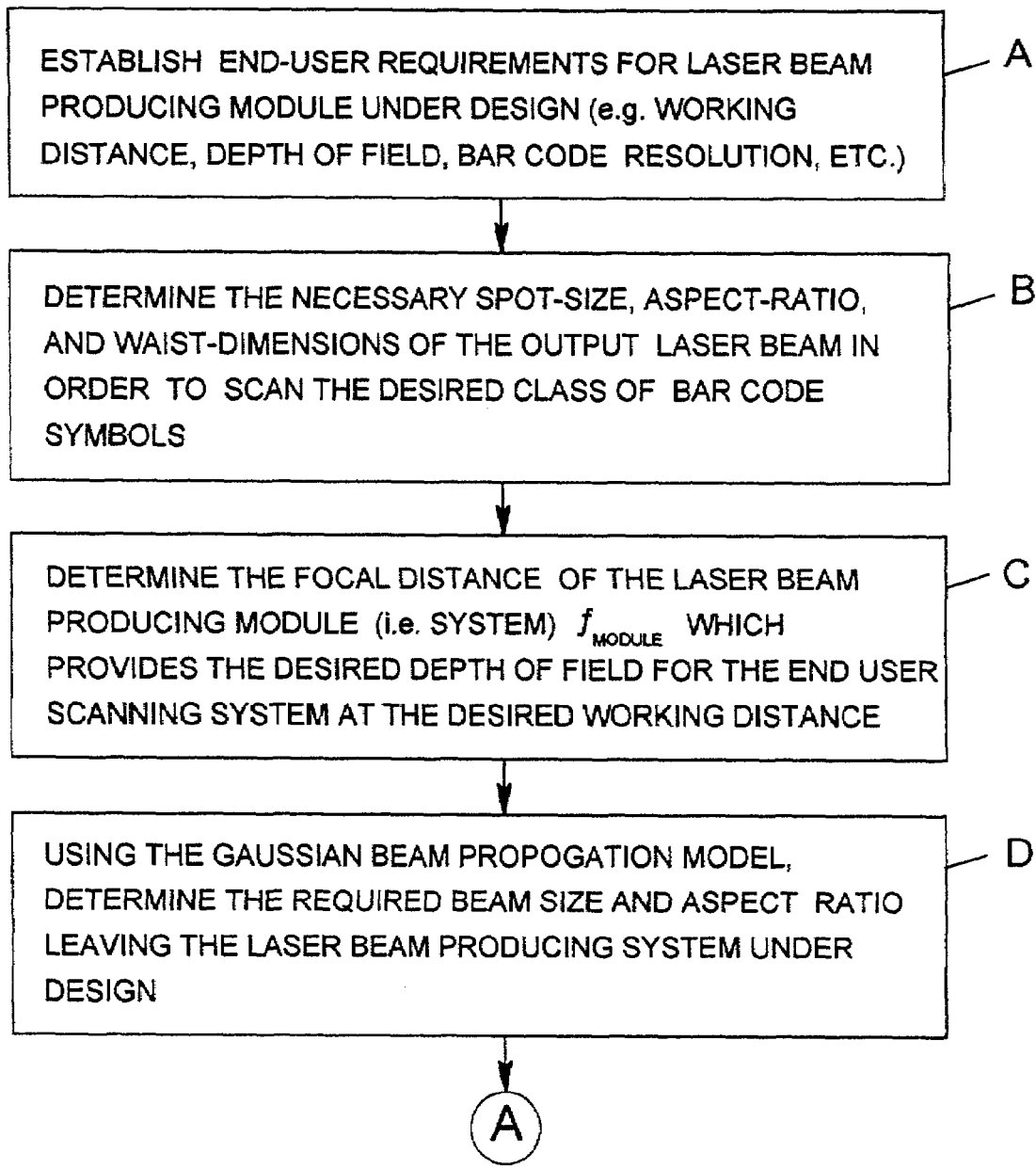
FIG. 3C1

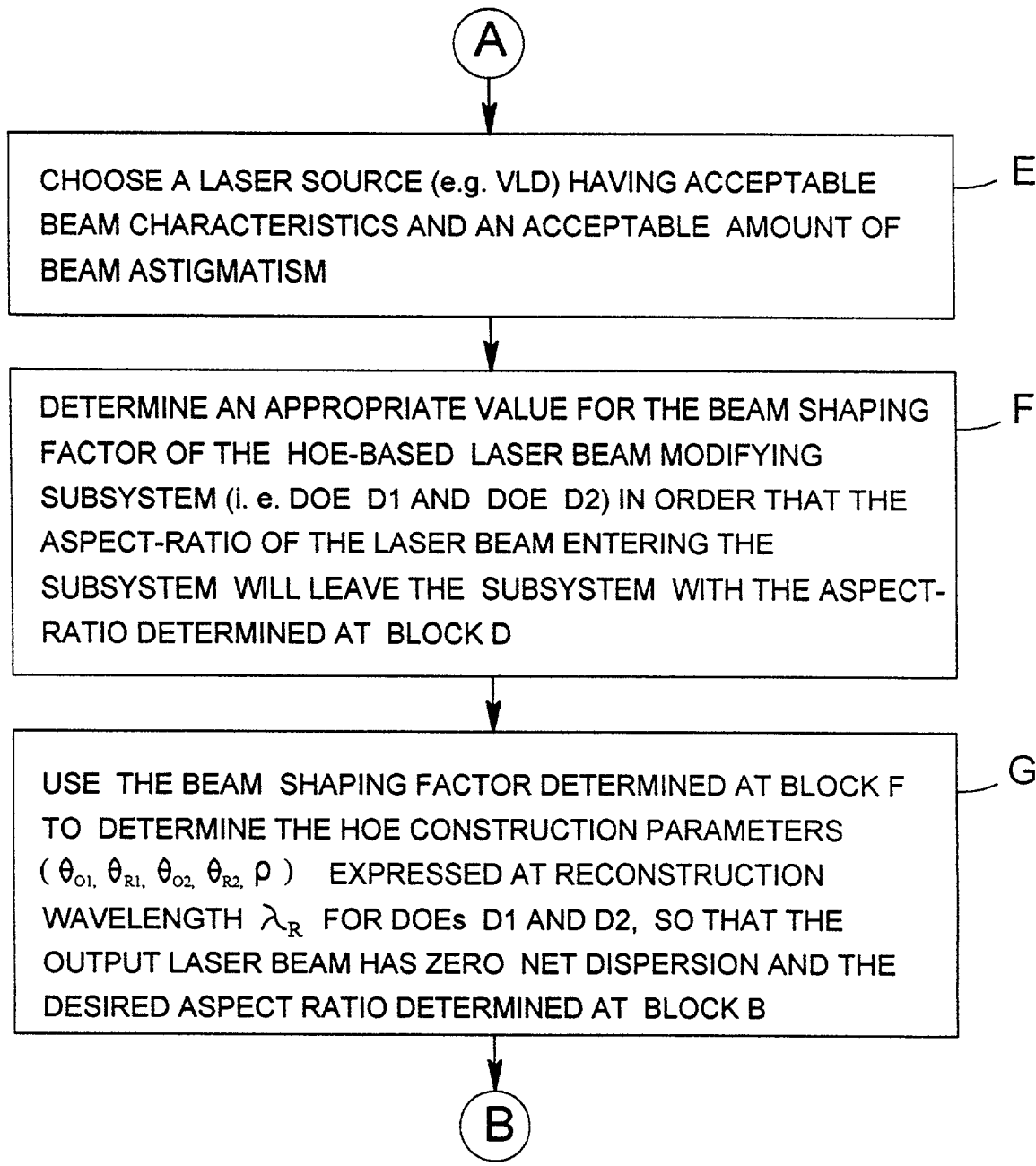
FIG. 3C2

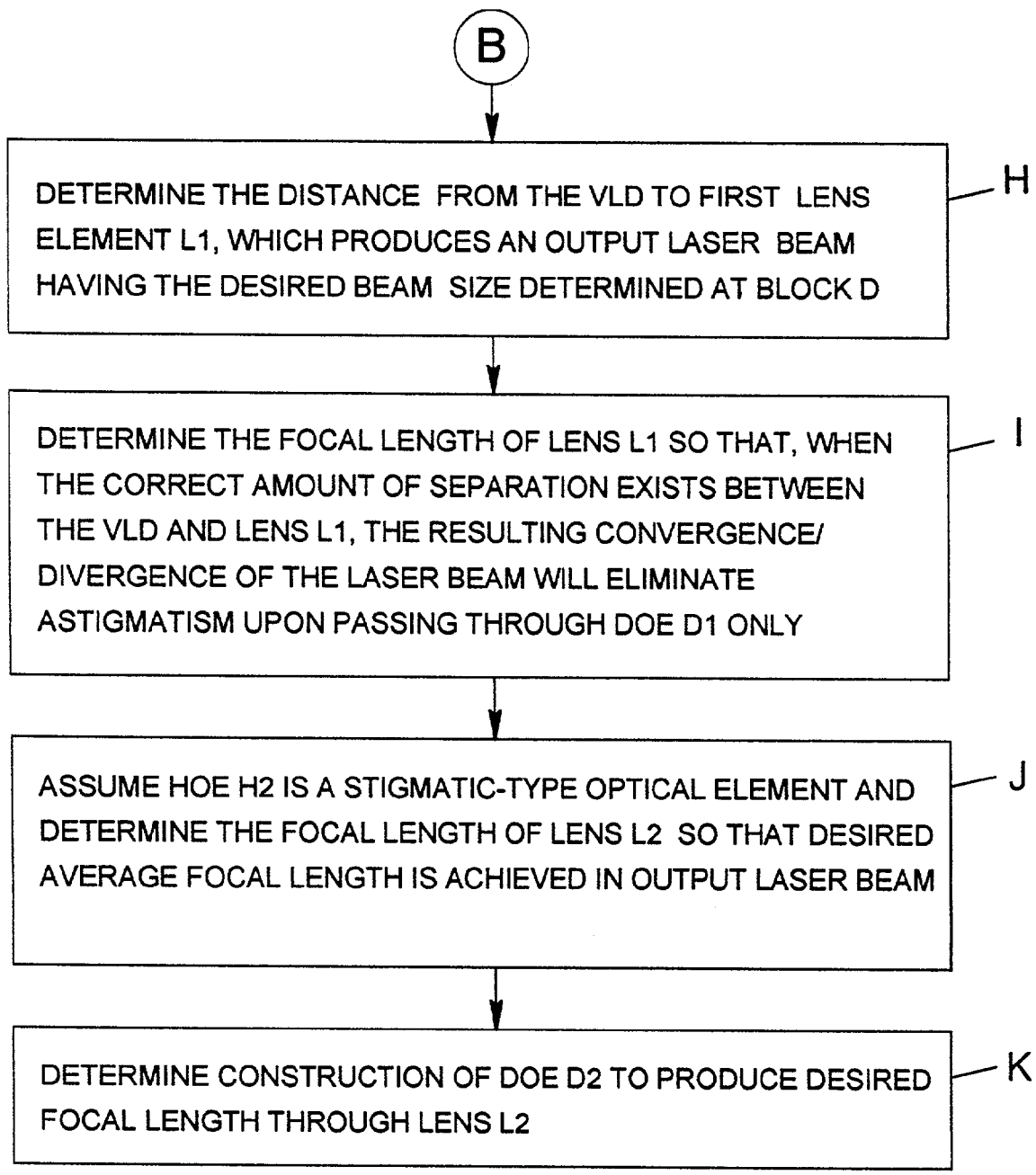
FIG. 3C3

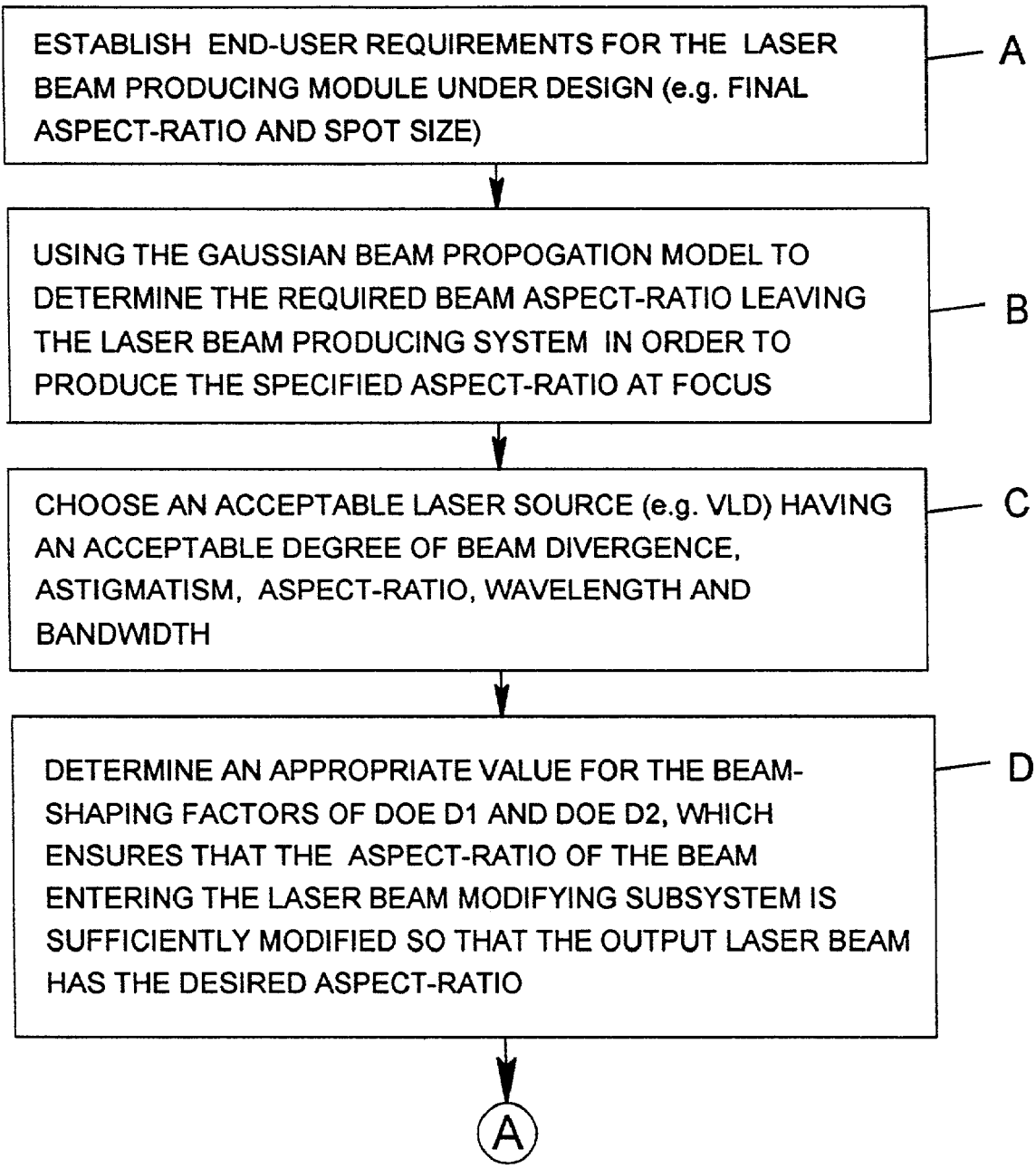
FIG. 3D1

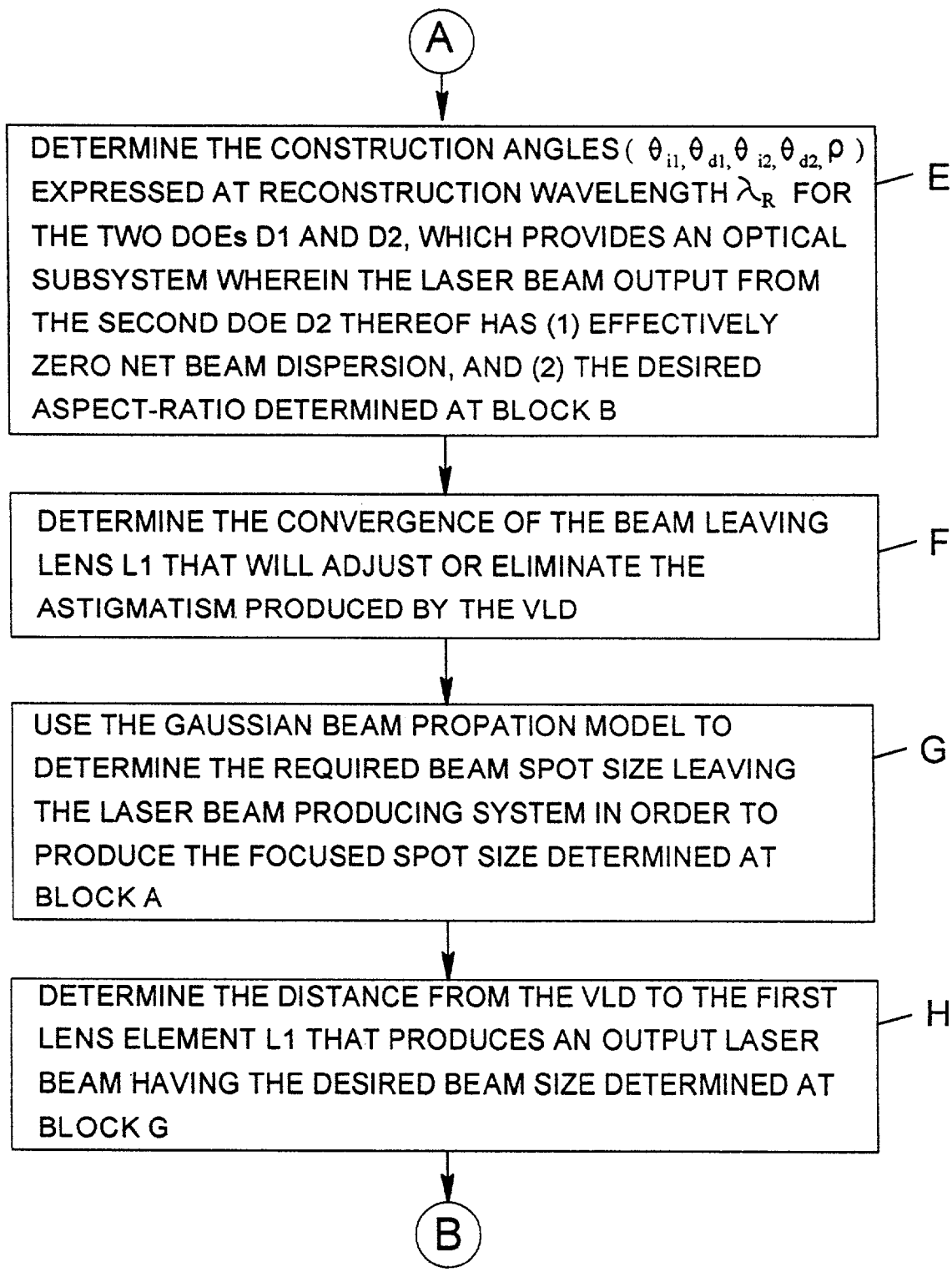
FIG. 3D2

```
┌──────────────────────────────────────────────────────┐
│ DETERMINE THE FOCAL LENGTH OF THE LENS ELEMENT L1    │ ─ I
│ THAT PRODUCES A BEAM WITH THE CONVERGENCE            │
│ DETERMINED IN BLOCK F                                │
└──────────────────────────────────────────────────────┘
```

FIG. 3D3

```
┌─────────────────────────────────────────────────┐
│ CHOOSE VALUES FOR COMPRESSION/EXPANSION RATIOS M₁│──A
│ AND M₂ SO THAT THE BEAM SHAPING FACTOR SATISFIES λ_R│
│ M = M₁ M₂, CHOOSE RECONSTRUCTION (DESIGN)        │
│ WAVELENGTH θ_{i1}, AND ANGLE OF INCIDENCE        │
└─────────────────────────────────────────────────┘
                        │
                        ▼
┌─────────────────────────────────────────────────┐
│ SOLVE FOR ANGLE OF DIFFRACTION θ_{d1} AT DOE D1 USING │──B
│ EQUATION NO.(4)                                  │
└─────────────────────────────────────────────────┘
                        │
                        ▼
┌─────────────────────────────────────────────────┐
│ SOLVE FOR THE FRINGE STRUCTURE SPACING d₁ OF DOE D1,│──C
│ USING EQUATION NO.(1)                            │
└─────────────────────────────────────────────────┘
                        │
                        ▼
┌─────────────────────────────────────────────────┐
│ SOLVE FOR THE ANGLE OF INCIDENCE θ_{i2} AT DOE D2, USING│──D
│ EQUATION NO.(7)                                  │
└─────────────────────────────────────────────────┘
                        │
                        ▼
┌─────────────────────────────────────────────────┐
│ SOLVE FOR THE DOE TILT ANGLE, ρ, USING EQUATION NO. (3)│──E
└─────────────────────────────────────────────────┘
                        │
                        ▼
                       (A)
```

FIG. 3F1

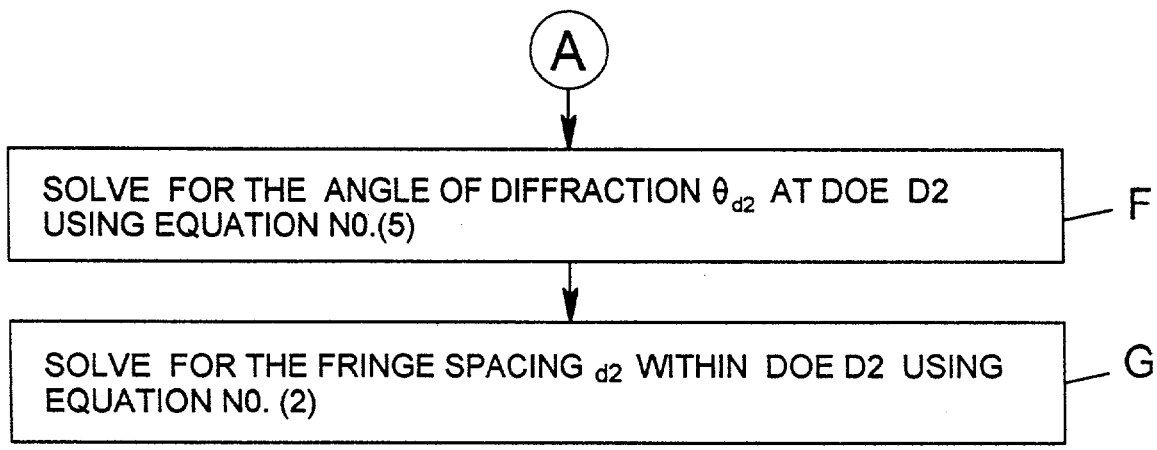
FIG. 3F2

A — CONVERT THE DESIGN PARAMETERS $\theta_{i1}$, $\theta_{d1}$, $\theta_{i2}$, $\theta_{d2}$, (AND $f_2$) EXPRESSED AT THE RECONSTRUCTION WAVELENGTH $\lambda_R$, INTO CONSTRUCTION PARAMETERS EXPRESSED AT THE CONSTRUCTION WAVELENGTH $\lambda_c$, NAMELY: $\theta_{O1}$, $\theta_{R1}$, FOR HOE H1; AND $\theta_{O2}$, $\theta_{R2}$, FOR HOE H2

B — IN THE CASE OF VARIABLE SPATIAL FREQUENCY DOEs, USE COMPUTER-RAY TRACING TO DETERMINE THE DISTANCES OF THE OBJECT AND REFERENCE (BEAM) SOURCES RELATIVE TO THE HOLOGRAPHIC RECORDING MEDIUM (AS WELL AS THE DISTANCES OF ANY ABERRATION-CORRECTING LENSES THEREFROM) EMPLOYED DURING THE HOLOGRAPHIC RECORDING PROCESS

FIG. 4A

```
┌─────────────────────────────────────────────┐
│ FORMULATE WITHIN A DIGITAL COMPUTER SYSTEM, A│──A
│ MATHEMATICAL DESCRIPTION OF THE OBJECT AND   │
│ REFERENCE BEAM WAVEFRONTS USED TO CONSTRUCT DOE│
│ D1 AND DOE D2, DURING OPTICAL FORMATION THEREOF│
│ WHEN USING THE HOLOGRAPHIC RECORDING METHOD  │
│ SHOWN IN FIG. 4B                             │
└─────────────────────────────────────────────┘
                      │
                      ▼
┌─────────────────────────────────────────────┐
│ USE THE DIGITAL COMPUTER SYSTEM TO FORMULATE A│──B
│ MATHEMATICAL DESCRIPTION OF THE INTERFERENCE │
│ PATTERN THAT IS GENERATED BY MATHEMATICALLY  │
│ ADDING THE MATHEMATICAL MODEL OF THE OBJECT BEAM│
│ WAVEFRONT TO THE REFERENCE BEAM WAVEFRONT, TO│
│ PROVIDE A SPATIAL FUNCTION OF THE COMPUTER   │
│ GENERATED / REPRESENTED INTERFERENCE PATTERN │
└─────────────────────────────────────────────┘
                      │
                      ▼
┌─────────────────────────────────────────────┐
│ USE THE DIGITAL COMPUTER SYSTEM TO SAMPLE THE│──C
│ SPATIAL FUNCTION OF THE COMPUTER GENERATED/  │
│ REPRESENTED INTERFERENCE PATTERN ALONG THE X │
│ AND Y DIRECTIONS THEREOF TO PRODUCE A LARGE SET OF│
│ SAMPLED VALUES OF VARYING AMPLITUDE TRANSMITTANCE│
│ ASSOCIATED WITH THE COMPUTER GENERATED       │
│ INTERFERENCE PATTERN                         │
└─────────────────────────────────────────────┘
                      │
                      ▼
                     (A)
```

FIG. 4C1

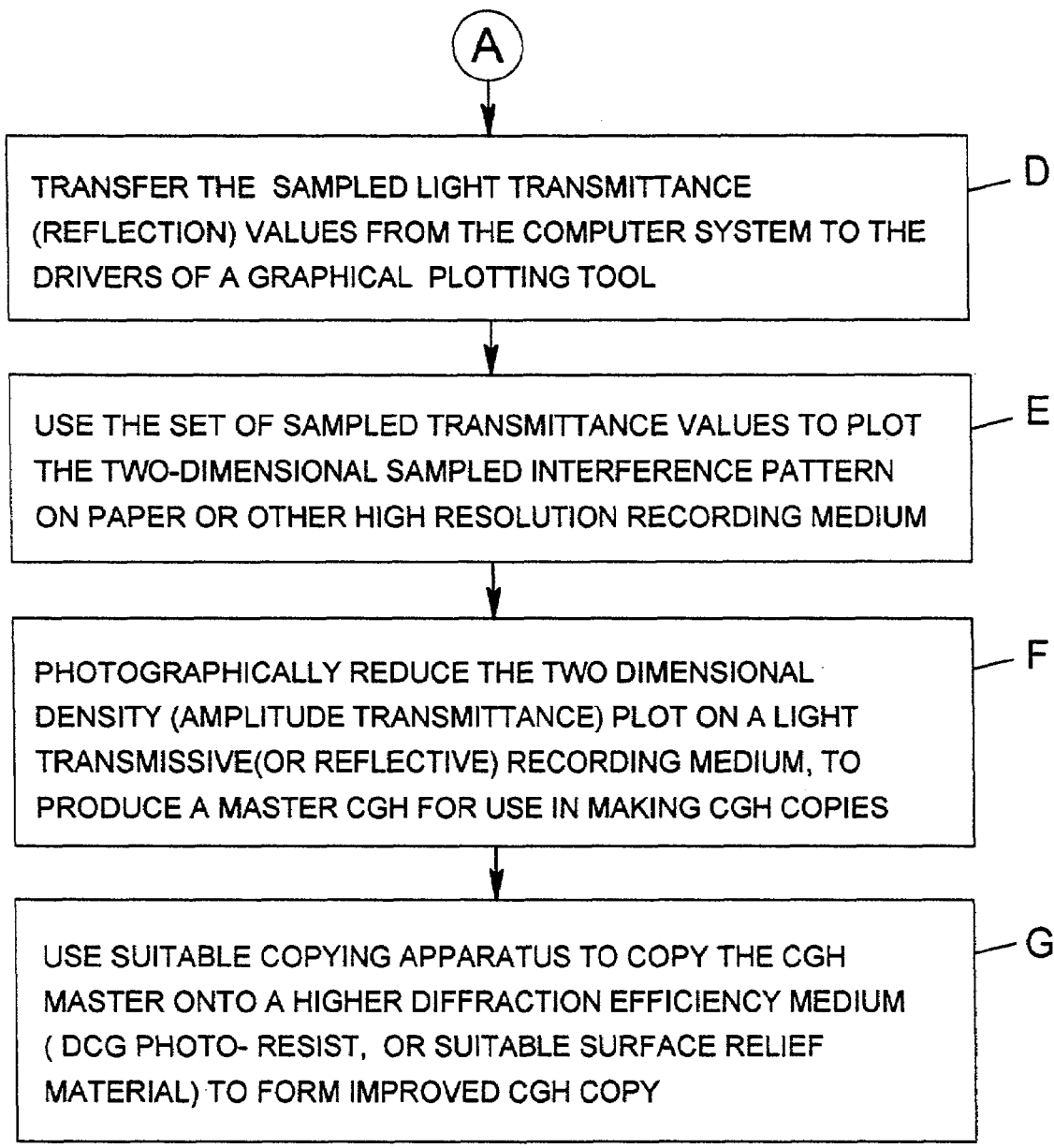
FIG. 4C2

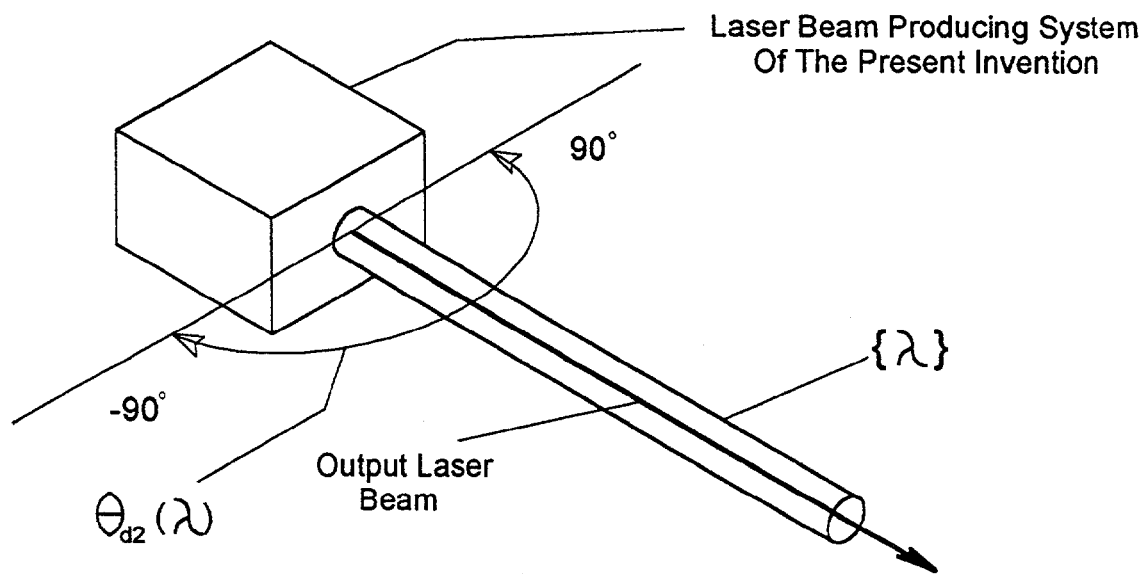
FIG. 5A
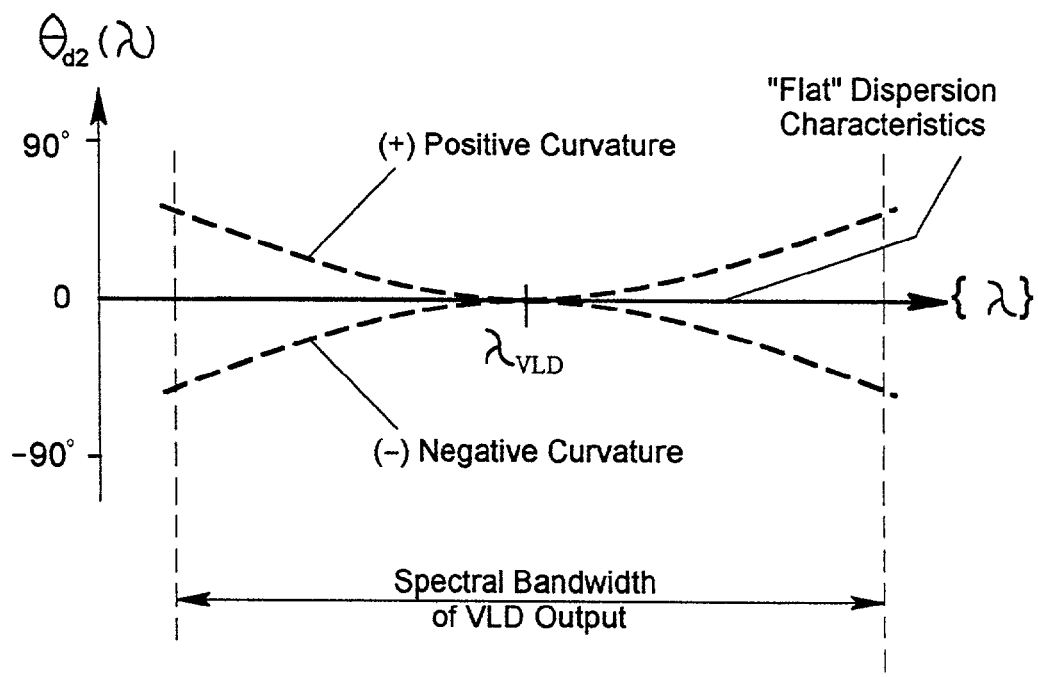
FIG. 5B1

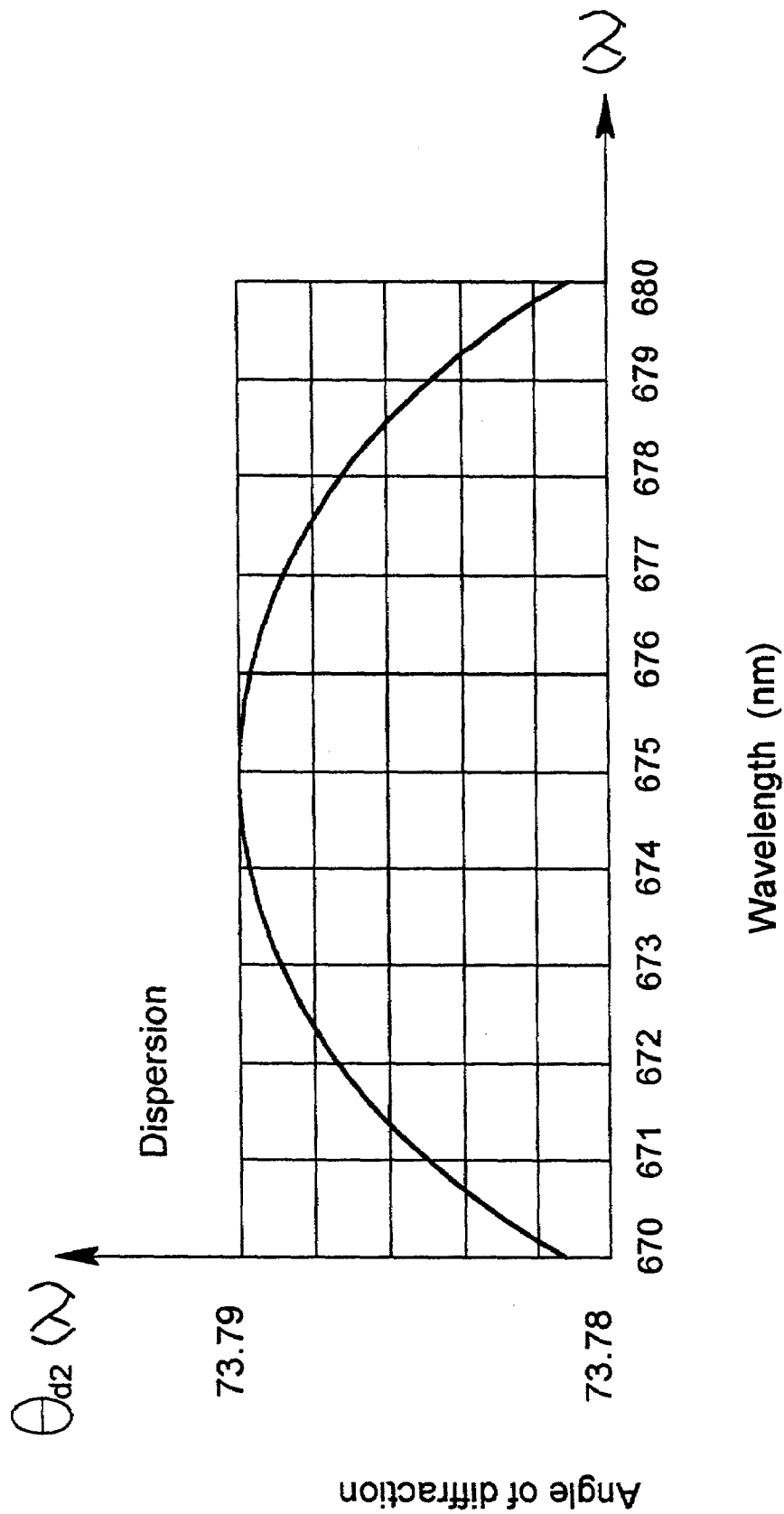
FIG. 5B2

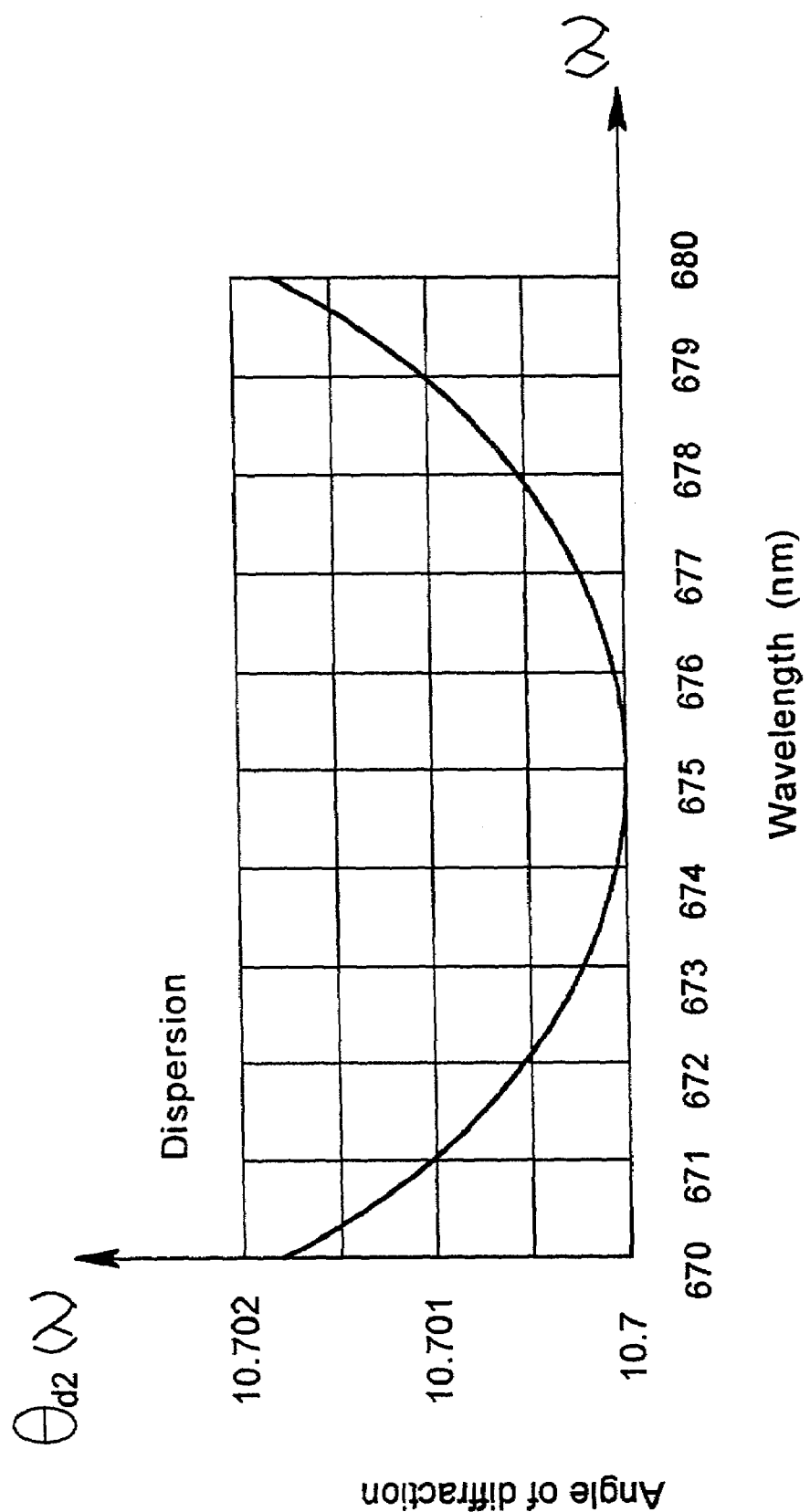
FIG. 5B3

(Case A)

(Case B)

(Case C)

(Case D)

DOE-BASED SYSTEMS AND DEVICES FOR PRODUCING LASER BEAMS HAVING MODIFIED BEAM CHARACTERISTICS

RELATED CASES

The present application is a Continuation of application Ser. No. 09/302,790 filed Apr. 30, 1999 now abandoned, which relates to: application Ser. No. 09/071,512 filed May 1, 1998 now abandoned; application Ser. No. 08/573,949 filed Dec. 18, 1995 now abandoned; application Ser. No. 08/726,522 filed Oct. 7, 1996 now U.S. Pat. No. 6,073,846; application Ser. No. 08/886,806 filed Apr. 22, 1997 now U.S. Pat. No. 5,984,185; application Ser. No. 08/854,832 filed May 12, 1997 now U.S. Pat. No. 6,085,978; and application Ser. No. 08/949,915 filed Oct. 14, 1997 now U.S. Pat. No. 6,158,659; each said application being commonly owned by Metrologic Instruments, Inc. of Blackwood, N.J. and incorporated herein by reference in its entirety.

BACKGROUND OF THE INVENTION

1. Field of Invention

The present invention relates generally to diffractive optical element (DOE) based optical systems of ultra-compact design capable of modifying the inherent elliptical, divergent, eccentric and astigmatic characteristics of laser beams produced from laser diode sources, such as visible laser diodes (VLDs).

2. Brief Description of the Prior Art

Laser diodes or visible laser diodes (VLD) are often used as light sources in many scientific and engineering applications. While laser diodes offer significant advantages over other laser sources, e.g. gas lasers, in terms of efficiency, size, and cost, they nevertheless suffer from several undesirable optical characteristics, namely: high beam divergence, elliptical beam profile, and astigmatism. In order to use laser diodes in many communication, data-storage, scanning, and imaging applications, these inherent deficiencies in laser diodes must be corrected.

While complex refractive-optics type systems (employing anamorphic lenses and the like) have been developed for the purpose of correcting for laser diode characteristics, such systems are generally bulky and expensive, and thus ill-suited for use in numerous applications.

U.S. Pat. Nos. 5,247,162 and B1 4,816,660 disclose the use of a lens and aperture-stop to shape the laser beam produced from a VLD for use in laser scanners. While this technique provides an inexpensive way of shaping the cross-section of a VLD laser beam, it does so at the expense of a substantial loss in beam power. Moreover, this "pinhole" technique is incapable of correcting for astigmatism in laser beams produced by VLDs.

In recent years, alternative approaches to VLD beam shaping and correction have been developed. Such alternative techniques include, for example, the use of: integrated-optics lenses; computer-generated hologram (CGH) gratings; micro-Fresnel lenses; waveguide optics; and holographic optical elements (HOEs).

The use of HOEs for beam collimation, shaping/profiling and astigmatism-correction has received great attention, as such devices can be made inexpensively and small in size to be used in CD-ROM players, consumer-products and analytical instruments employing VLDs and the like. Examples of prior art laser diode beam-correction techniques employing HOEs are disclosed in the following journal articles: "Efficient Beam-Correcting Holographic Collimator For Laser Diodes" by A. Aharoni, et al., published in Vol. 17, No. 18, OPTICS LETTERS, Sep. 15, 1992, at pages 1310–1312; "Beam-Correcting Holographic Doublet For Focusing Multimode Laser Diodes" by A. Aharoni, et al., published in Vol. 18, No. 3, OPTICS LETTERS, Feb. 1, 1993, at pages 179–181; and "Design of An Optical Pickup Using Double Holographic Lenses" by Hiroyasu Yoshikawa, et al., published in SPIE, Vol. 2652, 1996, at pages 334–340.

While the above-cited prior art publications disclose dual-HOE optics systems for beam-collimation, beam-shaping and astigmatism correction, such prior art design methods do not enable the design and construction of laser beams having any degree of astigmatism, focal-distance, spot-size, focused-spot aspect-ratio, and zero dispersion. These are critical requirements in many laser scanning bar code reading applications.

Prior art HOE-based systems do not address the fact that commercial VLDs suffer from beam eccentricity (i.e. poor beam pointing characteristics). Consequently, it has not been possible to successfully carry out many design objectives by virtue of the fact that assumptions made during system design are not satisfied during design realization.

Accordingly, there is a great need in the art for an improved method of designing and constructing optical systems for modifying the elliptical, divergent, eccentric and astigmatic characteristics of laser beams inherently produced from commercial-grade laser diodes, while avoiding the shortcomings and drawbacks of prior art systems, devices, and methodologies.

OBJECTS AND SUMMARY OF THE PRESENT INVENTION

Thus, it is a primary object of the present invention to provide an improved method of designing optical systems for modifying the inherent elliptical, divergent, eccentric and astigmatic characteristics of laser diodes, while avoiding the shortcomings and drawbacks of prior art systems, devices, and methodologies.

Another object of the present invention is to provide a novel laser beam modification system employing a plurality of diffractive optical elements (DOEs) for modifying the size and shape of a laser beam produced from a commercial-grade laser diode, such as a VLD, over an extended range which has hitherto been impossible to achieve using conventional techniques, while avoiding the introduction of dispersion in the output laser beam which is commonly associated with prior art HOE doublets and the like.

Another object of the present invention is to provide such a DOE-based laser beam modifying system, wherein the inherent astigmatism characteristics associated with a VLD are eliminated or minimized.

Another object of the present invention is to provide a DOE-based laser beam modifying system, wherein beam dispersion is minimized, or normal dispersion or reverse dispersion characteristics are provided for any given beam compression or expansion ratio, by selecting the proper angle between the two DOEs of the system.

Another object of the present invention is to provide a DOE-based laser beam modifying system, wherein beam dispersion is minimized for the system acting alone, or fine-tuned to compensate for the dispersion of other elements preceding it or following the system.

Another object of the present invention is to provide a laser beam modifying system capable of producing a laser beam having a desired spot-size over a specified depth of field, achieved by focusing the laser beam with a lens (or variable DOE of a selected type), and then reshaping the laser beam using a pair of DOEs.

Another object of the present invention is to provide a laser beam producing system employing a set of beam-modifying DOEs which produce zero dispersion while simultaneously providing any desired aspect-ratio for the beam leaving (exiting) the second DOE.

Another object of the present invention it to provide a HOE-based laser beam modifying system adapted for use in a broad range of applications employing VLDs, which includes, but is not limited to, laser scanning applications.

Another object of the present invention it to provide a CGH-based laser beam modifying system adapted for use in a broad range of applications employing VLDs, which includes, but is not limited to, laser scanning applications.

Another object of the present invention is to provide an ultra-compact DOE-based device capable of collimating or focusing laser beams produced from astigmatic VLDs while minimizing dispersion beam dispersion and correcting for beam ellipticity.

A further object of the present invention is to provide an ultra-compact optics module for modifying the aspect-ratio of laser beams produced by VLDs, while eliminating beam astigmatism introduced by virtue of the inherent astigmatic difference in the VLD, and minimizing dispersion in the output laser beam created by wavelength-dependent variations in the spectral output of the VLD, such as superluminescence, multi-mode lasing, and laser mode hopping.

Another object of the present invention is to provide a novel optical-bench module which enables easy mounting and alignment of selected components of the laser beam producing systems of the present invention so that the inherently elliptical beam produced from commercial VLDs is simply aligned on the optical axis of the system.

Another object of the present invention is to provide a novel DOE-based laser beam producing device, wherein refractive optics (L1) having an axially symmetric surface profile characteristics are disposed between the laser diode source (VLD) and the diffractive optics (e.g. DOEs D1 and D2), to enable the use the DOEs to modify (e.g. correct or eliminate) astigmatism in the output laser beam, while simplifying the manufacture of the refractive optics (L1) and diffractive optics (DOEs D1 and D2), reducing the cost of optical elements, and simplifying parameter alignment during the assembly process.

Another object of the present invention is to provide a novel optics module employing a pair of DOEs configured in the beam compression mode, wherein the total expansion factor (M) of the DOE combination is less than one, so that the size of the laser beam in the plane of diffraction is compressed without changing the beam size in the dimension perpendicular to the plane of diffraction.

Another object of the present invention is to provide a novel optics module employing a pair of DOEs configured in the beam expansion mode, wherein the total expansion factor (M) of the DOE combination is greater than one, so that the size of the laser beam in the plane of diffraction is expanded without changing the beam size in the dimension perpendicular to the plane of diffraction.

A further object of the present invention is to provide a novel light diffractive optics module for incorporation into small laser scanning devices, such as laser scan-engines, as well as replacing conventional prisms and anamorphic lenses used in VLD-based optical systems such as optical storage devices, CD-ROM players and recorders, and like systems and devices.

Another object of the present invention is to provide a DOE-based optics module for modifying the aspect-ratio of a VLD beam while simultaneously controlling beam dispersion to minimize the overall dispersion of the optical system in which it is being used.

Another object of the present invention is to provide such an optics module, wherein beam astigmatism inherently associated with VLDs is eliminated or minimized.

Another object of the present invention is to provide a novel method for designing a dual-HOE laser beam modifying system, in which a pair of equations are solved under a given set of conditions which ensures that beam dispersion is eliminated and a desired expansion factor (M) is obtained.

Another object of the present invention is to provide such an optical design method, wherein analytical and spreadsheet-type programs are combined in an integrated fashion to allow for easy design and analysis of the optics module under consideration.

Another object of the present invention is to provide a dual-DOE optics module particularly designed for replacing "pinhole" type beam shaping modules used in laser scanning bar code symbol readers.

Another object of the present invention is to provide a novel system for precisely and rapidly aligning the parameters of the optics modules of the present invention to enable the inexpensive mass production of such optical systems and devices for widespread use in diverse fields of endeavor.

Another object of the present invention is to provide such a parameter alignment system, wherein micro-adjustment of the optical components of the laser beam producing modules of the present invention are carried out in a fully automated manner under microcomputer control, thereby allowing (i.e. enabling) mass-production of DOE-based laser beam producing modules which satisfy high quality-control (QC) measures.

Another object of the present invention is to provide a novel method of designing an ultra-compact HOE-based device for producing a laser beam having a selected set of beam characteristics obtained by modifying the astigmatic, elliptical light beams produced from inexpensive VLDs.

Another object of the present invention is to provide a hand-held laser scanner, wherein the laser beam producing system of the present invention is embodied to enable the production of laser beams for bar code scanning operations.

Another object of the present invention is to provide a body-wearable laser scanner, wherein the laser beam producing system of the present invention is embodied to enable the production of laser beams for bar code scanning operations.

Another object of the present invention is to provide a laser scanning-engine, wherein the laser beam producing system of the present invention is embodied to enable the production of laser beams for bar code scanning operations.

Another object of the present invention is to provide in-counter scanners, projection scanners, pass-through (passive) scanners, laser pointers, and the like, wherein the laser beam producing system of the present invention is embodied.

Another object of the present invention is to provide a holographic laser scanner, wherein one or more laser beam producing modules of the present invention are embodied to enable the production of a plurality of laser beams for bar code scanning operations.

Another object of the present invention is to provide a CD-ROM playing unit, wherein the laser beam producing system of the present invention is embodied to enable the production of laser beams for reading information digitally recorded within a CD-ROM or like recording device.

Another object of the present invention is to provide a laser-based instrument, wherein the laser beam producing system of the present invention is embodied to enable the production of laser beams for diagnosis or detection of various conditions.

These and other objects of the present invention will become apparent hereinafter and in the Claims to Invention.

BRIEF DESCRIPTION OF THE DRAWINGS

In order to more fully understand the Objects of the Present Invention, the following Detailed Description of the Illustrative Embodiments should be read in conjunction with the accompanying Figure Drawings, wherein:

FIG. 2B is a geometrical optics model of the second illustrative embodiment of the DOE-based laser beam producing subsystem according to the principles of the present invention, realized using a transmission-type DOE for both DOE1 and DOE2;

FIG. 2B1 is a geometrical optics model of the second illustrative embodiment of the DOE-based laser beam producing subsystem according to the principles of the present invention, realized using reflection-type DOEs for both DOE1 and DOE2;

FIG. 2B2 is a geometrical optics model of the second illustrative embodiment of the DOE-based laser beam producing subsystem according to the principles of the present invention, realized using a transmission-type DOE for DOE1 and a reflection-type DOE for DOE2;

FIG. 2B3 is a geometrical optics model of the second illustrative embodiment of the DOE-based laser beam producing subsystem according to the principles of the present invention, realized using a reflection-type DOE for DOE1 and a transmission-type DOE for DOE2;

FIGS. 3A1 through 3A3 set forth a flow chart illustrating the steps involved in carrying out the method of designing DOE-based laser beam producing systems according to the present invention, wherein astigmatism can be tolerated and adjustment of the focal-length of the resulting stigmatic beam is not required;

FIGS. 3B1 through 3B3 set forth a flow chart illustrating the steps involved in carrying out the method of designing DOE-based laser beam producing systems, wherein astigmatism correction is desired and adjustment of the focal-length of the resulting stigmatic beam is not required;

FIGS. 3C1 through 3C3 set forth a flow chart illustrating the steps involved in carrying out the method of designing DOE-based laser beam producing systems, wherein astigmatism correction and adjustment of the focal-length of the resulting stigmatic beam are required;

FIGS. 3D1 through 3D3, taken together show a flow chart, set forth a flow chart illustrating the steps involved in carrying out the method of designing DOE-based laser beam producing systems, wherein astigmatism correction is desired and adjustment of the focal-length of the resulting stigmatic beam and delta-focusing are not required;

FIGS. 3F1 and 3F2, taken together, set forth a flow chart illustrating the steps involved in carrying out the method of designing the DOE-based laser beam modifying subsystem of the present invention so that pre-selected design criteria is satisfied;

FIG. 4A sets forth a flow chart illustrating a preferred method of converting the design parameters of a HOE into its construction parameters expressed at the construction wavelength;

FIGS. 4C1 and 4C2 collectively set forth a flow chart illustrating the basic steps involved in constructing a CGH implementation of the DOE-based laser beam modifying subsystem hereof;

FIG. 5A is a schematic diagram of an optical arrangement for analyzing dispersion in the laser beam output from the DOE-based laser beam modifying subsystem of the present invention;

FIG. 5B is a generalized graphical representation of two different dispersion characteristics of a laser beam producing system of the present invention when operated in different modes of operation, shown plotted as a function of output wavelength;

FIG. 5B1 is a graphical representation of the dispersion characteristics of an exemplary laser beam producing system of the type shown in FIGS. 2A and 7A–7C, showing a negative (concave down) curvature when plotted as a function of output wavelength;

FIG. 5B2 is a graphical representation of the dispersion characteristics of a laser beam producing system of the type shown in FIGS. 2A and 7A–7C if the direction of propagation of the laser beam is reversed, thereby exhibiting a positive (concave upward) curvature, plotted as a function of output wavelength;

DETAILED DESCRIPTION OF THE ILLUSTRATIVE EMBODIMENTS OF THE PRESENT INVENTION

Figure 1A:
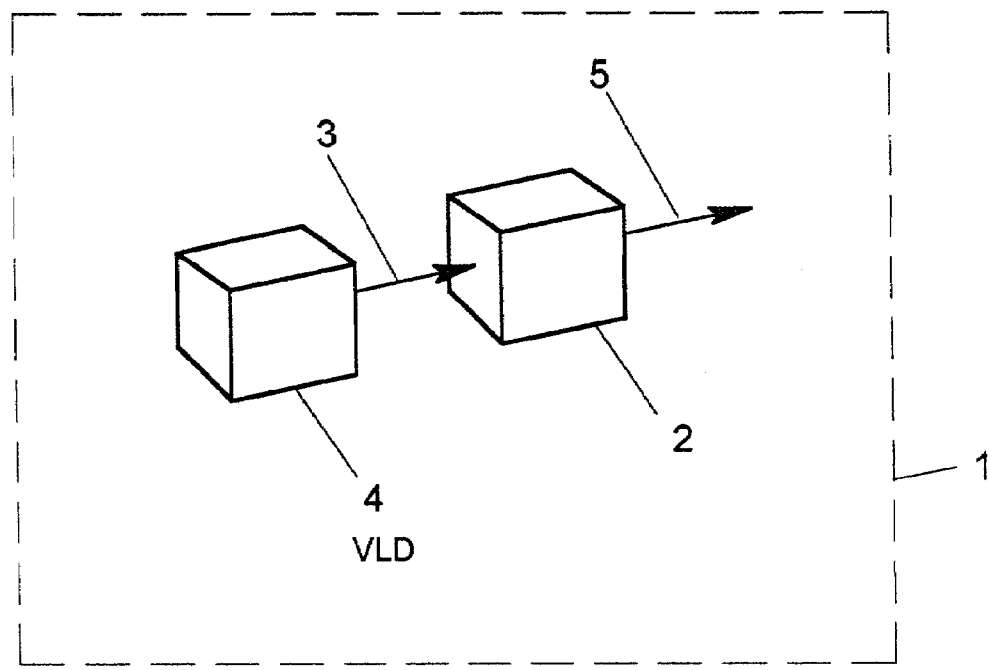
FIG. 1A is a schematic representation of the dual-DOE optical subsystem used in the various illustrative embodiments of the laser beam producing system of the present invention, identifying the geometrical optical parameters employed in the design of this subsystem.
Figure 1B:
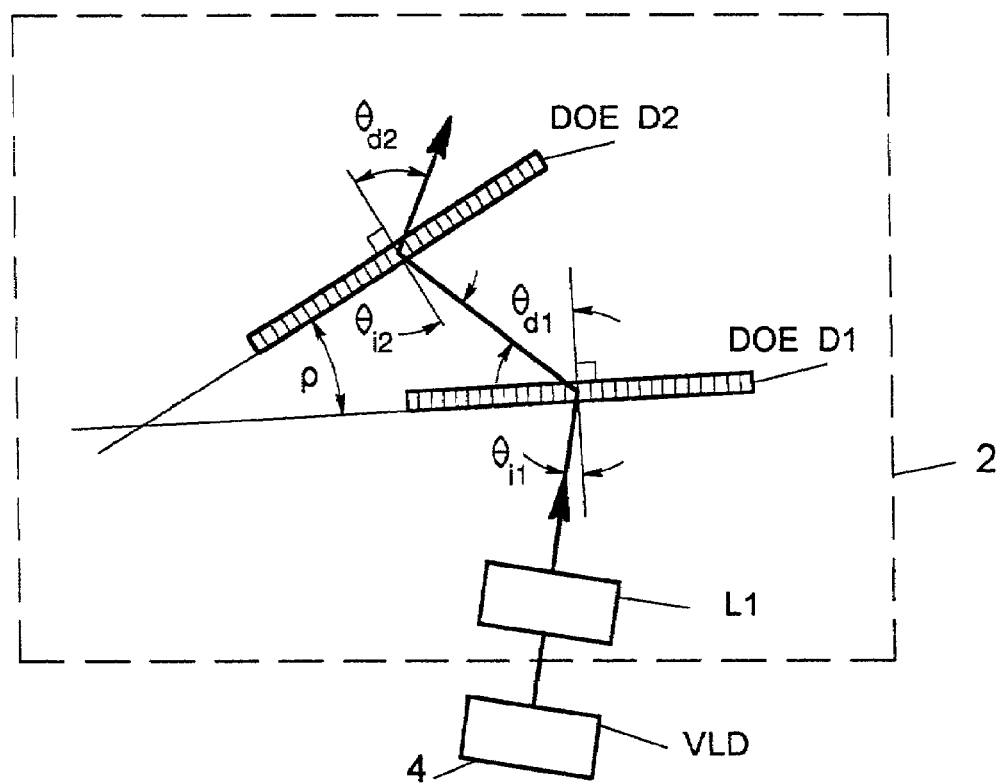
FIG. 1 is a schematic representation of a general model for the DOE-based laser beam producing system of the present invention, showing its laser source and the DOE-based laser beam modifying subsystem.

In accordance with one broad aspect of the present invention, illustrated in FIG. 1, novel apparatus 1 employs a light-diffractive optical subsystem 2 for modifying the inherent beam characteristics of a laser beam 3 generated from a laser diode source 4 (e.g. visible laser diode or VLD). Preferably, the laser diode source 4 has the so-called heterostructure or double-heterostructure, or multi-quantum well construction. The laser beam output from the laser diode source 4 is modified by optical subsystem 2, and the modified beam characteristics associated therewith, are suited by design for use in particular applications. Hereinafter, apparatus according to this first aspect of the present invention, adapted for modifying the characteristics of laser beams produced from laser diode sources, shall be referred to as "a laser beam modifying subsystem".

Each embodiment of the laser beam-modifying system of the present invention is designed using the beam characteristics of the particular laser source 4 employed in the system. As shown in FIG. 1A, the optical subsystem 2 comprises: a lens element (L1); and at least two light diffractive optical elements (DOEs), indicated by D1 and D2, respectively, in FIG. 1A. The primary function of optical subsystem 2 is to modify the laser beam produced from the laser diode source 4 so that the resulting laser beam 5 output from DOEs D1 and D2 has predetermined (modified) beam characteristics that are suited by design for use in particular applications. Hereinafter, apparatus according to this second aspect of the present invention, adapted for producing laser beams having predetermined beam characteristics, shall be referred to as "laser beam producing system".

In defining the laser beam modifying (optics) subsystem 2, the angle of incidence of the laser beam from the lens L1 onto the front surface of the first diffractive optical element (DOE) D1 is specified by $\theta_{i1}$, whereas the angle of diffraction therefrom is specified by $\theta_{d1}$. The angle of incidence of the laser beam from the first DOE D1 onto the front surface of second fixed DOE D2 is specified by $\theta_{i2}$, whereas the angle of diffraction therefrom is specified by $\theta_{d2}$. The angle $\rho$ between the surfaces of the two DOEs D1 and D2 as:

$$\rho = \theta_{d1} - \theta_{i2}$$

These five parameters $\theta_{i1}$, $\theta_{d1}$, $\theta_{i2}$, $\theta_{d2}$, and $\rho$ completely define the dual-DOE subsystem, and thus provide four degrees of freedom within the geometrical optics model thereof.

Hereinbelow, a number of illustrative embodiments of the laser beam producing system according to the present invention will now be described in great detail. In such illustrative embodiments shown in the figures of the accompanying Drawings, like structures and elements shall be indicated by like reference numerals.

Description of Illustrative System Embodiments of the Laser Beam-Producing System of the Present Invention P In each of the fourteen illustrative embodiments described below, the laser beam is produced from a VLD 4 having the so-called heterostructure or double-heterostructure, or multi-quantum well construction. In a typical VLD, the beam divergence will be less in the direction parallel to the VLD junction. Also, in all commercially produced VLDs, the electric field (E-field) of the laser beam is oriented (i.e. polarized) in a direction parallel to the narrow divergence direction of the beam, which is generally parallel to the junction of the VLD.

In order to understand the operation of commercial VLDs which inherently produce astigmatic beams, it will be helpful to construct a model thereof, as done in copending application Ser. No. 08/573,949 filed Dec. 18, 1995, incorporated herein by reference. According to this model, the laser beam exiting the diode source is deemed to be generated from a combination of sources, namely: a S "source" and a P "source" coaxially located inside the VLD, but separated by a distance referred to as the astigmatic difference or simply the astigmatism of the VLD. Each wave source in this model creates an independent cylindrical wavefront which interacts with the other wave source to create an effect on the resulting wavefront that results in the astigmatism. In the case where the astigmatism is zero, the two cylindrical sources coincide and the resultant wavefront is spherical. The P source is considered the source of origin of the narrow divergence portion of the beam (and thus P shall hereinafter refer to the direction parallel to the VLD junction). The S source is considered the source of origin of the wide direction of the beam (and thus S—derived from the German word "Senkrecht" meaning "perpendicular"—shall hereinafter refer to the direction perpendicular to the VLD junction).

Ideally, to ensure the highest diffraction efficiency of the laser beam transmitted through the DOEs D1 and D2, the diffracted laser beam at angle $\theta_{d1}$ should be in the "plane of incidence" of the incoming beam at DOE D1. In accordance with standard definitions, the "plane of incidence" shall mean the plane containing the incident light ray at DOE D1 and the normal to the surface of DOE D1 at the point of incidence thereon. It is not possible to define a plane of incidence for a cone of rays incident the surface of lens L1. Also, the diffracted laser beam at angle $\theta_{d2}$ relative to DOE D2 should be in the "plane of incidence" of the incident beam at DOE D2, and the plane of incidence at DOE D1 should be coplanar with the plane of incidence at DOE D1 (i.e. disposed within a common plane), to ensure the highest possible light diffraction efficiency as the laser beam passes through the dual-DOE beam modifying subsystem 6. Regardless of how the DOEs are implemented (e.g. as HOEs, CGHs, surface-relief holograms, etc), the fringe structure of the DOEs must be arranged perpendicular to the (common) plane of incidence at the DOEs in order to achieve maximum light diffraction efficiency through this subsystem. With this general arrangement, it is noted that all modifications to the laser beam exiting the VLD (e.g. compression or expansion) will occur within the "common plane of incidence" passing through DOEs D1 and D2.

Depending on the application at hand, there may be a need to compress or expand a particular dimension of the astigmatic laser beam exiting from the VLD. In order to perform such beam modifying functions upon this laser beam, the individual expansion ratios for DOEs D1 and D2, designated by $M_1$ and $M_2$, respectively, will be selected by the optical system designer so that the beam-shaping factor (e.g. expansion ratio) of the DOE-subsystem, $M=M_1 M_2$, is greater than unity when beam expansion is required, and less than unity when beam compression is required. In the DOE subsystem, the individual expansion ratios are given by the following formulas: $M_1=D_{output1}/D_{input1}$ and $M_2=D_{output2}/D_{input2}$, wherein D represents dimension of the beam in the compression/expansion direction (i.e. common plane of incidence of DOEs D1 and D2).

There are four general cases of laser beam modification that may be carried out by any particular embodiment of the laser beam producing system of the present invention. These cases will now be briefly described below to provide an overview of the system of the present invention.

In the first general case of beam modification, the wider dimension of the laser beam requires compression by the DOE-based subsystem. In this case, the DOEs D1 and D2 are designed so that the beam-shaping factor M thereof is less than unity and the narrower dimension of the laser beam exiting the VLD is oriented perpendicular to the "common" plane of incidence passing through DOEs D1 and D2. As this latter condition is satisfied by orienting the VLD junction (and thus its narrower beam dimension and polarization direction) perpendicular to the common plane of incidence, the laser beam incident on DOE D1 is said to be "S-polarized" or "S-incident" on the surface of DOE D1, that is the E-field of the incident laser beam is perpendicular to the common plane of incidence. In this configuration, the wider dimension of the laser beam is disposed within the common plane of incidence (wherein diffraction occurs) so that beam compression results as desired by the design, while the narrower beam dimension is disposed perpendicular thereto (wherein no diffraction occurs) so that no beam compression results along this dimension as desired by the design. In this case, an elliptical laser beam can be made less elliptical or circular.

In the second general case of beam modification, the narrower dimension of the laser beam requires compression by the DOE-based subsystem. In this case, the DOEs D1 and D2 are designed so that the beam-shaping factor M thereof is less than unity and the narrower dimension of the laser beam exiting the VLD is oriented parallel to the "common" plane of incidence passing through DOEs D1 and D2. As this latter condition is satisfied by orienting the VLD junction (and thus its narrower beam dimension and polarization direction) parallel to the common plane of incidence, the laser beam incident on DOE D1 is said to be "P-polarized" or "P-incident" on the surface of DOE D1, that is the E-field of the incident laser beam is parallel to the common plane of incidence. In this configuration, the narrower dimension of the laser beam is disposed within the common plane of incidence (wherein diffraction occurs) so that beam compression results as desired by the design, while the wider beam dimension is disposed perpendicular thereto (wherein no diffraction occurs) so that no beam compression results along this dimension as desired by the design. In this case, an elliptical laser beam can be made more elliptical.

In the third general case of beam modification, the wider dimension of the laser beam requires expansion by the DOE-based subsystem. In this case, the DOEs D1 and D2 are designed so that the beam-shaping factor M thereof is greater than unity and the narrower dimension of the laser beam exiting the VLD is oriented perpendicular to the "common" plane of incidence passing through DOEs D1 and D2. As this latter condition is satisfied by orienting the VLD unction (and thus its narrower beam dimension and polarization direction) perpendicular to the common plane of incidence, the laser beam incident on DOE D1 is said to be "S-polarized" or "S-incident" on the surface of DOE D1, that is the E-field of the incident laser beam is perpendicular to the common plane of incidence. In this configuration, the wider dimension of the laser beam is disposed within the common plane of incidence (wherein diffraction occurs) so that beam expansion results as desired by the design, while the narrower beam dimension is disposed perpendicular thereto (wherein no diffraction occurs) so that no beam expansion results along this dimension as desired by the design. In this case, an elliptical laser beam can be made more elliptical.

In the fourth general case of beam modification, the narrower dimension of the laser beam requires expansion by the DOE-based subsystem. In this case, the DOEs D1 and D2 are designed so that the beam-shaping factor M thereof is greater than unity and the narrower dimension of the laser beam exiting the VLD is oriented parallel to the "common"

plane of incidence passing through DOEs D1 and D2. As this latter condition is satisfied by orienting the VLD junction (and thus its narrower beam dimension and polarization direction) parallel to the common plane of incidence, the laser beam incident on DOE D1 is said to be "P-polarized" or "P-incident" on the surface of DOE D1, that is the E-field of the incident laser beam is parallel to the common plane of incidence. In this configuration, the narrower dimension of the laser beam is disposed within the common plane of incidence (wherein diffraction occurs) so that beam expansion results as desired by the design, while the wider beam dimension is disposed perpendicular thereto (wherein no diffraction occurs) so that no beam expansion results along this dimension as desired by the design. In this case, an elliptical laser beam can be made less elliptical or circular.

Using the above-described principles, numerous embodiments of the laser beam producing system of the present invention can be designed and constructed using various types of enabling technologies. Below, fourteen different illustrative embodiments of the laser beam producing system hereof shall be described in detail. In each of these illustrative embodiments of the present invention, the angles of incidence and diffraction at the DOEs are the only parameters that determine whether the incident laser beam is compressed or expanded. For a fixed set of DOE angles, the polarization direction of the laser beam will determine whether the aspect ratio of the elliptical beam is increased or decreased. This is due to the direct relationship that exists between the narrow dimension and the polarization direction of the laser beam exiting a VLD.

In each of the beam compression embodiments, an S-polarized beam as well as a P-polarized beam incident DOE D1 will be compressed. The difference between such cases is that the elliptical S-polarized beam will become less elliptical while the P-polarized beam will become more elliptical. In many instances where beam compression is desired or required, an S-polarized beam will be preferred as its beam aspect ratio will be reduced while its beam cross-section is made smaller.

In each of the beam expansion embodiments, an S-polarized beam as well as a P-polarized beam incident DOE D1 will be expanded. The difference between such cases is that the elliptical S-polarized beam will become more elliptical while the P-polarized beam will become less elliptical. In many instances where beam expansion is desired or required, a P-polarized beam will be preferred as its beam aspect ratio will be reduced while its beam cross-section is made larger.

Figure 2A:
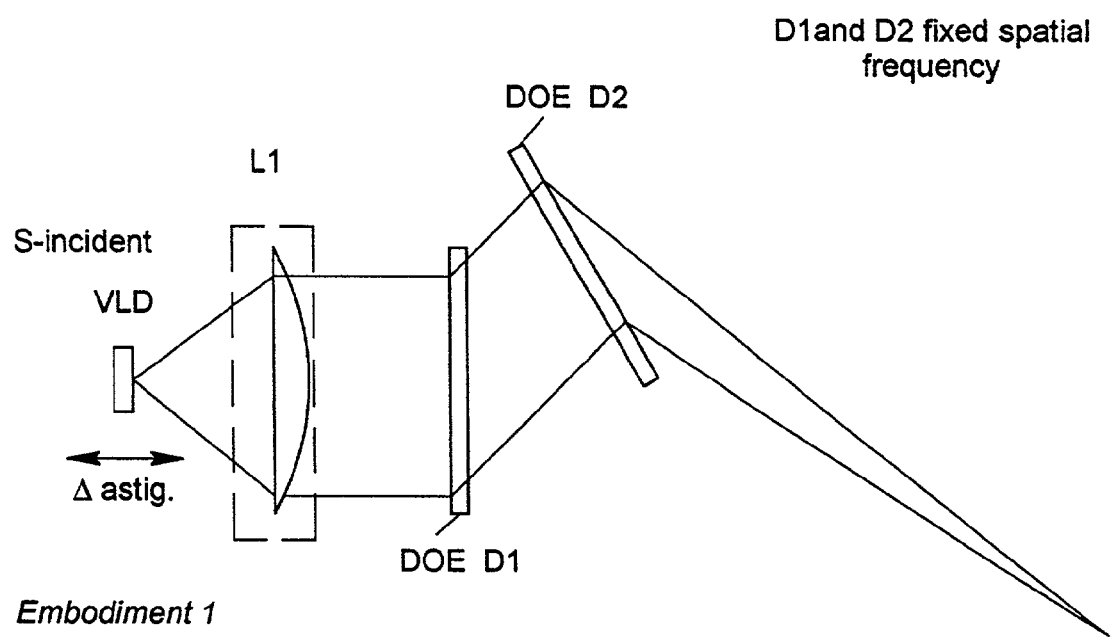
FIG. 2A is a geometrical optics model of the first illustrative embodiment of the DOE-based laser beam producing subsystem according to the principles of the present invention.

First Illustrative System Embodiment of the Laser Beam Producing System of the Present Invention In FIG. 2A, the first illustrative embodiment of the laser beam producing system hereof ("System Embodiment No. 1") comprises: a laser beam source, such as a visible laser diode (VLD), (e.g. Sony Model SLD1122VS) for producing a laser beam from its junction typically having divergent and elliptical beam characteristics; a collimating lens (L1), realizable as a refractive lens e.g. a 4/35 mm lens, a HOE, other type of DOE, a grin lens, one or more zone plate(s), etc., for collimating the laser beam as it is transmitted through collimating lens L1 and through the system in a S-incident manner; a fixed spatial-frequency diffractive optical element (DOE), i.e. diffraction grating, indicated by D1 having a beam expansion factor $M_1$; and a fixed spatial-frequency diffractive optical element (DOE) indicated by D2, having a beam expansion factor $M_2$. Collectively, the collimating lens (L1), the fixed spatial-frequency DOE H1 and the fixed spatial-frequency DOE D2 comprise a laser beam-modifying (sub)system in accordance with the present invention. Each of the DOEs in this system embodiment can be realized as a transmission-type HOE, a computer-generated hologram (CGHs), a surface-relief hologram, or other diffractive optical element.

In this embodiment, the total beam-shaping factor $(M=M_1M_2)$ for the laser beam modifying subsystem is less than unity (1), that is M1*M2<1, and thus the laser beam leaving the collimating lens (L1) is compressed in one dimension. Notably, there will be many cases in which the beam shaping factor is less than unity, including, for example: where M1<1 and M2<1; where M1=1 and M2<1; and where M1<1 and M2=1. In the Beam Compression Mode, one of the cross-sectional dimensions of the laser beam from the VLD is compressed at the output of the system to a predetermined dimension. Typically, although not necessarily, the wider cross-sectional dimension of the laser beam will be the one that is compressed. For example, if the beam is S-polarized at DOE D1, then the widest cross-sectional dimension of the laser beam from the VLD is compressed at the output of the system to a predetermined dimension. If the beam is P-polarized, then the narrowest dimension of the laser beam from the VLD is compressed at the output of the system to a predetermined dimension, thereby making the laser beam even more elliptical in cross-section.

In the laser beam producing system shown in FIG. 2A, the aspect-ratio of the output laser beam is controlled and dispersion in the output laser beam produced therefrom eliminated for the central ray (and minimized for off-center rays) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$ which, in turn, determine the proper angle between the two DOEs, indicated by ρ. In this embodiment, the (x,y,z) position of the VLD is adjustable relative to lens L1 during the parameter alignment stage of the system assembly process in order to set the focal length of the output laser beam to the desired value and to align the VLD to the optical axis of lens L1. The (x,y,z) position of the VLD has no effect on dispersion except insofar as the x, y position effects the angle of incidence $\theta_{i1}$ at H1. If the laser beam output from the VLD is not aligned along the optical axis of L1, then dispersion may not be zeroed or minimized as the beam will not pass through the DOEs are designed. In this embodiment, astigmatism in the output laser beam is not minimized or otherwise controlled. Consequently, there will be a number of applications to which this system embodiment can be put with satisfactory result.

Notably, in the embodiment of the laser beam producing system shown in FIG. 2A, the convergence of the beam leaving collimating lens L1 must be adjusted to provide the proper image distance to the focal point of the system, and therefore it cannot be used to control or eliminate the astigmatism that is inherent in the laser beam leaving the VLD. In the case of Scan-Engine and like type applications, where the laser scanning device is realized within an ultra-small volume, laser beam astigmatism is not a problem as the increase (i.e. elongation) in spot-size in the non-scan-dimension helps reduce the problems associated with paper noise, described in U.S. Pat. No. 4,748,316, incorporated herein by reference.

Second Illustrative System Embodiment of the Laser Beam Producing System of the Present Invention In FIG. 2B, the second illustrative embodiment of the laser beam producing system hereof ("System Embodiment No. 2") comprises: a laser beam source, such as a visible laser diode (VLD), for producing a laser beam from its junction having divergent and elliptical characteristics; a collimating lens (L1), realizable as a refractive lens e.g. a 4/35 mm lens, a HOE, other type of DOE, a grin lens, one or more zone plate(s), etc., for collimating the laser beam as it is transmitted through collimating lens L1 and through the system in a S-incident manner; a fixed spatial-frequency diffractive optical element (DOE), i.e. diffraction grating, indicated by D1 having a beam expansion factor $M_1$; and a fixed spatial-frequency diffractive optical element (DOE), i.e. diffraction grating, indicated by D2, having a beam expansion factor $M_2$; and a focusing lens L2, realizable as a refractive lens, a HOE, a DOE, a grin lens, zone plate(s) or the like, disposed after DOE D2 for focusing the output laser beam to a desired or required point in space. Collectively, the collimating lens L1, the fixed spatial-frequency DOE D1, the fixed spatial-frequency DOE D2, and focusing lens L2, comprise a laser beam modifying subsystem in accordance with the present invention. Each of the DOEs in this system embodiment can be realized as a transmission-type HOE, a CGH, a surface-relief hologram, or other diffractive optical element.

In this embodiment, the total beam-shaping factor ($M=M_1 M_2$) for the laser beam modifying subsystem is less than unity (1), that is M1*M2<1, and thus the laser beam leaving the collimating lens (L1) is compressed in one dimension. Notably, there will be many cases in which the beam shaping factor is less than unity, including, for example: where M1<1 and M2<1; where M1=1 and M2<1; and where M1<1 and M2=1. In the Beam Compression Mode, one of the cross-sectional dimensions of the laser beam from the VLD is compressed at the output of the system to a predetermined dimension. Typically, although not necessarily, the wider cross-sectional dimension of the laser beam will be the one that is compressed. In this embodiment, the total beam-shaping factor ($M=M_1 M_2$) for the laser beam subsystem is less than unity (1), and thus the laser beam leaving the collimating lens (L1) is compressed in one dimension.

In the laser beam producing system shown in FIG. 2B, the aspect-ratio of the output laser beam can be controlled and dispersion in the output laser beam produced therefrom can be eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs, indicated by ρ.

In this embodiment of the laser beam producing system, the inherent astigmatism of the laser beam leaving the VLD can be either adjusted or eliminated by choosing proper divergence or convergence of the laser beam leaving the collimating lens L1. The (x,y,z) position of visible laser diode VLD is adjustable relative to the lens L1 during the parameter adjustment stage of the system assembly process, in order to adjust the divergence or convergence of the beam leaving lens L1 and to align the VLD to the optical axis of lens L1. Also, the position of lens L2 is adjustable along its optical axis relative to DOE D2 during the alignment stage of the system assembly process in order to set the focal length of the output laser beam to the desired value.

In the illustrative embodiments described hereinabove, DOEs D1 and D2 are realized using either transmission-type or reflection-type light diffractive optical elements (e.g. reflection-type volume HOEs). It is understood, however, that this illustrative embodiment of the present invention can be realized using reflection-type volume DOEs (e.g. reflection-type HOEs and CGHs) as well. In such alternative realizations of this embodiment of the present invention, each DOE can be realized using a reflective-type DOE for DOE D1 and/or DOE D2. The only requirement in either case is that the angle of diffraction be different than the angle of incidence for each light diffractive element of the DOE-based device. In general, this requirement can be met using either a transmissive holographic optical element (HOE) or a reflective HOE.

As shown in FIG. 2B1, the second illustrative embodiment of the DOE-based laser beam producing subsystem hereof is shown realized using reflection-type DOEs (e.g. HOEs) for both DOE D1 and DOE D2. In this alternative realization, DOE D1 and DOE D2 both have a fixed spatial frequency and, when combined together with the VLD, lenses L1 and L2 as shown in FIG. 2B1, produce a system which is the functional equivalent of the system shown in FIG. 2B, and operates in the Beam Compression Mode.

As shown in FIG. 2B2, the second illustrative embodiment of the DOE-based laser beam producing subsystem hereof is shown realized using a transmission-type DOE (e.g. transmission-type HOE H1) for DOE D1 and a reflection-type DOE (e.g. reflection-type HOE H2) for DOE D2. In this alternative realization, DOE D1 and DOE D2 both have a fixed spatial frequency and, when combined together with the VLD, lenses L1 and L2 as shown in FIG. 2B2, produce a system which is the functional equivalent of the system shown in FIG. 2B, and operates in the Beam Compression Mode.

As shown in FIG. 2B3, the second illustrative embodiment of the DOE-based laser beam producing subsystem hereof is shown realized using a reflection-type DOE (e.g. reflection-type HOE H1) for DOE D1 and a reflection-type DOE (e.g. reflection-type HOE H2) for DOE D2. In this alternative realization, DOE D1 and DOE D2 both have a fixed spatial frequency and, when combined together with the VLD, lenses L1 and L2 as shown in FIG. 2B3, produce a system which is the functional equivalent of the system shown in FIG. 2B, and operates in the Beam Compression Mode.

Figure 2C:
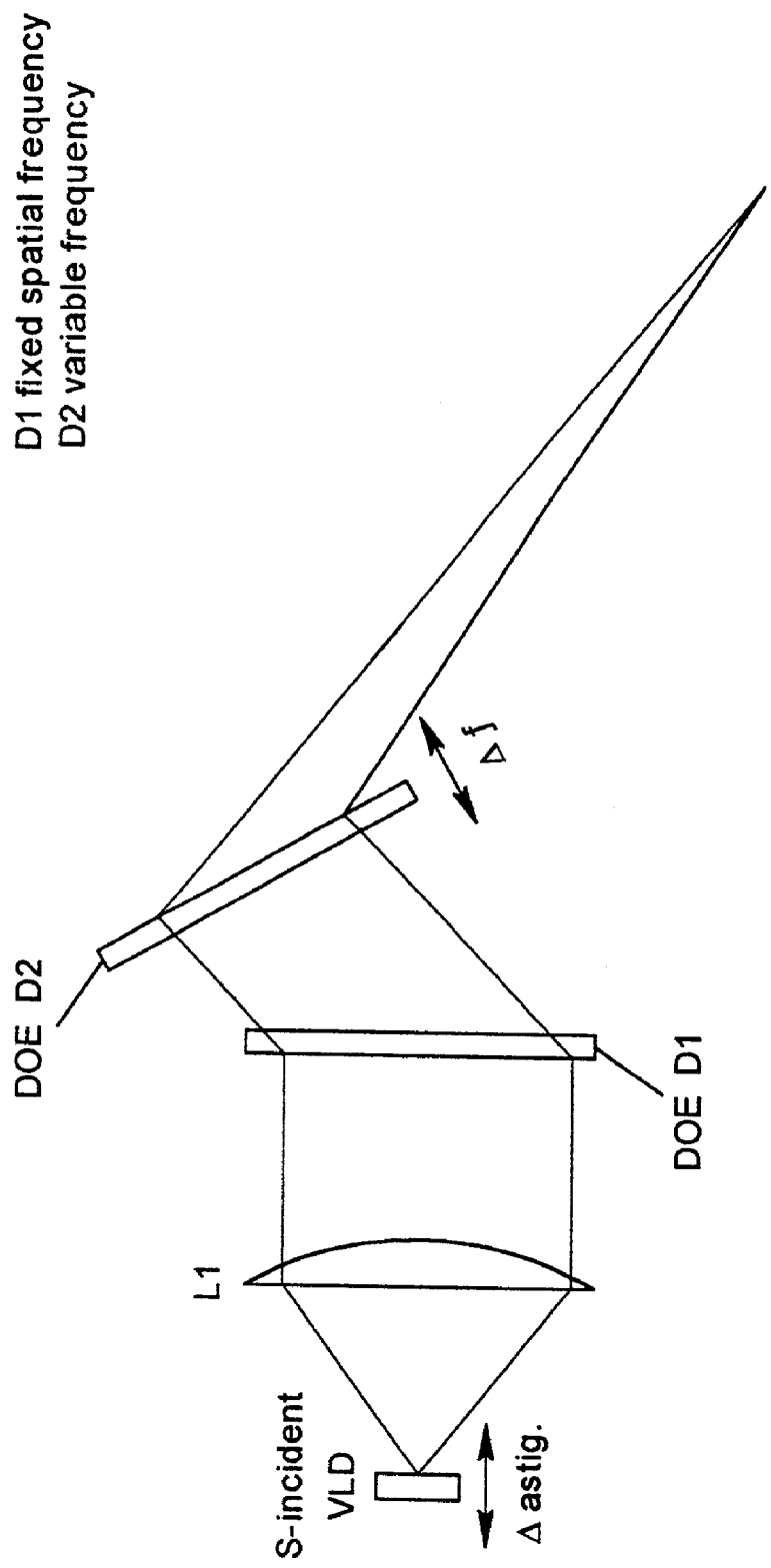
FIG. 2C is a geometrical optics model of the third illustrative embodiment of the DOE-based laser beam producing subsystem according to the principles of the present invention.

Third Illustrative System Embodiment of the Laser Beam Producing System of the Present Invention In FIG. 2C, the third illustrative embodiment of the laser beam producing system hereof ("System Embodiment No. 3") comprises: a laser beam source, such as a visible laser diode (VLD), for producing a laser beam from its junction; a collimating lens (L1), realizable as a refractive lens, a HOE, a DOE, a grin lens, zone plate(s) or the like, for collimating the laser beam as it is transmitted through collimating lens L1 and through the system in a S-incident manner; a fixed spatial-frequency diffractive optical element (DOE), i.e. diffraction grating, indicated by D1 having a beam expansion factor $M_1$; and a variable spatial-frequency diffractive optical element (DOE) indicated by D2, having a beam expansion factor $M_2$. Collectively, the collimating lens L1, the fixed spatial-frequency DOE D1 and the variable spatial-frequency DOE D2 comprise a laser beam-modifying (sub)system in accordance with the present invention. Each of the DOEs in this system embodiment can be realized as a transmission-type HOE, a CGH, a surface-relief hologram, or other diffractive optical element.

In this embodiment, the total beam-shaping factor ($M=M_1M_2$) for the laser beam modifying subsystem is less than unity (1), that is M1*M2<1, and thus the laser beam leaving the collimating lens (L1) is compressed in one dimension. There will be many cases in which the beam shaping factor is less than unity, including, for example: where M1<1 and M2<1; where M1=1 and M2<1; and where M1<1 and M2=1. In the Beam Compression Mode, one of the cross-sectional dimensions of the laser beam from the VLD is compressed at the output of the system to a predetermined dimension. Typically, although not necessarily, the wider cross-sectional dimension of the laser beam will be the one that is compressed.

In the laser beam producing system shown in FIG. 2C, the aspect-ratio of the output laser beam can be controlled and dispersion in the output laser beam produced therefrom is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs, indicated by $\rho$.

In this embodiment of the laser beam producing system, the inherent astigmatism of the laser beam leaving the VLD is adjusted or eliminated by choosing proper divergence or convergence of the laser beam leaving the collimating lens L1. The (x,y) position of visible laser diode VLD is adjustable relative to the lens L1 during the parameter adjustment stage of the system assembly process, in order to adjust the divergence or convergence of the beam leaving lens L1. The z position of visible laser diode (VLD) is adjustable relative to the lens L1 during the parameter adjustment stage of the system assembly process, in order to align the VLD with respect to the optical axis of lens L1. Also, the position of DOE D2 is adjustable along its optical axis relative to DOE D1 during the alignment stage of the system assembly process in order to set the focal length of the output laser beam to the desired value.

Figure 2D:
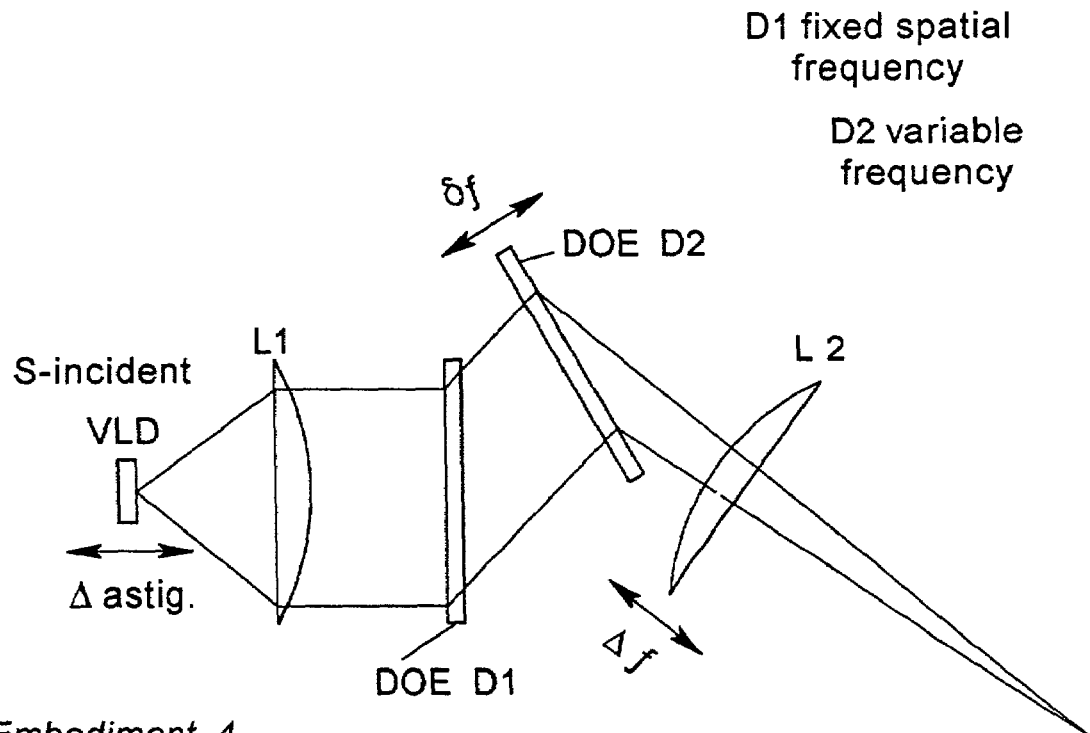
FIG. 2D is a geometrical optics model of the fourth illustrative embodiment of the DOE-based laser beam producing subsystem according to the principles of the present invention.

Fourth Illustrative System Embodiment of the Laser Beam Producing System of the Present Invention In FIG. 2D, the fourth illustrative embodiment of the laser beam producing system hereof ("System Embodiment No. 4") comprises: a laser beam source, such as a visible laser diode (VLD), for producing an elliptical divergent laser beam from its junction; a collimating lens (L1), realizable as a refractive lens, a HOE, or other DOE, a grin lens, zone plate(s), etc., for collimating the laser beam as it is transmitted through collimating lens L1 and through the system in a S-incident manner; a fixed spatial-frequency diffractive optical element (DOE), i.e. diffraction grating, indicated by D1; a variable spatial-frequency diffractive optical element (DOE) indicated by D2 and adjustably mounted to enable, during the alignment stage of the system adjustment process, the principal plane of DOE D2 to be translated along its optical axis relative to the principal plane of DOE D1 without modifying the tilt angle therebetween; and a focusing lens (L2), realizable as a refractive lens, a HOE, a DOE, a grin lens, zone plate(s) or the like, disposed after the second DOE D2 and having a focal length which is can be adjusted to enable the focusing of the output laser beam to some predetermined focal point in space, during the alignment stage of the system assembly process. Collectively, the collimating lens L1, the fixed spatial-frequency DOE D1, the variable spatial-frequency DOE D2, and the focusing lens L2 comprise a laser beam-modifying subsystem in accordance with the present invention. Each of the DOEs in this system embodiment can be realized as a transmission-type HOE, a CGH, a surface-relief hologram, or other diffractive optical element.

In this illustrative embodiment of the optical system of the present invention, focusing lens L2 is disposed after the second focusing DOE D2 in order to provide additional optical power to the exiting laser beam. In general, lens L2 can be as a single lens whose position can be adjusted relative to the second DOE D2, or as a compound lens system having a focal length that can be adjusted so as to adjust the focal length of the output laser beam. This second optical arrangement L2 would be useful in applications where, for example, multiple focusing HOEs as are commonly arranged on a holographic scanning disc (disclosed in application Ser. No. 08/573,949) or where several different single HOEs of differing optical power were available to be placed in the system. One of these HOEs on the disc could be presented to the laser beam producing system hereof in the position of DOE D2 and effectively vary the focal distance of the output laser beam about an average focal point established by the lens L2, a process which shall be referred to hereinafter as "delta-focusing". This delta-focusing feature yields the benefits of reduced spot aberrations due to the optical power of DOE D2 as well as increased modularity of the system.

In this embodiment, the total beam-shaping factor ($M=M_1M_2$) for the laser beam modifying subsystem is less than unity (1), that is M1*M2<1, and thus the laser beam leaving the collimating lens (L1) is compressed in one dimension. There will be many cases in which the beam shaping factor is less than unity, including, for example: where M1<1 and M2<1; where M1=1 and M2<1; and where M1<1 and M2=1. In the Beam Compression Mode, one of the cross-sectional dimensions of the laser beam from the VLD is compressed at the output of the system to a predetermined dimension. Typically, although not necessarily, the wider cross-sectional dimension of the laser beam will be the one that is compressed.

In the laser beam producing system shown in FIG. 2D, the aspect-ratio of the output laser beam can be controlled and dispersion in the output laser beam eliminated (or minimized) for any given beam expansion or beam compression ratio at each of the DOEs, by selecting the right combination of angles of incidence and diffraction for the two DOEs D1 and D2 indicated by $\theta_{i1}$, $\theta_{d1}$, $\theta_{i2}$ and $\theta d2$, which, in turn, determine the proper angle between the two DOEs, indicated by $\rho$.

In this embodiment of the laser beam producing system, the inherent astigmatism of the laser beam leaving the VLD is adjusted or eliminated by choosing proper divergence or convergence of the laser beam leaving the collimating lens L1. The (x,y) position of visible laser diode VLD is adjustable relative to the lens L1 during the parameter adjustment stage of the system assembly process, in order to adjust the divergence or convergence of the beam leaving lens L1. The z position of visible laser diode VLD is adjustable relative to the lens L1 during the parameter adjustment stage of the system assembly process, in order to align the VLD relative to the optical axis of lens L1. Also, the position of second lens L2 is adjustable along its optical axis relative to DOE D2 during the alignment stage of the system assembly process. The function of this second lens L2 is to set the average focal length of the output laser beam to the desired value for use by the delta-focusing subsystem.

Figure 2E:
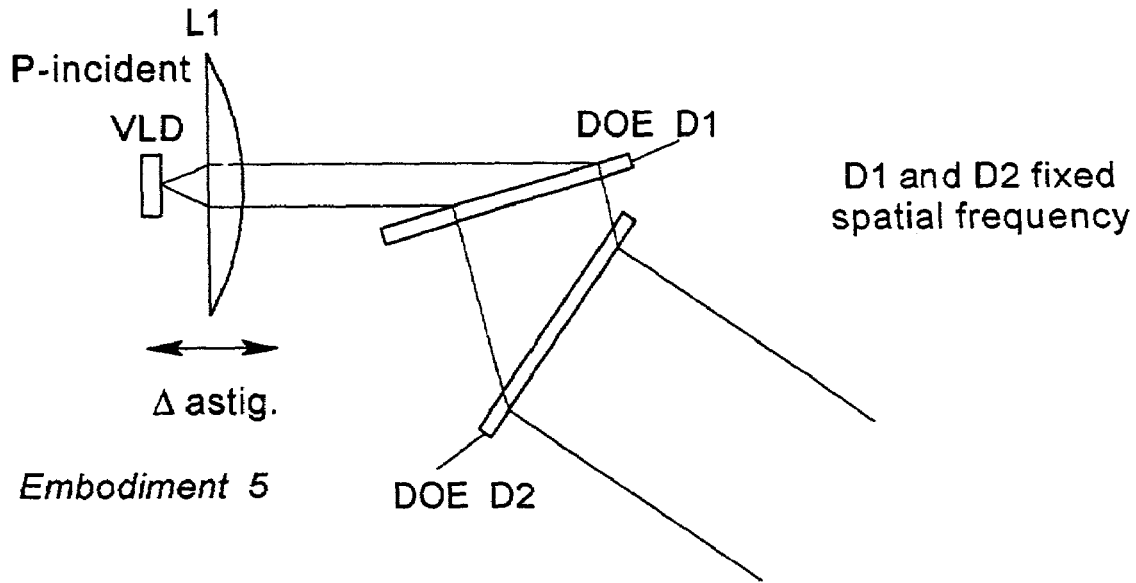
FIG. 2E is a geometrical optics model of the fifth illustrative embodiment of the DOE-based laser beam producing subsystem according to the principles of the present invention.

Fifth Illustrative System Embodiment of the Laser Beam Producing System of the Present Invention In FIG. 2E, the fifth illustrative embodiment of the laser beam producing system hereof ("System Embodiment No. 5") comprises: a laser beam source, such as a visible laser diode (VLD), for producing a laser beam from its junction; a collimating (non-focusing) lens (L1), realizable as a refractive lens, a HOE or other DOE, a grin lens, zone plate(s), etc., for collimating the laser beam as it is transmitted through collimating lens L1 and through the system in a P-incident manner; a fixed spatial-frequency diffractive optical element (DOE), i.e. diffraction grating, indicated by D1; and a fixed spatial-frequency diffractive optical element (DOE) indicated by D2. Collectively, the collimating lens L1, the fixed spatial-frequency DOE D1 and the fixed spatial-frequency DOE D2 comprise a laser beam-modifying (sub)system in accordance with the present invention. Each of the DOEs in this system embodiment can be realized as a transmission-type HOE, a CGH, a surface-relief hologram, or other diffractive optical element.

In this embodiment, the total beam-shaping factor ($M=M_1M_2$) for the laser beam modifying subsystem is greater than unity (1), that is M1*M2>1, and thus the laser beam leaving the collimating lens (L1) is expanded in one dimension. There will be many cases in which the beam shaping factor is greater than unity, including, for example: where M1>1 and M2>1; where M1=1 and M2>1; and where M1>1 and M2=1. In the Beam Expansion Mode, one of the cross-sectional dimensions of the laser beam from the VLD is expanded at the output of the system to a predetermined dimension. Typically, although not necessarily, the narrower cross-sectional dimension of the laser beam will be the one that is expanded.

In the laser beam producing system shown in FIG. 2E, the aspect-ratio of the output laser beam can be controlled and dispersion in the output laser beam produced therefrom is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs, indicated by $\rho$.

In this embodiment, the (x,y) position of the VLD is adjustable relative to lens L1 during the parameter alignment stage of the system assembly process in order to set the focal length of the output laser beam to the desired value. The z position of the VLD is adjustable relative to lens L1 during the parameter alignment stage of the system assembly process in order to align the VLD to the optical axis of lens L1.

Notably, in the embodiment of the laser beam producing system shown in FIG. 2E, the convergence of the beam leaving collimating lens L1 must be adjusted to provide the proper image distance to the focal point of the system, and therefore it cannot be used to control or eliminate the astigmatism that is inherent in the laser beam leaving the VLD. In the case of Scan-Engine and like type applications, where the laser scanning device is realized within an ultra-small volume, laser beam astigmatism is not a problem as the increase (i.e. elongation) in spot-size in the non-scan-dimension helps reduce the problems associated with paper noise, described in U.S. Pat. No. 4,748,316, supra.

Figure 2F:
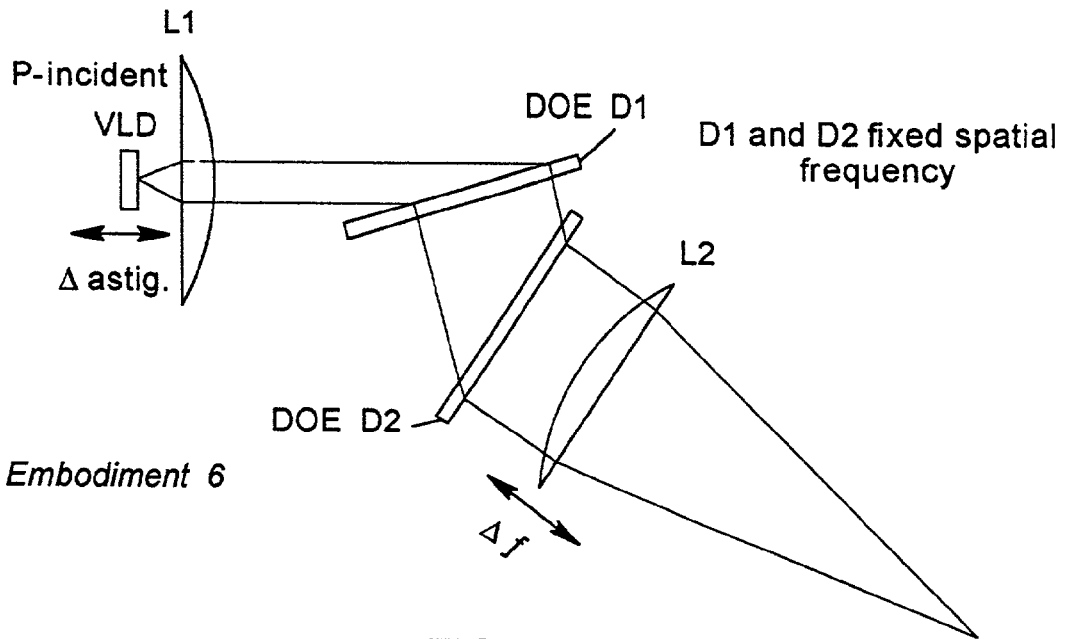
FIG. 2F is a geometrical optics model of the sixth illustrative embodiment of the DOE-based laser beam producing subsystem according to the principles of the present invention.

Sixth Illustrative System Embodiment of the Laser Beam Producing System of the Present Invention In FIG. 2F, the sixth illustrative embodiment of the laser beam producing system hereof ("System Embodiment No. 6") comprises: a laser beam source, such as a visible laser diode (VLD), for producing a laser beam from its junction; a collimating lens (L1), realizable as a refractive lens, a HOE or other DOE, a grin lens, zone plate(s), etc., for collimating the laser beam as it is transmitted through collimating lens L1 and through the system in a P-incident manner; a fixed spatial-frequency diffractive optical element (DOE), i.e. diffraction grating, indicated by D1; a fixed spatial-frequency diffractive optical element (DOE) indicated by D2; and a focusing lens (L2), realizable as a refractive lens, a HOE, a DOE, a grin lens, zone plate(s) or the like, disposed after the second DOE D2 for focusing the output laser beam to some point in space. Collectively, the collimating lens L1, the fixed spatial-frequency DOE D1, the fixed spatial-frequency DOE D2, and focusing lens L2 comprise a laser beam-modifying (sub)system in accordance with the present invention. Each of the DOEs in this system embodiment can be realized as a transmission-type HOE, a CGH, a surface-relief hologram, or other diffractive optical element.

In this embodiment, the total beam-shaping factor ($M=M_1M_2$) for the laser beam modifying subsystem is greater than unity (1), that is M1*M2>1, and thus the laser beam leaving the collimating lens (L1) is expanded in one dimension. There will be many cases in which the beam shaping factor is greater than unity, including, for example: where M1>1 and M2>1; where M1=1 and M2>1; and where M1>1 and M2=1. In the Beam Expansion Mode, one of the cross-sectional dimensions of the laser beam from the VLD is expanded at the output of the system to a predetermined dimension. Typically, although not necessarily, the narrower cross-sectional dimension of the laser beam will be the one that is expanded.

In the laser beam producing system shown in FIG. 2F, aspect-ratio control is achieved and dispersion in the output laser beam is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs, indicated by $\rho$.

In this embodiment of the laser beam producing system, the inherent astigmatism of the laser beam leaving the VLD is either adjusted or eliminated by choosing proper divergence or convergence of the laser beam leaving the collimating lens L1. The (x,y) position of visible laser diode VLD is adjustable relative to the lens L1 during the parameter adjustment stage of the system assembly process in order to adjust the divergence or convergence of the beam leaving lens L1. The z position of visible laser diode VLD is adjustable relative to the lens L1 during the parameter adjustment stage of the system assembly process in order to align the VLD to the optical axis of lens L1. Setting the focal length of output laser beam is achieved by adjusting the position of lens L2 relative to DOE D2 during the alignment stage of the assembly process.

Figure 2G:
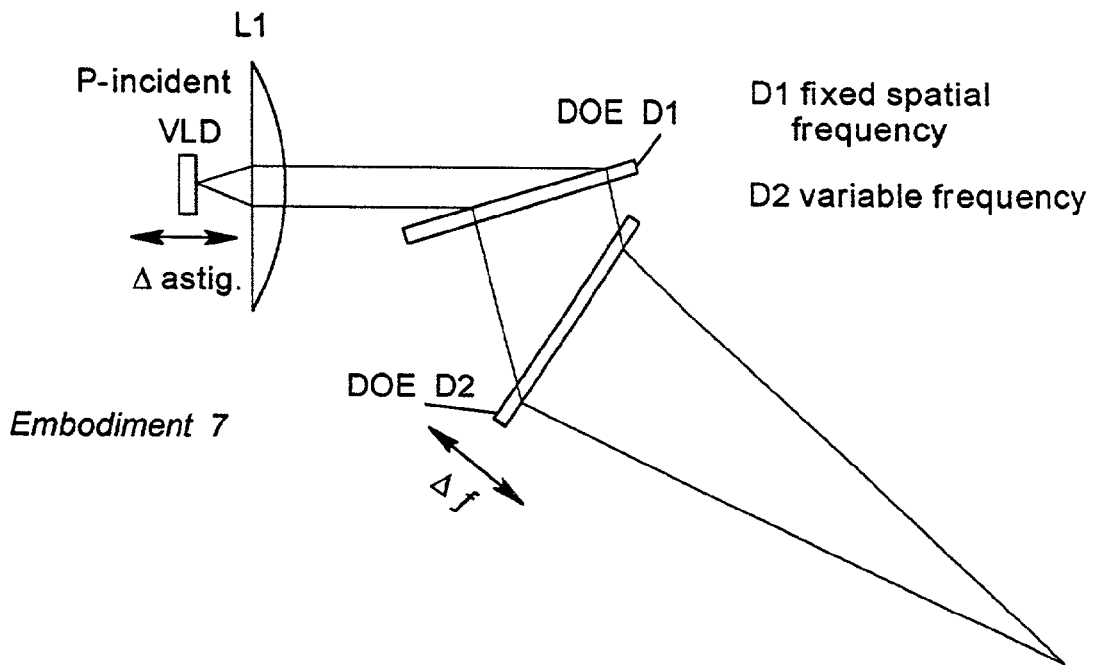
FIG. 2G is a geometrical optics model of the seventh illustrative embodiment of the DOE-based laser beam producing subsystem according to the principles of the present invention.

Seventh Illustrative System Embodiment of the Laser Beam Producing System of the Present Invention In FIG. 2G, the seventh illustrative embodiment of the laser beam producing system hereof ("System Embodiment No. 7") comprises: a laser beam source, such as a visible laser diode (VLD), for producing a laser beam from its junction; a collimating lens (L1), realizable as a refractive lens, HOE or other DOE, a grin lens, zone plate(s), etc., for collimating the laser beam as it is transmitted through collimating lens L1 and through the system in a P-incident manner; a fixed spatial-frequency diffractive optical element (DOE), i.e. diffraction grating, indicated by D1; and a variable spatial-frequency diffractive optical element (DOE) indicated by D2, which can be translated along the optical axis relative to the principal plane of DOE D1 during the alignment stage of the system assembly process. Collectively, the collimating lens L1, the fixed spatial-frequency DOE D1 and the variable spatial-frequency DOE D2 comprise a laser beam-modifying (sub)system in accordance with the present invention. Each of the DOEs in this system embodiment can be realized as a transmission-type DOE, a CGH, a surface-relief hologram, or other diffractive optical element.

In this embodiment, the total beam-shaping factor ($M=M_1 M_2$) for the laser beam modifying subsystem is greater than unity (1), that is M1*M2>1, and thus the laser beam leaving the collimating lens (L1) is expanded in one dimension. There will be many cases in which the beam shaping factor is greater than unity, including, for example: where M1>1 and M2>1; where M1=1 and M2>1; and where M1>1 and M2=1. In the Beam Expansion Mode, one of the cross-sectional dimensions of the laser beam from the VLD is expanded at the output of the system to a predetermined dimension. Typically, although not necessarily, the narrower cross-sectional dimension of the laser beam will be the one that is expanded.

In the laser beam producing system shown in FIG. 2G, aspect-ratio control is achieved and dispersion in the output laser beam is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$ which, in turn, determine the proper angle between the two DOEs, indicated by ρ.

In this embodiment of the laser beam producing system, the inherent astigmatism of the laser beam leaving the VLD is either adjusted or eliminated by choosing proper divergence or convergence of the laser beam leaving the collimating lens L1. The (x,y) position of visible laser diode VLD is adjustable relative to the lens L1 during the parameter adjustment stage of the system assembly process, in order to adjust the divergence or convergence of the beam leaving lens L1. The z position of visible laser diode VLD is adjustable relative to the lens L1 during the parameter adjustment stage of the system assembly process in order to align the VLD to the optical axis of lens L1. Also, the position of DOE D2 is adjustable along its optical axis relative to DOE D1 during the alignment stage of the system assembly process in order to set the focal length of the output laser beam to the desired value.

Figure 2H:
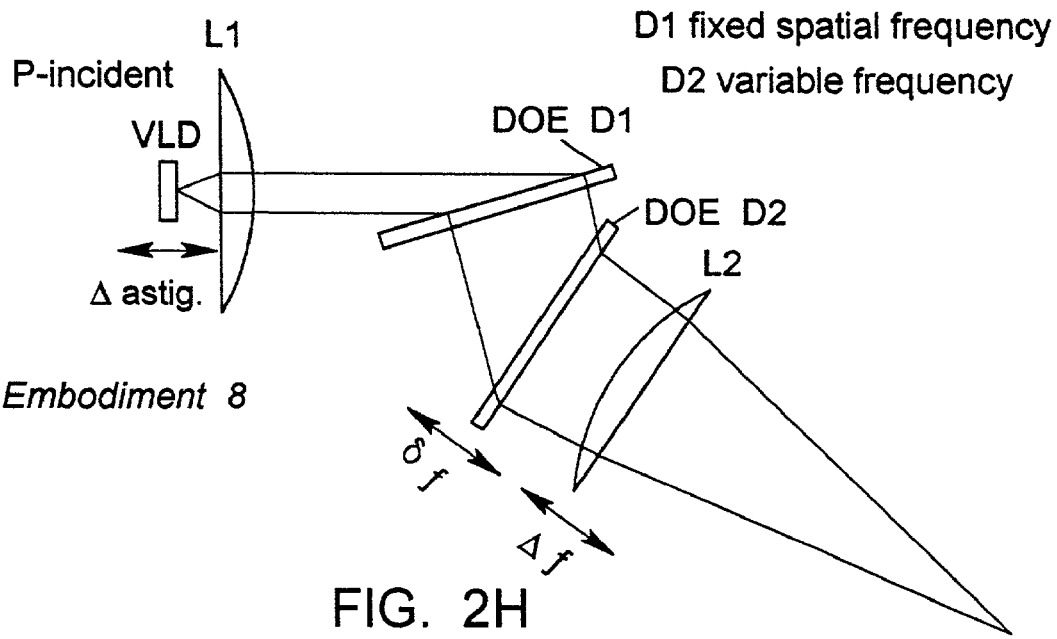
FIG. 2H is a geometrical optics model of the eighth illustrative embodiment of the DOE-based laser beam producing subsystem according to the principles of the present invention.

Eighth Illustrative System Embodiment of the Laser Beam Producing System of the Present Invention In FIG. 2H, the eighth illustrative embodiment of the laser beam producing system hereof ("System Embodiment No. 8") comprises: a laser beam source, such as a visible laser diode (VLD); a collimating lens (L1) realizable as a refractive lens, a HOE, a CGH or other DOE, a grin lens, zone plate(s), etc., for collimating the laser beam as it is transmitted through collimating lens L1 and through the system in a P-incident manner; a fixed spatial-frequency diffractive optical element (DOE), i.e. diffraction grating, indicated by D1; a variable spatial-frequency diffractive optical element (DOE) indicated by D2, adjustably mounted relative to DOE D1; and a focusing lens (L2), realizable as a refractive lens, a HOE, a DOE, grin lens, zone plate(s) or the like, disposed after the second DOE D2, and adjustably mounted relative thereto, for focusing the output laser beam to some point in space. Collectively, the collimating lens L1, the fixed spatial-frequency DOE D1, the variable spatial-frequency DOE D2 and focusing lens L2 comprise a laser beam-modifying (sub)system in accordance with the present invention. Each of the DOEs in this system embodiment can be realized as a transmission-type HOE, a CGH, a surface-relief hologram, or other diffractive optical element.

In this illustrative embodiment of the optical system of the present invention, focusing lens L2 is disposed after the second focusing DOE D2 in order to provide additional optical power to the exiting laser beam. This optical arrangement would be useful in applications employing delta-focusing. This delta-focusing yields the benefits of reduced spot aberrations due to the optical power of DOE D2 as well as increased modularity of the system.

In this embodiment, the total beam-shaping factor ($M=M_1 M_2$) for the laser beam modifying subsystem is greater than unity (1), that is M1*M2>1, and thus the laser beam leaving the collimating lens (L1) is expanded in one dimension. There will be many cases in which the beam shaping factor is greater than unity, including, for example: where M1>1 and M2>1; where M1=1 and M2>1; and where M1>1 and M2=1. In the Beam Expansion Mode, one of the cross-sectional dimensions of the laser beam from the VLD is expanded at the output of the system to a predetermined dimension. Typically, although not necessarily, the narrower cross-sectional dimension of the laser beam will be the one that is expanded.

In the laser beam producing system shown in FIG. 2H, aspect-ratio control is achieved and dispersion in the output laser beam is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs, indicated by ρ.

In this embodiment of the laser beam producing system, the inherent astigmatism of the laser beam leaving the VLD is either adjusted or eliminated by choosing proper divergence or convergence of the laser beam leaving the collimating lens L1. The (x,y) position of visible laser diode VLD is adjustable relative to the lens L1 during the parameter adjustment stage of the system assembly process, in order to adjust the divergence or convergence of the beam leaving lens L1. The z position of visible laser diode VLD is adjustable relative to the lens L1 during the parameter adjustment stage of the system assembly process, in order to align the VLD to the optical axis of lens L1. Also, the position of lens L2 is adjustable along its optical axis relative to DOE D2 during the alignment stage of the system assembly process in order to set the average focal length of the output laser beam to the desired value for use by the delta-focusing system.

Figure 2I:
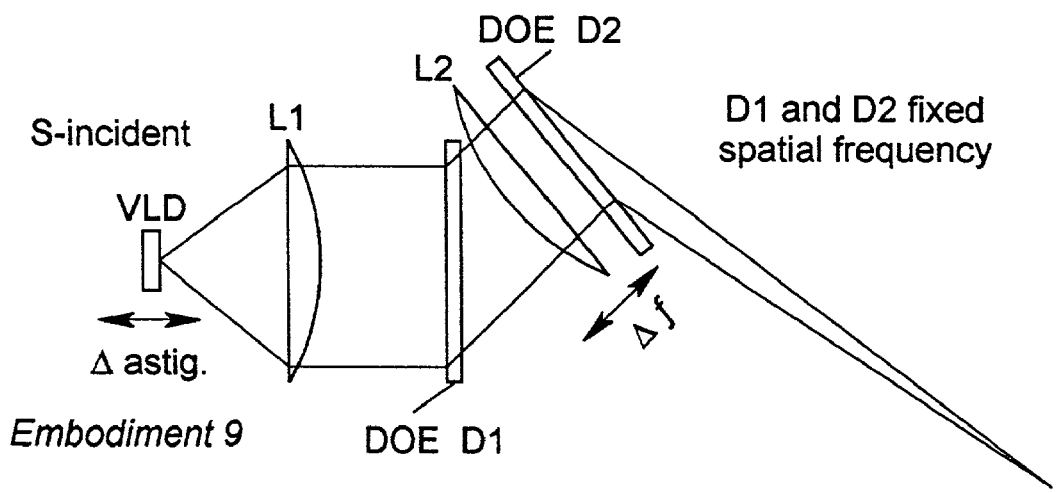
FIG. 2I is a geometrical optics model of the ninth illustrative embodiment of the DOE-based laser beam producing subsystem according to the principles of the present invention.

Ninth Illustrative System Embodiment of the Laser Beam Producing System of the Present Invention In FIG. 2I, the ninth illustrative embodiment of the laser beam producing system hereof ("System Embodiment No. 9") comprises: a laser beam source, such as a visible laser diode (VLD), for producing a laser beam from its junction; a collimating lens (L1), realizable as a refractive lens, a HOE, CGH or other DOE, a grin lens, zone plate(s), etc., for collimating the laser beam as it is transmitted through collimating lens L1 and through the system in an S-incident manner; a fixed spatial-frequency diffractive optical element (DOE), i.e. diffraction grating, indicated by D1; a fixed spatial-frequency diffractive optical element (DOE) indicated by D2; and a focusing lens (L2), realizable as a refractive lens, holographic optical element (HOE), diffractive optical element (DOE), grin lens, zone plate(s) or the like, disposed between DOE D1 and DOE D2 and adjustably translatable along its optical axis for focusing the output laser beam to some point in space. Collectively, the collimating lens L1, the fixed spatial-frequency DOE D1, the fixed spatial-frequency DOE D2, and focusing lens L2 comprise a laser beam-modifying (sub)system in accordance with the present invention. Each of the DOEs in this system embodiment can be realized as a transmission-type HOE, a CGH, a surface-relief hologram, or other diffractive optical element.

In this embodiment, the total beam-shaping factor ($M=M_1 M_2$) for the laser beam modifying subsystem is less than unity (1), that is M1*M2<1, and thus the laser beam leaving the collimating lens (L1) is compressed in one dimension. Notably, there will be many cases in which the beam shaping factor is less than unity, including, for example: where M1<1 and M2<1; where M1=1 and M2<1; and where M1<1 and M2=1. In the Beam Compression Mode, one of the cross-sectional dimensions of the laser beam from the VLD is compressed at the output of the system to a predetermined dimension. Typically, although not necessarily, the wider cross-sectional dimension of the laser beam will be the one that is compressed.

Figure 21:
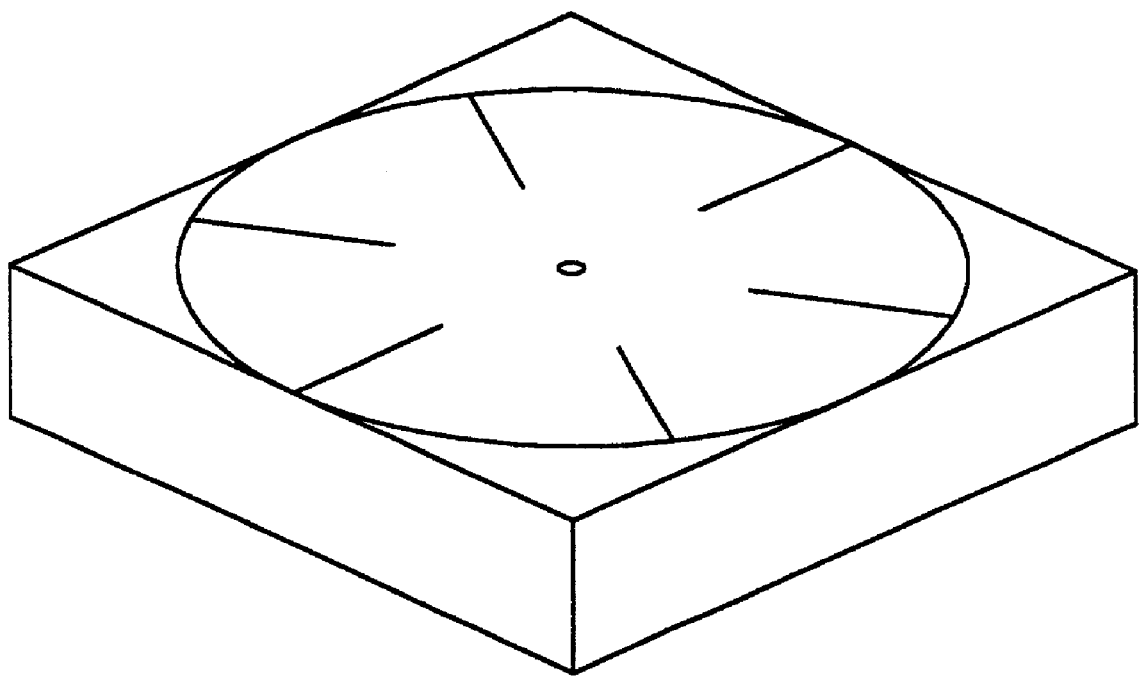
FIG. 21 is a schematic representation of a holographic laser beam scanning system, wherewith a plurality of laser beam producing modules of the present invention cooperate with a holographic laser scanning disc and a plurality of wavelength-compensation gratings to produce an omni-directional scanning pattern within a 3-D scanning volume.

In the laser beam producing system shown in FIG. 21, aspect-ratio control is achieved and dispersion in the output laser beam is eliminated (or minimized) for any given beam expansion or beam compression ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs, indicated by $\rho$.

In this embodiment of the laser beam producing system, lenses L1 and L2 are chosen such that the desired focus is achieved and the inherent astigmatism of the laser beam leaving the VLD is either adjusted or eliminated. Neither lens L1 nor L2 independently set the astigmatism nor the focus. Rather the combined set of lenses produce the combined result.

The (z) position of visible laser diode VLD is adjustable relative to the lens L1 during the parameter adjustment stage of the system assembly process, in order to adjust the divergence or convergence of the beam leaving lens L1 to produce a predetermined amount of astigmatism at a predetermined distance. The (x,y) position of visible laser diode VLD is adjustable relative to the lens L1 during the parameter adjustment stage of the system assembly process, in order to align the VLD to the optical axis of lens L1. Also, the position of lens L2 is adjustable along its optical axis between DOE D1 and DOE D2 during the alignment stage of the system assembly process in order to set the desired focus as well as the desired amount of astigmatism of the output laser beam.

Figure 2J:
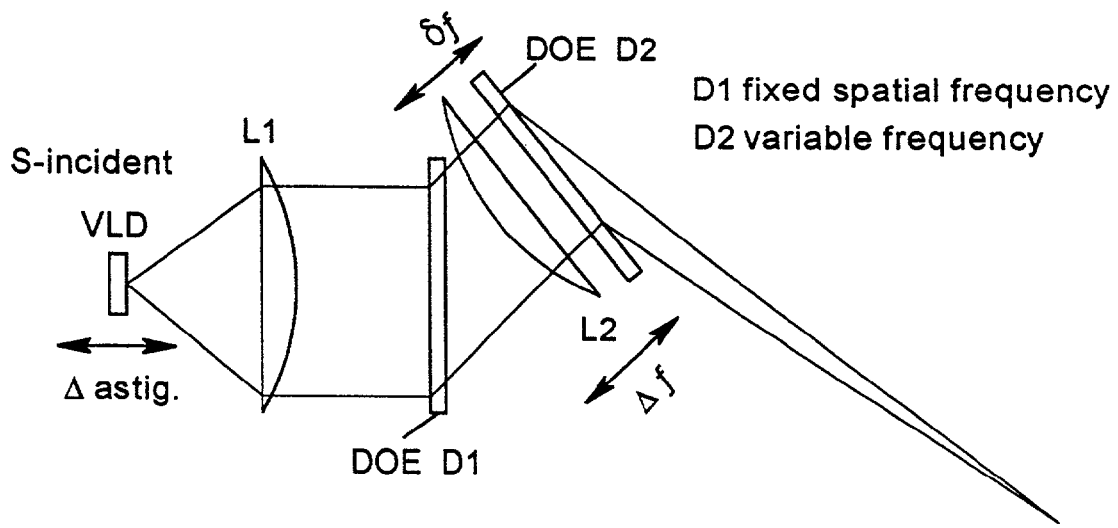
FIG. 2J is a geometrical optics model of the tenth illustrative embodiment of the DOE-based laser beam producing subsystem according to the principles of the present invention.

Tenth Illustrative System Embodiment of the Laser Beam Producing System of the Present Invention In FIG. 2J, the tenth illustrative embodiment of the laser beam producing system hereof ("System Embodiment No. 10") comprises: a laser beam source, such as a visible laser diode (VLD), for producing a laser beam from its junction; a collimating lens (L1), realizable as a refractive lens, a HOE, CGH or other DOE, a grin lens, zone plate(s), etc., for collimating the laser beam as it is transmitted through collimating lens L1 and through the system in a S-incident manner; a fixed spatial-frequency diffractive optical element (DOE), i.e. diffraction grating, indicated by D1; a variable spatial-frequency diffractive optical element (DOE) indicated by D2, adjustably translatable relative to the principal plane of DOE D1 during the alignment stage of the system assembly process; and a focusing lens (L2), realizable as a refractive lens, a HOE, a DOE, a grin lens, zone plate(s) or the like, disposed between DOE D1 and DOE D2 and adjustably translatable along its optical axis during the parameter alignment stage of the system assembly process for focusing the output laser beam to some point in space. Collectively, the collimating lens L1, the fixed spatial-frequency DOE D1, the variable spatial-frequency DOE D2, and focusing lens L2 comprise a laser beam-modifying (sub)system in accordance with the present invention. Each of the DOEs in this system embodiment can be realized as a transmission-type HOE, a CGH, a surface-relief hologram, or other diffractive optical element.

In this illustrative embodiment of the optical system of the present invention, focusing lens L2 is disposed between DOE D1 and DOE D2 in order to provide additional optical power to the exiting laser beam. This optical arrangement would be useful in applications employing delta-focusing. This delta-focusing yields the benefits of reduced spot aberrations due to the optical power of DOE D2 as well as increased modularity of the system.

In this embodiment, the total beam-shaping factor ($M=M_1 M_2$) for the laser beam modifying subsystem is less than unity (1), that is M1*M2<1, and thus the laser beam leaving the collimating lens (L1) is compressed in one dimension. Notably, there will be many cases in which the beam shaping factor is less than unity, including, for example: where M1<1 and M2<1; where M1=1 and M2<1; and where M1<1 and M2=1. In the Beam Compression Mode, one of the cross-sectional dimensions of the laser beam from the VLD is compressed at the output of the system to a predetermined dimension. Typically, although not necessarily, the wider cross-sectional dimension of the laser beam will be the one that is compressed.

In the laser beam producing system shown in FIG. 2J, beam aspect-ratio control is achieved and dispersion in the output laser beam is eliminated (or minimized) for any given beam expansion or beam compression ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs, indicated by $\rho$.

In this embodiment of the laser beam producing system, the inherent astigmatism of the laser beam leaving the VLD can be either adjusted or eliminated by choosing proper divergence or convergence of the laser beam leaving the collimating lens L1. The (x,y) position of visible laser diode VLD is adjustable relative to the lens L1 during the parameter adjustment stage of the system assembly process, in order to adjust the divergence or convergence of the beam leaving lens L1. The (z) position of visible laser diode VLD is adjustable relative to the lens L1 during the parameter adjustment stage of the system assembly process, in order to align the VLD to the optical axis of lens L1. Also, the position of lens L2 is adjustable along its optical between DOE D1 and DOE D2 during the alignment stage of the system assembly process in order to set the average focal length of the output laser beam to the desired value for use by the delta-focusing system.

Figure 2K:
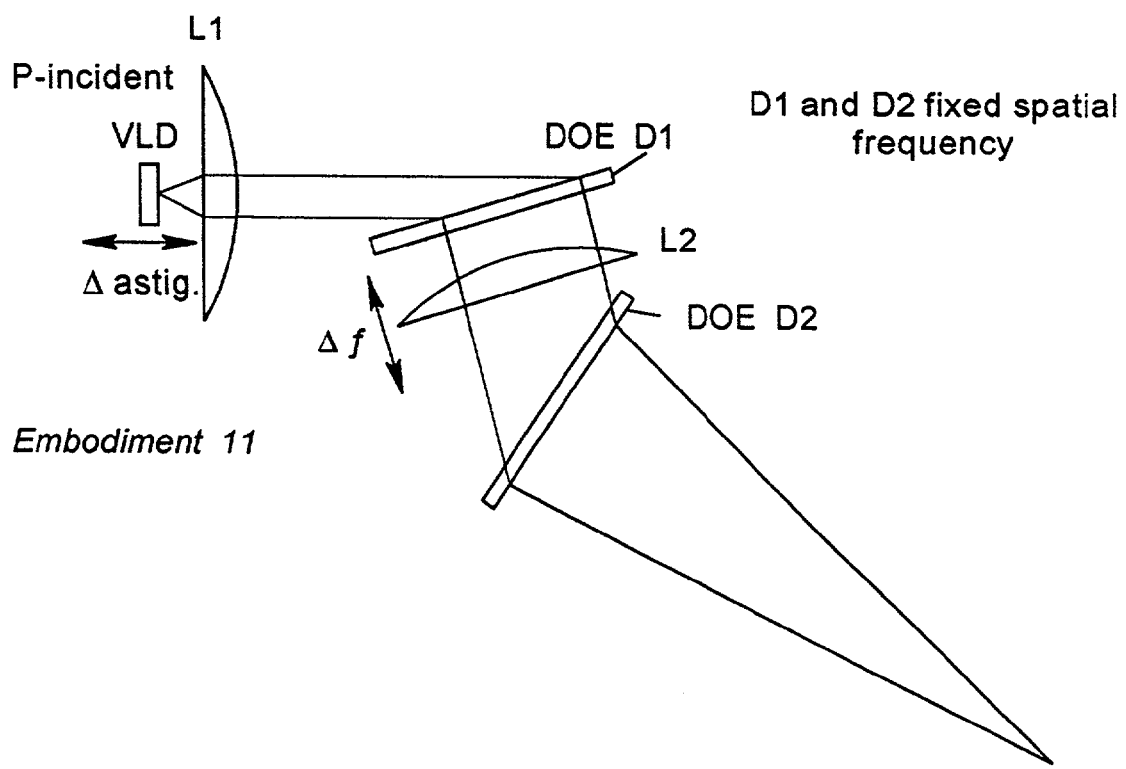
FIG. 2K is a geometrical optics model of the eleventh illustrative embodiment of the DOE-based laser beam producing subsystem according to the principles of the present invention.

Eleventh Illustrative System Embodiment of the Laser Beam Producing System of the Present Invention In FIG. 2K, the eleventh illustrative embodiment of the laser beam producing system hereof ("System Embodiment No. 11") comprises: a laser beam source, such as a visible laser diode (VLD), for producing a laser beam from its junction; a collimating lens (L1), realizable as a refractive lens, a HOE or other DOE, a grin lens, zone plate(s), etc., for collimating the laser beam as it is transmitted through collimating lens L1 and through the system in a P-incident manner; a fixed spatial-frequency diffractive optical element (DOE), i.e. diffraction grating, indicated by D1; a fixed spatial-frequency diffractive optical element (DOE) indicated by D2; and a focusing lens (L2), realizable as a refractive lens, holographic optical element (HOE), diffractive optical element (DOE), grin lens, zone plate(s) or the like, between DOE D1 and DOE D2 and adjustably translatable along its optical axis during the alignment stage of the system assembly process for focusing the output laser beam to some point in space. Collectively, the collimating lens L1, the fixed spatial-frequency DOE D1, the fixed spatial-frequency DOE D2, and the focusing lens L2 comprise a laser beam-modifying (sub)system in accordance with the present invention. Each of the DOEs in this system embodiment can be realized as a transmission-type HOE, a CGH, a surface-relief hologram, or other diffractive optical element.

In this embodiment, the total beam-shaping factor ($M=M_1M_2$) for the laser beam modifying subsystem is greater than unity (1), that is M1*M2>1, and thus the laser beam leaving the collimating lens (L1) is expanded in one dimension. There will be many cases in which the beam shaping factor is greater than unity, including, for example: where M1>1 and M2>1; where M1=1 and M2>1; and where M1>1 and M2=1. In the Beam Expansion Mode, one of the cross-sectional dimensions of the laser beam from the VLD is expanded at the output of the system to a predetermined dimension. Typically, although not necessarily, the narrower cross-sectional dimension of the laser beam will be the one that is expanded.

In the laser beam producing system shown in FIG. 2K, beam aspect-ratio is controlled and dispersion in the output laser beam is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$ which, in turn, determine the proper angle between the two DOEs, indicated by $\rho$.

In this embodiment of the laser beam producing system, lenses L1 and L2 are chosen such that the desired focus is achieved and the inherent astigmatism of the laser beam leaving the VLD is either adjusted or eliminated. Neither lens L1 nor L2 independently set the astigmatism nor the focus. Rather the combined set of lenses produce the combined result.

The (z) position of visible laser diode VLD is adjustable relative to the lens L1 during the parameter adjustment stage of the system assembly process, in order to adjust the divergence or convergence of the beam leaving lens L1 to produce a predetermined amount of astigmatism at a predetermined distance. The (x,y) position of visible laser diode VLD is adjustable relative to the lens L1 during the parameter adjustment stage of the system assembly process, in order to align the VLD to the optical axis of lens L1. Also, the position of lens L2 is adjustable along its optical axis between DOE D1 and DOE D2 during the alignment stage of the system assembly process in order to set the desired focus as well as the desired amount of astigmatism of the output laser beam.

Figure 2L:
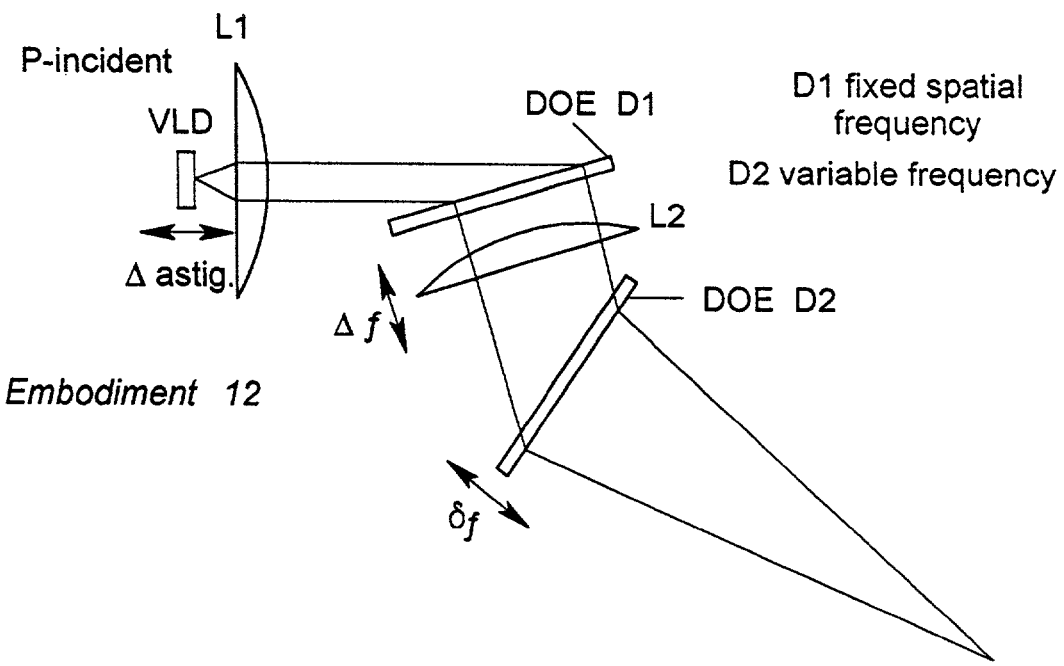
FIG. 2L is a geometrical optics model of the twelfth illustrative embodiment of the DOE-based laser beam producing subsystem according to the principles of the present invention.

Twelfth Illustrative System Embodiment of the Laser Beam Producing System of the Present Invention In FIG. 2L, the twelfth illustrative embodiment of the laser beam producing system hereof ("System Embodiment No. 12") comprises: a laser beam source, such as a visible laser diode (VLD), for producing a laser beam from its junction; a collimating lens (L1), realizable as a refractive lens, a HOE, CGH or other DOE, a grin lens, zone plate(s), etc., for collimating the laser beam as it is transmitted through collimating lens L1 and through the system in a P-incident manner; a fixed spatial-frequency diffractive optical element (DOE), i.e. diffraction grating, indicated by D1; a variable spatial-frequency diffractive optical element (DOE) indicated by D2, adjustably translatable relative to the principal plane of DOE D1 during the alignment stage of the system assembly process; and a focusing lens (L2), realizable as a refractive lens, a HOE, a CGH or other a DOE, a grin lens, zone plate(s) or the like, disposed between DOE D1 and DOE D2 and adjustably translatable along its optical axis during the parameter alignment stage of the system assembly process for focusing the output laser beam to some point in space. Collectively, the collimating lens (L1), the fixed spatial-frequency DOE (D1) and the variable spatial-frequency DOE (D2) comprise a laser beam-modifying (sub)system in accordance with the present invention. Each of the DOEs in this system embodiment can be realized as a transmission-type HOE, a CGH, a surface-relief hologram, or other diffractive optical element.

In this illustrative embodiment of the optical system of the present invention, focusing lens L2 is disposed between DOE D1 and DOE D2 in order to provide additional optical power to the exiting laser beam. This optical arrangement would be useful in applications employing delta-focusing. This delta-focusing yields the benefits of reduced spot aberrations due to the optical power of DOE D2 as well as increased modularity of the system.

In this embodiment, the total beam-shaping factor ($M=M_1M_2$) for the laser beam modifying subsystem is greater than unity (1), that is M1*M2>1, and thus the laser beam leaving the collimating lens (L1) is expanded in one dimension. There will be many cases in which the beam shaping factor is greater than unity, including, for example: where M1>1 and M2>1; where M1=1 and M2>1; and where M1>1 and M2=1. In the Beam Expansion Mode, one of the cross-sectional dimensions of the laser beam from the VLD is expanded at the output of the system to a predetermined dimension. Typically, although not necessarily, the narrower cross-sectional dimension of the laser beam will be the one that is expanded.

In the laser beam producing system shown in FIG. 2L, beam aspect-ratio control is achieved and dispersion in the output laser beam is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$ which, in turn, determine the proper angle between the two DOEs, indicated by $\rho$.

In this embodiment of the laser beam producing system, the inherent astigmatism of the laser beam leaving the VLD can be either adjusted or eliminated by choosing proper divergence or convergence of the laser beam leaving the collimating lens L1. The (x,y) position of visible laser diode VLD is adjustable relative to the lens L1 during the parameter adjustment stage of the system assembly process, in order to adjust the divergence or convergence of the beam leaving lens L1. The (z) position of visible laser diode VLD is adjustable relative to the lens L1 during the parameter adjustment stage of the system assembly process, in order to align the VLD to the optical axis of lens L1. Also, the position of lens L2 is adjustable along its optical axis between DOE D1 and DOE D2 during the alignment stage of the system assembly process in order to set the average focal length of the output laser beam to the desired value for use by the delta-focusing system.

Figure 2M:
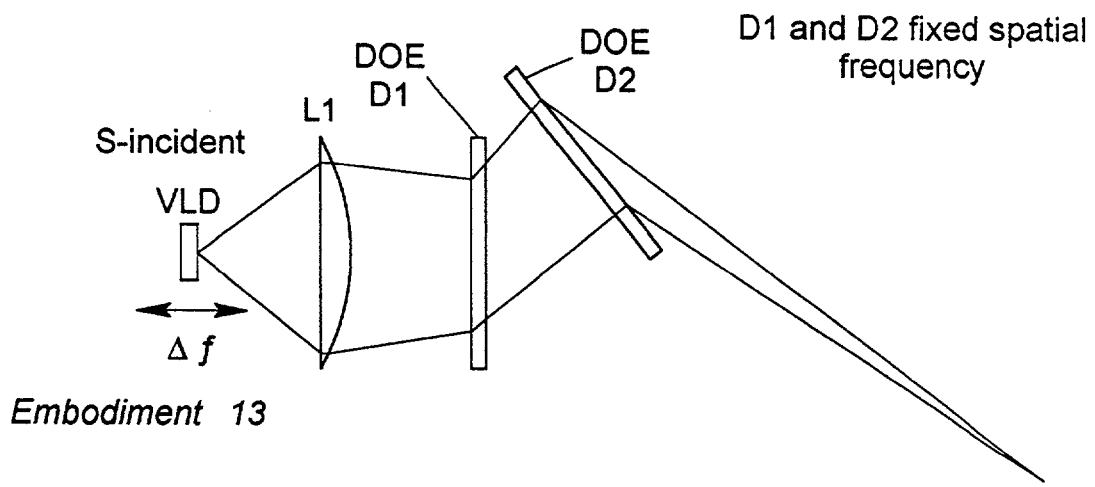
FIG. 2M is a geometrical optics model of the thirteenth illustrative embodiment of the DOE-based laser beam producing subsystem according to the principles of the present invention.

Thirteenth Illustrative System Embodiment of the Laser Beam Producing System of the Present Invention In FIG. 2M, the thirteenth illustrative embodiment of the laser beam producing system hereof ("System Embodiment No. 13") comprises: a laser beam source, such as a visible laser diode (VLD), for producing a laser beam from its junction; an imaging lens (L1), realizable as a refractive lens, a HOE or other DOE, a grin lens, zone plate(s), etc., for imaging the laser source to the focal distance as it is transmitted through imaging lens L1 and through the system in a S-incident manner; a fixed spatial-frequency diffractive optical element (DOE), i.e. diffraction grating, indicated by D1; and a fixed spatial-frequency diffractive optical element (DOE) indicated by D2. Collectively, the collimating lens L1, the fixed spatial-frequency DOE D1 and the fixed spatial-frequency DOE D2 comprise a laser beam-modifying (sub)system in accordance with the present invention. Each of the DOEs in this system embodiment can be realized as a transmission-type HOE, a CGH, a surface-relief hologram, or other diffractive optical element.

In this embodiment, the total beam-shaping factor ($M=M_1M_2$) for the laser beam modifying subsystem is less than unity (1), that is M1*M2<1, and thus the laser beam leaving the collimating lens (L1) is compressed in one dimension. Notably, there will be many cases in which the beam shaping factor is less than unity, including, for example: where M1<1 and M2<1; where M1=1 and M2<1; and where M1<1 and M2=1. In the Beam Compression Mode, one of the cross-sectional dimensions of the laser beam from the VLD is compressed at the output of the system to a predetermined dimension. Typically, although not necessarily, the wider cross-sectional dimension of the laser beam will be the one that is compressed.

In the laser beam producing system shown in FIG. 2M, beam aspect-ratio control is achieved and dispersion in the output laser beam is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs previously defined hereinabove.

Notably, in this embodiment of the laser beam producing system, the convergence of the beam leaving focusing lens L1 need not be adjusted to provide the proper image distance to the focal point of the system, and therefore it can be used to control or eliminate the astigmatism that is inherent in the laser beam leaving the VLD. This embodiment of the laser beam producing system will be useful in applications where astigmatism inherent in the laser beam leaving the VLD must be corrected or eliminated, and there is no need to focus the output laser beam to any particular focal distance using the optics associated with the laser beam producing system.

Figure 2N:
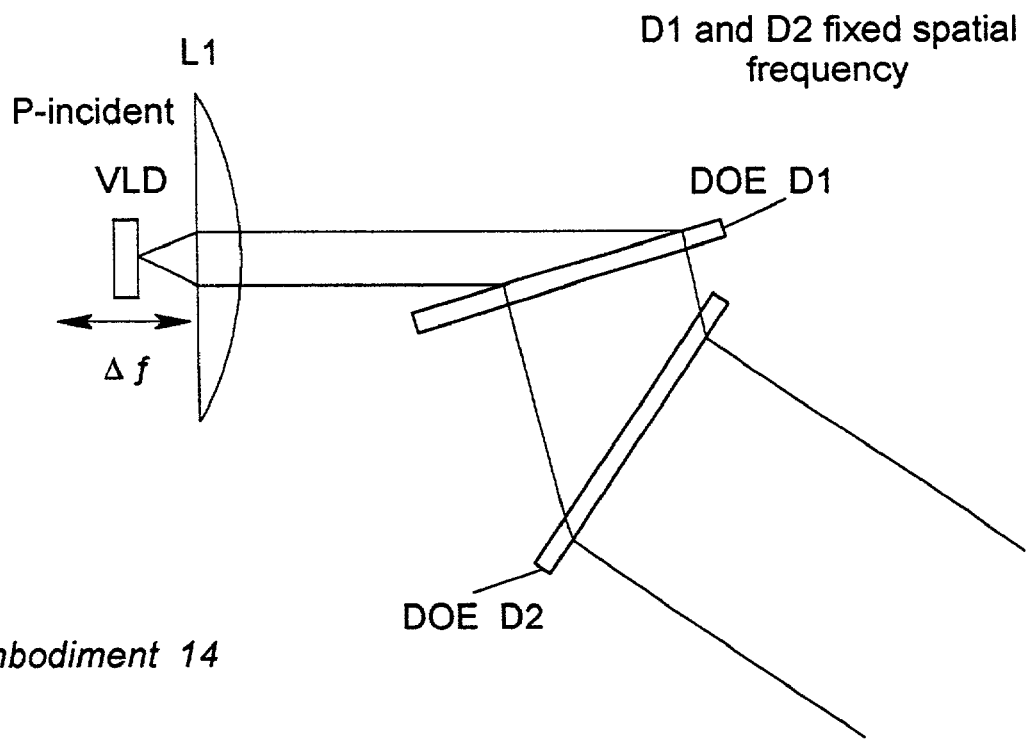
FIG. 2N is a geometrical optics model of the fourteenth illustrative embodiment of the DOE-based laser beam producing subsystem according to the principles of the present invention.

Fourteenth Illustrative System Embodiment of the Laser Beam Producing System of the Present Invention In FIG. 2N, the fourteenth illustrative embodiment of the laser beam producing system hereof ("System Embodiment No. 14") comprises: a laser beam source, such as a visible laser diode (VLD), for producing a laser beam from its junction; a focusing (non-collimating) lens (L1), realizable as a refractive lens, a HOE, CGH or other DOE, a grin lens, zone plate(s), etc., for focusing the laser beam as it is transmitted through focusing lens L1 and through the system in a P-incident manner; a fixed spatial-frequency diffractive optical element (DOE), i.e. diffraction grating, indicated by D1; and a fixed spatial-frequency diffractive optical element (DOE) indicated by D2. Collectively, the focusing lens L1, the fixed spatial-frequency DOE D1 and the fixed spatial-frequency DOE D2 comprise a laser beam-modifying subsystem in accordance with the present invention. Each of the DOEs in this system embodiment can be realized as a transmission-type HOE, a CGH, a surface-relief hologram, or other diffractive optical element.

In this embodiment, the total beam-shaping factor ($M=M_1M_2$) for the laser beam modifying subsystem is greater than unity (1), that is M1*M2>1, and thus the laser beam leaving the collimating lens (L1) is expanded in one dimension. There will be many cases in which the beam shaping factor is greater than unity, including, for example: where M1>1 and M2>1; where M1=1 and M2>1; and where M1>1 and M2=1. In the Beam Expansion Mode, one of the cross-sectional dimensions of the laser beam from the VLD is expanded at the output of the system to a predetermined dimension. Typically, although not necessarily, the narrower cross-sectional dimension of the laser beam will be the one that is expanded.

In the laser beam producing system shown in FIG. 2N, beam aspect-ratio control and dispersion in the output laser beam is eliminated (or minimized) for any given beam expansion ratio at each of the DOEs, by way of selecting the right combination of angles of incidence and diffraction for the two DOEs D1 and D2 indicated by $\theta_{i1}$, $\theta_{d1}$, $\theta_{i2}$ and $\theta_{d2}$, which, in turn, determine the proper angle between the two DOEs, indicated by $\rho$.

In System Embodiment No. 14 shown in FIG. 2N, the convergence of the beam leaving focusing lens L1 need not be adjusted to provide the proper image distance to the focal point of the system, and therefore it can be used to control or eliminate the astigmatism that is inherent in the laser beam leaving the VLD. This embodiment of the laser beam producing system will be useful in applications where astigmatism inherent in the laser beam leaving the VLD must be corrected or eliminated, and there is no need to focus the output laser beam to any particular focal distance using the optics associated with the laser beam producing system.

In each of the fourteen illustrative embodiments described hereinabove, it is preferred that optical elements L1 and L2 have axially symmetric optical properties (i.e. lenses L1 and L2 are stigmatic optical elements). In the preferred embodiments, where L1 and L2 are both refractive lenses, the lens surface profiles should be axially symmetric in order to allow for the use of both spheric and aspheric lenses. In most cases, the sub-system consisting of the VLD and lens L1, performs outside of the realm of paraxial optics; therefore lens L1 will typically be aspheric in order to minimize the spherical aberration common in non-paraxial systems. Also in most cases, the use of lens L2 typically satisfies the requirements of paraxial analysis; therefore, use of a spheric lens for this optical element is usually acceptable.

A major advantage of using an optical element with axial symmetry to realize lens L1 is that it is then be possible to use diffractive optics to modify (e.g. correct or eliminate) astigmatism in the output laser beam. Notably, if one were to realize lens L1 using an optical element not having axial symmetry, then diffractive elements (e.g. DOEs D1 and D2) could no longer be used to eliminate or correct astigmatism in the output laser beam, and that cylindrical or toroidal lenses would be required for astigmatism control or elimination. Notably, there are number of important advantages obtained when using diffractive optics (rather than astigmatic refractive optics) to correct or eliminate astigmatism in the output laser beam astigmatism, namely: (1) simplification of the manufacture of the refractive optics (L1) as well as the diffractive optics (D1 and D2); (2) reduction in the cost of optical elements; and (3) simplification of parameter alignment during the assembly process.

Methods for Designing Laser Beam Producing Systems of the Illustrative System Embodiments of the Present Invention where Focus Control is Desired But Neither Astigmatism Correction Nor Delta-Focusing are Required: System Embodiments Nos. (1) & (5)

System Embodiment Nos. (1) and (5) of the laser beam producing system of the present invention can be designed using the below-described design methodology, wherein the steps thereof are set forth in FIGS. 3A1 through 3A3.

As indicated at Block A in FIG. 3A, the first step in the design method involves establishing end-user requirements for the laser beam producing module under design. In bar code symbol scanning applications, where the laser beam output from the system under design is to be used to scan the elements of bar code symbols, such end-user requirements will typically include, for example, the working distance from the scanner, the depth of field of the scanning system, the type of bar code symbols that the laser beam must read, the minimal width of the elements in the bar code symbols, etc.

As indicated at Block B, the second step in the design method involves determining the necessary spot-size, aspect-ratio and waist dimensions of the output laser beam in order to scan the desired bar code determined during step (1) described at Block A.

As indicated at Block C, the third step in the design method involves determining the module focal distance, $f_{module}$, that will provide the desired depth of field for the end-user scanning system at the desired working distance.

As indicated at Block D in FIG. 3A1, the fourth step in the design method involves using a Gaussian beam propagation model to determine the required beam size and aspect-ratio leaving the laser beam producing system. Notably, the steps at Blocks B, C and D are somewhat interconnected inasmuch as the spot-size, depth-of-field, and focal distance of the output laser beam, are all aspects of Gaussian beam propagation. The values of each of these parameters have an effect on the other parameters. Therefore, it is understood that the order in which such parameters are determined, may be different from embodiment to embodiment.

As indicated at Block E in FIG. 3A2, the fifth step in the design method involves choosing an acceptable laser source (e.g. a VLD). In an ideal world, criteria for acceptability may include limits on beam divergence and amount of astigmatism, as well as aspect ratio, wavelength, and bandwidth. However, in practice, such criteria will be satisfied by ensuring that the aspect ratio of the beam leaving the VLD is not too large for compression by the DOE-based subsystem.

As indicated at Block F in FIG. 3A2, the sixth step in the design method involves determining an appropriate value for the beam-shaping factors of DOEs D1 and D2 which ensures that the aspect-ratio of the beam entering the laser beam-modifying subsystem (D1 and D2) from the VLD is sufficiently modified so that output laser beam has the desired aspect ratio determined at Block D described above. Notably, the beam-shaping factor M (also called the expansion ratio), defined as $M=M_1M_2$, provides beam compression within the laser beam modifying subsystem when M<1, and provides beam expansion within the laser beam modifying subsystem when M>1.

As indicated at Block G in FIG. 3A2, the seventh step in the design method involves using the beam-shaping factor determined at Block F, to determine the design angles, $\theta_{i1}$, $\theta_{d1}$, $\theta_{i2}$ and $\theta_{d2}$ (expressed at the reconstruction/design wavelength, $\lambda_R$) for the two DOEs D1 and D2, which provides an optical subsystem wherein the laser beam output from the second DOE D2 thereof has (1) effectively zero net beam dispersion, and (2) the desired aspect-ratio determined at Block B in FIG. 3A1. Notably, this step of the design method involves designing the dual-DOE laser beam modifying subsystem using either of the optical design procedures described in detail hereinbelow, As indicated at Block H in FIG. 3A3, the eighth step in the design method involves determining the theoretical distance from the VLD to the first lens element L1 that produces an output laser beam having the desired beam size determined at Block D. Notably, this computation is carried out assuming a VLD beam having an elliptical spot aligned along the optical axis of lens L1.

As indicated at Block I in FIG. 3A3, the ninth step in the design method involves determining the focal length of lens element L1 that produces an output laser beam having the desired focus determined at Block C in FIG. 3A1.

Methods for Designing Laser Beam Producing Systems of the Illustrative System Embodiments of the Present Invention where Focus Control and Astigmatism Correction are Desired and Delta-Focusing is not Required: System Embodiments Nos. (2), (3), (6), (7), (9), & (11)

System Embodiment Nos. (2), (3), (6), (7), (9) and (11) of the laser beam producing system of the present invention can be designed using the below-described design methodology, wherein the steps thereof are set forth in FIGS. 3B1 through 3B2.

As indicated at Block A in FIG. 3B1, the first step in the design method involves establishing end-user requirements for the laser beam producing module under design. In bar code symbol scanning applications, where the laser beam output from the system under design is to be used to scan the elements of bar code symbols, such end-user requirement will typically include, for example, the working distance from the scanning system, the depth of field of the scanning system, the type of bar code symbols that the laser beam must read, the minimal width of the elements in the bar code symbols, etc.

As indicated at Block B, the second step in the design method involves determining the necessary spot-size, aspect-ratio and waist dimensions of the output laser beam in order to scan the desired bar code determined during step (1) described in Block A.

As indicated at Block C, the third step in the design method involves determining the module focal distance, $f_{module}$, that will provide the desired depth of field for the end-user scanning system.

As indicated at Block D in FIG. 3B1, the fourth step in the design method involves using a Gaussian beam propagation model to determine the required beam-size and aspect-ratio leaving the laser beam producing system. Notably, the steps at Blocks B, C and D are somewhat interconnected inasmuch as the beam spot-size, depth-of-field, and focal distance are all aspects of Gaussian beam propagation. The values of each of these parameters have an effect on the other parameters. Therefore, it is understood that the order in which such parameters are determined may be different, from embodiment to embodiment.

As indicated at Block E in FIG. 3B2, the fifth step in the design method involves choosing an acceptable laser source (e.g. a VLD). Criteria for acceptability may include limits on beam divergence and amount of astigmatism, as well as aspect ratio, wavelength, and bandwidth.

As indicated at Block F in FIG. 3B2, the sixth step in the design method involves determining an appropriate value for the beam-shaping factor of DOEs D1 and D2 which ensures that the aspect-ratio of the beam entering the laser beam-modifying subsystem (D1 and D2) from the VLD is sufficiently modified so that output laser beam has the desired aspect-ratio determined at Block D described above. Notably, the beam-shaping factor M (also called the expansion ratio), defined as $M=M_1 M_2$, provides beam compression within the laser beam modifying subsystem when $M<1$, and provides beam expansion within the laser beam modifying subsystem when $M>1$.

As indicated at Block G in FIG. 3B2, the seventh step in the design method involves using the beam-shaping factor determined at Block F, to determine the design angles, $\theta_{i1}$, $\theta_{d1}$, $\theta_{i2}$ and $\theta_{d2}$ (expressed at the reconstruction wavelength, $\lambda_R$) for the two DOEs D1 and D2, which provides an optical subsystem wherein the laser beam output from the second DOE D2 thereof has (1) effectively zero net beam dispersion, and (2) the desired aspect-ratio determined at Block B in FIG. 3A1. Notably, this step of the design method involves designing the dual-DOE laser beam modifying subsystem using either of the optical design procedures described in detail hereinbelow.

As indicated at Block H in FIG. 3B3, the eighth step in the design method involves determining the distance from the VLD to the first lens element L1 that produces an output laser beam having the desired beam size determined at Block D. Notably, this calculation is carried out assuming that the elliptical beam produced from the VLD 4 is aligned along the optical axis of lens L1.

The remaining design procedure diverges for the present embodiments ((2), (3), (6), (7), (9) and (11)); therefore, the remaining steps will be handled below on a by embodiment basis.

System Embodiment Nos. (2) & (6):

For System Embodiment Nos. (2) and (6), the ninth step in the design method involves determining the focal length of lens L1 so that, when the correct amount of separation exists between the VLD and lens L1, the resulting convergence/divergence of the laser beam will eliminate astigmatism upon passing through both DOEs D1 and D2.

The tenth step in the design method for embodiments (2) and (6) involves determining the focal length of lens L2 in order to focus the beam at the desired focal point determined at Block C in FIG. 3B1.

System Embodiment Nos. (3) & (7):

For System Embodiment Nos. (3) and (7), the ninth step in the design method involves determining the focal length of lens L1 so that, when the correct amount of separation exists between the VLD and lens L1, the resulting convergence/divergence of the laser beam will eliminate astigmatism upon passing through DOE D1 only.

The tenth step in the design method for embodiments (3) and (7) involves determining the design parameters of DOE D2 in order to focus the beam at the desired focal point determined at Block C in FIG. 3B 1. In these embodiments, DOE D2 is a stigmatic element.

System Embodiment Nos. (9) & (11):

For System Embodiment Nos. (9) and (11), the ninth step in the design method involves determining the focal length of lens L1 so that, when the correct amount of separation exists between the VLD and lens L1, the resulting convergence/divergence of the laser beam will produce a predetermined amount of astigmatism upon passing through DOE D1 only.

The tenth step in the design method for embodiments (9) and (11) involves determining the focal length of lens L2 in order to focus the beam at the desired focal point determined at Block C in FIG. 3B1. The known astigmatic beam entering lens L2 will be focused through DOE D2 resulting in a focused, stigmatic spot.

Methods for Designing Laser Beam Producing Systems of the Illustrative System Embodiments of the Present Invention Where Focus Control, Astigmatism Correction and Delta-Focusing in Output Laser Beam are Desired: System Embodiments Nos. (4). (8). (10) (12)

System Embodiment Nos. (4), (8), (10) and (12) of the laser beam producing system hereof can be designed using the below-described design methodology, wherein the steps thereof are set forth in FIGS. 3C1 through 3C.

As indicated at Block A in FIG. 3C1, the first step in the design method involves establishing end-user requirements for the laser beam producing module under design. In bar code symbol scanning applications, where the laser beam output from the system under design is to be used to scan the elements of bar code symbols, such end-user requirement will typically include, for example, the working distance from the scanning system, the depth of field of the scanning system, the type of bar code symbols that the laser beam must read, the minimal width of the elements in the bar code symbols, etc.

As indicated at Block B, the second step in the design method involves determining the necessary spot-size, aspect-ratio and waist dimensions of the output laser beam in order to scan the desired bar code determined during step (1) described above.

As indicated at Block C, the third step in the design method involves determining the module focal distance, $f_{module}$, that will provide the desired depth of field for the end-user scanning system at the desired working distance.

As indicated at Block D in FIG. 3C1, the fourth step in the design method involves using a Gaussian beam propagation model to determine the required beam-size and aspect-ratio leaving the laser beam producing system. Notably, the steps at Blocks B, C and D are somewhat interconnected inasmuch as the beam spot-size, depth-of-field, and focal distance are all aspects of Gaussian beam propagation. The values of each of these parameters have an effect on the other parameters. Therefore, it is understood that, from embodiment to embodiment, the order of determination of such parameters may be different.

As indicated at Block E in FIG. 3C2, the fifth step in the design method involves choosing an acceptable laser source (e.g. a VLD). Criteria for acceptability may include limits on beam divergence and amount of astigmatism, as well as aspect ratio, wavelength, and bandwidth.

As indicated at Block F in FIG. 3C2, the sixth step in the design method involves determining an appropriate value for the beam-shaping factors of DOEs D1 and D2 which ensures that the aspect-ratio of the beam entering the laser beam-modifying subsystem (D1 and D2) from the VLD is sufficiently modified so that output laser beam has the desired aspect-ratio determined at Block D described above. Notably, the beam-shaping factor M (also called the expansion ratio), defined as $M=M_1M_2$, provides beam compression within the laser beam modifying subsystem when M<1, and provides beam expansion within the laser beam modifying subsystem when M>1.

As indicated at Block G in FIG. 3C2, the seventh step in the design method involves using the Beam Shaping Factor determined at Block F, to determine the design angles, $\theta_{i1}$, $\theta_{d1}$, $\theta_{i2}$ and $\theta_{d2}$, (expressed at the reconstruction wavelength, $\lambda_R$) for the two DOEs D1 and D2, which provides an optical subsystem wherein the laser beam output from the second DOE D2 thereof has (1) effectively zero net beam dispersion, and (2) the desired aspect-ratio determined at Block B in FIG. 3A1. Notably, this step of the design method involves designing the dual-HOE laser beam modifying subsystem using either of the optical design procedures described in detail hereinbelow.

As indicated at Block H in FIG. 3C3, the eighth step in the design method involves determining the distance from the VLD to the first lens element L1 that produces an output laser beam having the desired beam size determined at Block D.

As indicated in Block I in FIG. 3C2, the ninth step in the design method involves determining the focal length of lens L1 so that, when the correct amount of separation exists between the VLD and lens L1, the resulting convergence/divergence of the laser beam will eliminate astigmatism upon passing through DOE D1 only.

As indicated at Block J in FIG. 3C3, the tenth step of the design method is to assume DOE D2 to be a stigmatic optical element with no optical power (it is not, in general, for System Embodiment Nos. 4, 8, 10, 12) and then determine the focal length of the final lens element L2 in the system such that the desired "average" focal distance of the output laser beam is achieved.

As indicated at Block K in FIG. 3C3, the eleventh step of the design method involves determining the design parameters of HOE D2 that produce the desired delta-focus of the laser beam through the lens L2.

Methods For Designing Laser Beam Producing Systems Of The Illustrative System Embodiments Of The Present Invention Where Astigmatism Correction Is Desired But Neither Focus Control Nor Delta-Focusing Are Required: System Embodiments Nos. (13) & (14)

System Embodiment Nos. (13) and (14) of the laser beam producing system of the present invention can be designed using the below-described design methodology, wherein the steps thereof are set forth in FIGS. 3D1 through 3D3.

As indicated at Block A in FIG. 3D1, the first step in the design method involves establishing end-user requirements for the laser beam producing module under design. These embodiments are similar in structure to System Embodiment Nos. (1) and (5). However, since the design goal here is different, the use will be different as will the end-user requirements. For the sake of this discussion, the chosen requirements will be a set final aspect ratio and beam spot size. Notably for this discussion, the beam-shaping that occurs will necessarily be aspect-ratio reduction. It is understood that one skilled in the art could adjust this design procedure to meet a different combination of end-user requirements.

As indicated at Block B in FIG. 3D1, the second step in the design method involves using a Gaussian beam propagation model to determine the required beam aspect-ratio leaving the laser beam producing system in order to produce the specified aspect-ratio at focus.

As indicated at Block C in FIG. 3D1, the third step in the design method involves choosing an acceptable laser source (e.g. a VLD). Criteria for acceptability may include limits on beam divergence and amount of astigmatism, as well as aspect ratio, wavelength, and bandwidth.

As indicated at Block D in FIG. 3D1, the fourth step in the design method involves determining an appropriate value for the beam-shaping factors of DOEs D1 and D2 which ensures that the aspect-ratio of the beam entering the laser beam-modifying subsystem (D1 and D2) from the VLD is sufficiently modified so that output laser beam has the desired aspect ratio determined at Block B described above. Notably, the beam-shaping factor M (also called the expansion ratio), defined as $M=M_1M_2$, provides beam compression within the laser beam modifying subsystem when M<1, and provides beam expansion within the laser beam modifying subsystem when M>1.

As indicated at Block E in FIG. 3D2, the fifth step in the design method involves using the beam-shaping factor determined at Block D, to determine the design angles, $\theta_{i1}$, $\theta_{d1}$, $\theta_{i2}$ and $\theta_{d2}$, (expressed at the reconstruction wavelength, $\lambda_R$) for the two DOEs D1 and D2, which provides an optical subsystem wherein the laser beam output from the second DOE D2 thereof has (1) effectively zero net beam dispersion, and (2) the desired aspect-ratio determined at Block B. Notably, this step of the design method involves designing the dual-DOE laser beam modifying subsystem using either of the optical design procedures described in detail hereinbelow.

As indicated at Block F in FIG. 3D2, the sixth step in the design method involves determining the convergence of the beam leaving lens L1 that will adjust or eliminate the astigmatism produced by the VLD. Specifically for this discussion it is known that the beam will converge. Once the convergence is known, the focus location can be calculated.

As indicated at Block G in FIG. 3D2, the seventh step in the design method involves using a Gaussian beam propagation model to determine the required beam spot size leaving the laser beam producing system in order to produce the focused spot size determined at Block A.

As indicated at Block H in FIG. 3D2, the eighth step in the design method involves determining the distance from the VLD to the first lens element L1 that produces an output laser beam having the desired beam size determined at Block G.

As indicated at Block I in FIG. 3D3, the ninth step in the design method involves determining the focal length of lens element L1 that produces a beam with the convergence determined in Block F.

Figure 3E:
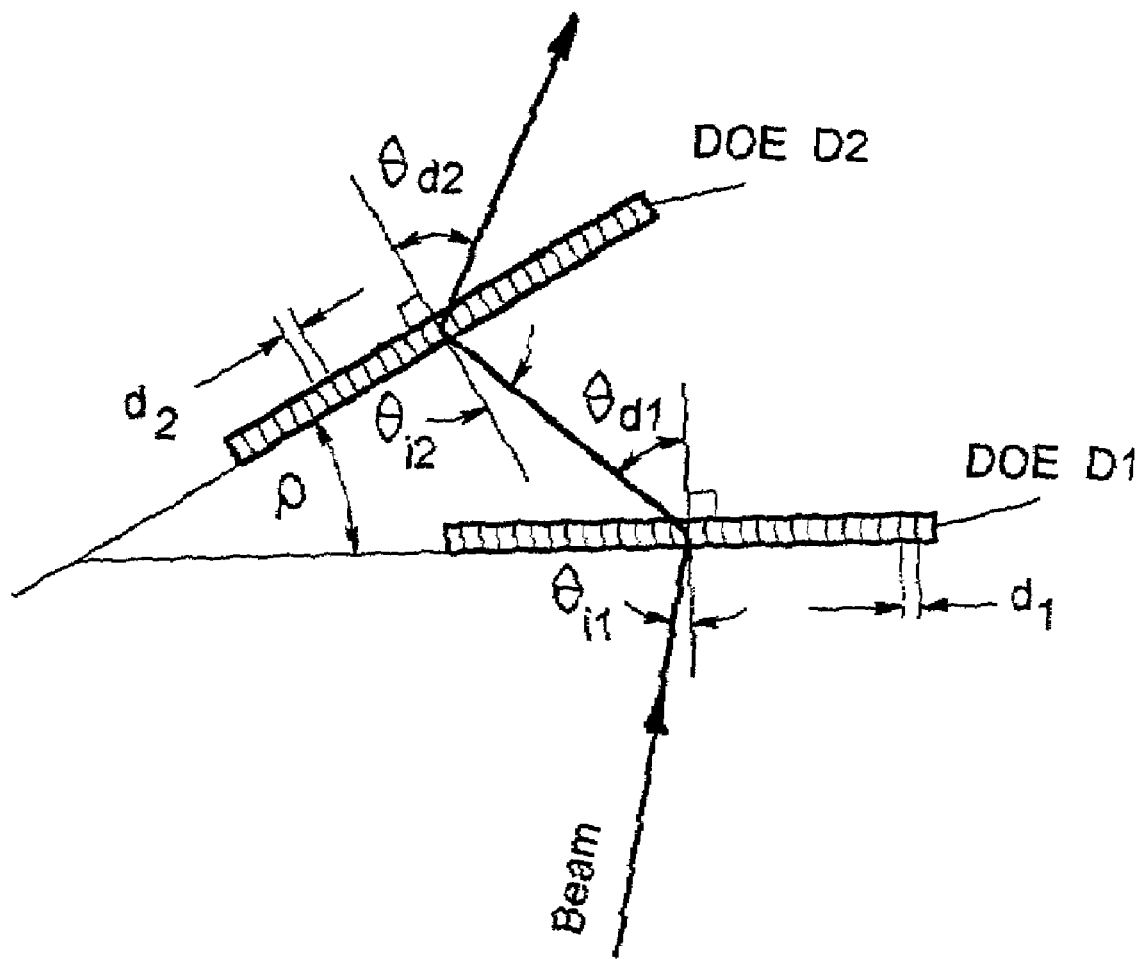
FIG. 3E is a "central-ray" type geometrical optics model of the DOE-based laser beam modifying subsystem employed within each of the illustrative embodiments of the laser beam producing systems of the present invention.

A First Procedure for Determining the Design Angles for the Diffractive Optical Elements within the Laser Beam Modifying Subassembly of the System of the Present Invention In order to determine the design angles for DOEs D1 and D2 within the dual-DOE laser beam modifying subsystems hereof, it is necessary to construct a geometric optics model thereof. For the sake of simplification, each DOE in each subsystem is represented using a "central-ray" model, as shown in FIG. 3E. Using this reasonable modeling assumption, DOE D1 can be represented as a first fixed spatial-frequency hologram having fringe-spacing d1, whereas DOE D2 can be represented as a second fixed spatial-frequency hologram having fringe-spacing d2. This central-ray model provides a perfect description for the central ray of the laser beam, in all cases herein considered, but less than a perfect description for non-collimated rays (i.e. rays not parallel to the center ray of the laser beam). If the beam passing through DOEs D1 and D2 has a relatively large f/#, then the effect of the non-collimated rays will be negligible.

In defining the laser beam modifying (optics) subsystem, the angle of incidence of the laser beam from lens L1 onto the front surface of first fixed-spatial-frequency DOE (D1) is specified by $\theta_{i1}$, whereas the angle of diffraction therefrom is specified by $\theta_{d1}$, as illustrated in FIG. 3E. The angle of incidence of the laser beam from the first fixed spatial-frequency DOE D1 onto the front surface of second fixed spatial-frequency DOE D2 is specified by $\theta_{i2}$, whereas the angle of diffraction therefrom is specified by $\theta_{d2}$. These four parameters $\theta_{i1}$, $\theta_{d1}$, $\theta_{i2}$ and $\theta_{d2}$, completely define the dual-DOE subsystem hereof, and thus provides four degrees of freedom within the geometrical optics model thereof. Applying the well known "diffraction grating" equation to the first and second DOEs, D1 and D2, respectively, the following two system equations are obtained:

$$\frac{\lambda_R}{d_1} = \sin\theta_{i1} + \sin\theta_{d1} \quad \text{(Eq. 1)}$$

$$\frac{\lambda_R}{d_2} = \sin\theta_{i2} + \sin\theta_{d2} \quad \text{(Eq. 2)}$$

wherein the parameter $\lambda_R$ is the design (i.e. reconstruction) wavelength of the laser beam used during reconstruction, and parameters $d_1$ and $d_2$ are the surface spacing of the fringes within the first and second DOEs D1 and D2, respectively.

Using simple geometry, the following expression is obtained:

$$\rho = \theta_{d1} - \theta_{i2} \quad \text{(Eq. 3)}$$

wherein $\rho$, the DOE tilt angle, is the angle formed between the surfaces of the two DOEs D1 and D2 within the laser beam modifying subsystem under design. Notably, parameter $\rho$ has been previously defined in the geometrical optics model used to design the laser beam production modules disclosed in Applicant's copending U.S. patent application Ser. No. 08/573,949 filed Dec. 18, 1995, incorporated herein by reference.

The above-described geometrical optics model will be used to determine the optimum configuration of the dual-DOE subsystem which produces an output laser beam having minimum beam dispersion and prescribed beam aspect-ratio. Notably, correction for laser beam astigmatism is not addressed in this modeling procedure; however, this does not preclude the ability to control astigmatism when this procedure is used. The dual-DOE subsystem contains four degrees of design freedom, wherein two of those degrees of freedom are removed by requiring minimum dispersion and a specific beam expansion. This leaves two additional degrees of freedom in the design process to meet some additional design goals.

Specifying the Design Criteria for the Laser Beam Modifying Subsystem of the Present Invention In the illustrative embodiments, the dual-DOE laser beam modifying subsystem must satisfy two design constraints, namely: (1) for an input laser beam having a first specified beam aspect-ratio, produce an output laser beam having a second specified beam aspect-ratio; and (2) produce an output laser beam, wherein the dispersion characteristics or "dispersion" thereof (defined by $d\theta_{d2}/d\lambda$) are minimized over the spectral bandwidth of the VLD beam.

The first design constraint is achieved by compressing or expanding one dimension of the laser beam incident upon the first DOE D1. Thus, this design constraint is best described as the beam-shaping factor (e.g. expansion ratio), M, which is equal to the product of the individual expansion ratios for DOEs D1 and D2, designated by $M_1$ and $M_2$, respectively, wherein $M_1 = D_{output1}/D_{input1}$ and $M_2 = D_{output2}/D_{input2}$, and D represents dimension of the beam in the compression/expansion direction (i.e. common plane of incidence of DOEs D1 and D2). In order to meet this design constraint, the following equations must be satisfied:

$$M_1 = \frac{\cos\theta_{d1}}{\cos\theta_{i1}} \quad \text{(Eq. 4)}$$

$$M_2 = \frac{\cos\theta_{d2}}{\cos\theta_{i2}} \quad \text{(Eq. 5)}$$

The second constraint (i.e. relating to minimizing dispersion) is achieved by satisfying the following equation:

$$d_2 \cos\theta_{i2} = d_1 \cos\theta_{d1} \quad \text{(Eq. 6)}$$

wherein parameters $d_1$ and $d_2$ are the surface spacing of the fringes within the first and second DOEs D1 and D2, respectively.

A First Procedure for Designing the Dual-DOE Subsystem so that the Prespecified Design Constraints are Satisfied An optimal design for the dual-DOE laser beam modifying subsystem hereof, which satisfies the above-specified design constraints, can be determined using the following procedure in conjunction with the geometrical optics model described above.

As indicated at Block A in FIG. 3F1, the first step of the design procedure involves choosing values for the beam compression/expansion ratios $M_1$ and $M_2$ such that the total desired Beam Shaping Factor M satisfies the expression $M=M_1M_2$. Also, at this stage of the design method, the design (i.e. reconstruction) wavelength $\lambda_R$, and the angle of incidence $\theta_{i1}$, are chosen by the DOE-subsystem designer.

As indicated at Block B in FIG. 3F1, the second step of the design procedure involves solving for the angle of diffraction $\theta_{d1}$, at DOE D1 using Equation No. (4) set forth above.

As indicated at Block C in FIG. 3F1, the third step of the design procedure involves solving for the fringe structure (surface) spacing $d_1$ of DOE D1, using Equation No. (1) set forth above.

As indicated at Block D in FIG. 3F1, the fourth step of the design procedure involves solving for the angle of incidence $\theta_{i2}$ at DOE D2, using the following equation:

$$\theta_{i2} = \arctan\left[\frac{1}{2}\left(M_2^2 K - K + \frac{1}{K}\right)\right] \quad \text{(Eq. 7)}$$

where $$K = \frac{d_1 \cos\theta_{d1}}{\lambda}$$

As indicated at Block E in FIG. 3F1, the fifth step of the design procedure involves solving for the DOE tilt angle ρ, using Equation No. (3).

As indicated at Block F in FIG. 3F2, the sixth step of the design procedure involves solving for the angle of diffraction $\theta_{d2}$ at DOE D2, using Equation No. (5).

As indicated at Block G in FIG. 3F2, the seventh step of the design procedure involves solving for the fringe surface spacing $d_2$ within DOE D2, using Equation No. (2).

The above described parameters specify the design parameters for the dual-DOE subsystem at the reconstruction wavelength $\lambda_R$ which typically be specified by the characteristic wavelength of the VLD used to realize the laser beam producing system under design.

A Second Procedure for Determining the Design Angles for the Diffractive Optical Elements within the Laser Beam Modifying Subassembly of the System of the Present Invention According to the second design procedure, the two equations for (1) zero beam dispersion and (2) the desired beam aspect-ratio are solved and then graphed (i.e. plotted) to determine the intersection of the two functions which yields the design point at which both design requirements are simultaneously satisfied. Typically, a few iterations of the solutions of the equations will be required to determine the design point to an acceptable level of precision. This procedure has been described in detail in Applicant's copending application Ser. No. 08/573,949, incorporated herein by reference.

Notably, the graphical approach described hereinabove provides additional information about the residual dispersion that will exist when the wavelength of the VLD laser beam differs from the design wavelength. The graphical approach also provides information regarding the rate of change of dispersion as a function of laser beam wavelength, which is useful in particular applications. Such information can also be obtained from the model employed in the First Procedure described above using Equation (8) which will be described in greater detail hereinafter.

Considerations when Designing the DOE-Based Subsystem of the Present Invention

When designing a DOE-based laser beam modifying subsystem hereof using either of the design procedures set forth above, the following factors should be considered.

First, it is desirable to select angles of incidence and diffraction that are not too large or too different in magnitude. This will make the construction of the DOEs simpler. This is an example of a supplementary goal that can be met by exercising the aforementioned unused degrees of freedom in the laser beam modifying subsystem design. Second, it is desirable to have the angular separation between the incident beam at DOE D1 and the diffracted beam at DOE D2 greater than zero so as to avoid interference between the zero-order beam from DOE D1 and the diffracted beam from DOE D2. As this may be difficult to do, it may be necessary to provide a blocking plate or surface between the two DOEs as shown in illustrative embodiments of the present invention in FIGS. 6C, 10C and 11C. Notably, in such illustrative embodiments, the blocking plate is provided as an integral part of the module housing.

Considerations on Aspect-Ratio Control and Beam Dispersion Minimization/Elimination Provided that the desired parameters are reasonable, the system and assembly methods of the present invention enable the construction of optical systems capable of producing output laser beams having (1) a desired beam aspect-ratio and (2) zero or minimum beam dispersion. These design objectives can be accomplished over a fairly wide range of beam aspect-ratios, angles of incidence and diffraction, and angles between the two DOES. For all of the system embodiments herein, beam dispersion correction is perfect only for the center ray in the system. However, if the angle of the cone of rays passing through the laser beam modifying subsystem is relatively small, then beam dispersion correction, while not perfect, will be acceptable in many applications. In bar code scanning applications where, for example, the f-number of the focusing cone of light rays is generally on the order of 200 or more (so that the full angle subtended by the cone of light rays (i.e. the full cone angle) is less than 0.3 degrees), beam dispersion correction will be more than adequate for all rays within the light cone incident on the DOEs D1 and D2.

Considerations on Astigmatism Correction

When proceeding to eliminate astigmatism in the output laser beam from the laser beam producing module, the resulting pair of designed DOEs does not change in any way. In accordance with the principles of the present invention, astigmatism correction is accomplished by adjusting the separation between the VLD and the first lens L1 during the alignment stage of the system assembly process of the present invention. The amount of adjustment is dependent on the fixed parameters of the DOE pair (e.g. diffraction angles and angle between DOEs D1 and D2) and the beam characteristics of each VLD used in the construction of each laser beam producing system.

Notably, it is possible to specifically design the laser beam modifying subsystem to eliminate a specific amount of astigmatism for a given desired focus as accomplished, for example, in System Embodiment Nos. (13) and (14). When designing such systems, the beam-shaping factor, M, can be specifically chosen to eliminate astigmatism. In all of the other system embodiments disclosed herein the beam shaping factor M is used to control aspect-ratio. However, when designing a system to eliminate astigmatism, it is understood that aspect-ratio control will be sacrificed in order to reduce astigmatism. The specific system embodiments disclosed herein can be modified using such teachings to provide numerous other types of system designs in accordance with the principle of the present invention.

The inherent astigmatism of the laser beam produced from the VLD is modified or eliminated by adjusting the convergence or divergence of the beam incident on the dual-DOE laser beam-modifying subsystem hereof. If the laser beam-modifying subsystem is used to expand the narrower dimension of the VLD beam or to compress the wider dimension of the VLD beam (i.e. aspect-ratio reduction), then the astigmatism is minimized by using a converging beam incident on the laser beam-modifying subsystem. If the laser beam-modifying subsystem is used to compress the narrower dimension of the VLD beam or to expand the wider dimension of the VLD beam (i.e. aspect-ratio enlargement), then the astigmatism is minimized by using a diverging beam incident on the laser beam-modifying subsystem.

Considerations on Adjustment of the Focal Length of the Stigmatic Output Laser Beam Relatively simple optics following the laser beam-modifying subsystem, as shown in FIGS. 2H, 2J, and 2L, can be used to focus the astigmatism-free (stigmatic) beam produced by the subsystem. By placing a second lens L2 after the variable spatial-frequency DOE D2, as in System Embodiment Nos. 4 and 8, or before the variable spatial-frequency DOE D2, as in System Embodiments Nos. 10 and 12, the laser beam producing system is provided with a means for adjusting (i.e. fine-tuning) the focal length the stigmatic output laser beam. This feature is advantageous in applications where, for example, the laser beam producing system functions as an optical subsystem within a larger optical system, and the laser beam output therefrom is to be further modified in terms of focal length and the like.

Analyzing the Dispersion Associated with the Laser Beam Output from the Laser Beam Producing System Designed in Accordance with the Principles of the Present Invention Having designed a laser beam producing system using the above-described design procedure, the dispersion characteristics thereof can be analyzed by using the following equation:

$$\theta_{d2}(\lambda_R) = \arcsin\left[\frac{\lambda_R}{d_2} + \sin\rho\sqrt{1 - \left(\frac{\lambda_R}{d_1} - \sin\theta_{i1}\right)^2} - \cos\rho\left(\frac{\lambda_R}{d_1} - \sin\theta_{i1}\right)\right] \quad (Eq. 8)$$

Equation (8) can be used to plot the deflection (i.e. diffraction) angle of each wavelength component in the laser beam output from any laser beam producing system designed and constructed in accordance with the principles of the present invention. A geometrical optics model is presented in FIG. 5A for dispersion analysis of the output laser beam. A graphical representation of dispersion analysis is provided in FIG. 5B, showing a plot of diffraction angle $\theta_{d2}$ as a function of wavelength component of the output laser beam. Inasmuch as the sole objectives for the DOE-subsystem design process described hereinabove are shaping the laser beam without introducing dispersion, the values for the expansion factors $M_1$ and $M_2$ and angle of incidence $\theta_{i1}$ specified at Block A in FIG. 3E1 can be varied to obtain virtually any acceptable solution (provided that the Beam Shaping Factor $M=M_1M_2$ is satisfied).

Using the Beam Dispersion Equation (Eq. 8) set forth above, one can predict the behavior of the laser beam producing system, as well as design a system that will perform in the manner required by any particular application at hand.

Unlike conventional optical elements, the dispersion of the DOE-based laser beam-modifying subsystem can be adjusted so that the function $\theta_{d2}(\lambda)$ exhibits a minimum or a maximum value reflected in a graphical representation thereof. The maximum or minimum point is the precise design point of zero dispersion. If desired or required by any particular application, the dispersion characteristics can be modified in a variety of ways.

For example, if the DOE-based subsystem hereof is used to compress the laser beam produced from the subsystem comprising the VLD and lens L1, as in the illustrative embodiments shown in FIGS. 2A, 2B, 2C, 2D, 2I, 2J, and 2M, then the minimum dispersion curve for the laser beam output from the resulting laser beam producing system will have a negative curvature (i.e. its graphical representation is concave downward), as illustrated in FIGS. 5 and 5B1. If the DOE-based system hereof is used to expand the laser beam produced from the subsystem comprising the VLD and lens L1, as in the illustrative embodiments shown in FIGS. 2E, 2F, 2G, 2H, 2K, 2L, and 2N, then the minimum dispersion curve for the laser beam output from the resulting laser beam producing system will have a positive curvature (i.e. its graphical representation is concave upward), as illustrated in FIGS. 5 and 5B2.

If DOE-based subsystem hereof neither expands nor compresses the input laser beam (i.e. the Beam Shaping Factor M of the subsystem is unity), then the dispersion curve for the output laser beam will be perfectly flat, as illustrated in FIG. 5B. This unique case occurs only when the two DOEs D1 and D2 of the subsystem are arranged parallel to each other and the laser beam entering the DOE D1 is parallel to the beam leaving the DOE D2.

Various Options Available for Implementing the DOE-Based Laser Beam Modifying Subsystem of the Present Invention In general, there are a variety of different techniques available for implementing (i.e. realizing) the DOEs of the DOE-based subsystem 2 described in great detail hereinabove. One technique known in the art would involve the use of conventional "optically-based" holographic recording techniques, wherein each designed DOE of the subsystem is realized as a volume transmission hologram (HOE) constructed by the interference of a laser "object" beam and a laser "reference" beam within a photosensitive recording medium. Another technique known in the art would involve the use of computer generated holographic techniques, wherein each designed DOE of the subsystem is realized as a copy of computer-generated hologram (CGH) by computer modeling the interference pattern and producing the same through printing techniques to produce a hologram having performance characteristics specified during the design process. Other techniques, while less preferred, could involve the use of micro-etching of optical structures to produce "surface-relief holograms" having performance characteristics specified during the design process of the present invention. For purposes of illustration, techniques for producing HOE, CGH and surface-relief implementations of the DOE-based subsystem hereof will be described in greater detail hereinbelow.

Implementing the DOE-Based Subsystem Using Optical-Based Holographic Recording Techniques: Two Cases to Consider Prior to teaching particular procedures for making fixed spatial frequency and variable spatial frequency HOEs, it will be helpful to provide a brief overview on these different holographic construction techniques.

Case 1: Constructing Fixed Frequency HOEs

When constructing a fixed frequency hologram (HOE), the object and reference beams must have the same radius of curvature. In most applications, this is accomplished by collimating the two beams so that we have two wavefronts at the hologram recording medium. The angle between the two beams will determine the spatial frequency of the fixed frequency hologram. The greater the angle, the greater the spatial frequency. The actual spatial frequency of the hologram is, more precisely, a function of the angles of incidence of the two beams at the hologram recording medium and the wavelength of the two beams. The spatial frequency is established by the well known grating equation: d=wavelength/(sin O+sin R), where O is the angle of incidence of the object beam and R is the angle of incidence of the reference beam.

Case II: Constructing Variable Frequency HOEs

When constructing a variable frequency hologram (HOE), the object and reference beams must have different radii of curvature. In most applications, this is accomplished by collimating one of the beams and making the other beam a diverging beam. We will choose to call the collimated beam the reference beam. The diverging beam, which we will choose to call the object beam, is generally created by transmitting the object beam portion of the laser beam through a positive lens, such as a microscope objective. The focal point of the converging beam leaving the positive lens then becomes the center of curvature of the object beam. If this positive lens is a spherical lens, the object beam wavefront at the hologram recording medium will be spherical. If the lens is cylindrical lens, with optical power in only one dimension, the object beam wavefront at the hologram recording medium will be cylindrical. In the case of cylindrical wavefront, some additional spherical optics is generally employed to expand the cylindrical beam along the axis of the cylinder without modifying the wavefront in that direction. That is, in the direction parallel to the cylindrical axis of the wavefront the beam will appear to be collimated.

As in the fixed frequency hologram, the wavelength of the beams and the angles of incidence of the two beams at the hologram recording medium will determine the spatial frequency of the hologram. However, in this case, the angle of incidence of the object is not constant since the beam has spherical (or cylindrical) wavefront. The angle of incidence of any beam at the point of incidence of any surface is the angle between the normal to the surface and the incoming ray at the point of incidence. And the incoming ray, by definition, is just the normal to the wavefront. But for a spherical, or cylindrical, wavefront, the normal to the wavefront will not be constant across the wavefront. The angle of incidence for the object beam will be the angle between the normal to the surface and the line running from the point of incidence to the center of curvature of the object beam. Since this angle will vary with position on the hologram recording medium, then, from the grating equation, the spatial frequency will also vary with position on the hologram recording medium. That is, we will have a variable frequency hologram.

The spatial frequency of this variable frequency hologram will vary in both (x and y) dimensions of the plane of the hologram recording medium when the object beam is a spherical wavefront. The spatial frequency of this variable frequency hologram will vary in only one dimension of the plane of the hologram recording medium when the object beam is a cylindrical wavefront.

Having provided an overview on these different construction techniques, it is now appropriate to disclose hereinbelow preferred procedure of constructing both fixed and variable spatial frequency HOEs.

A Procedure for Constructing Fixed and Variable Spatial Frequency Hoes

As indicated at Block A in FIG. 4A, the design parameters $\theta_{i1}$, $\theta_{d1}$, $\theta_{i2}$ and $\theta_{d2}$ and $f_2$ (i.e. focal length of DOE D2 in the case of variable spatial frequency DOEs) expressed at the reconstruction wavelength $\lambda_R$ are converted into construction parameters expressed at the construction wavelength $\lambda_C$, namely: object and reference beam angles $\theta_{O1}$ and $\theta_{R1}$ for HOE H1 at construction wavelength $\lambda_C$; and object and reference beam angles $\theta_{O2}$ and $\theta_{R2}$, respectively, for HOE H2. This parameter convention process can be carried out using, for example, the conversion method described on Pages 163–164 and FIGS. 28A1 through 28D and FIG. 29 of International Publication No. WO/9722945, based on corresponding U.S. application Ser. Nos. 08/573,949 and 08/726,522, each of which is incorporated herein by reference. Notably, instances where the design (reconstruction) wavelength $\lambda_R$ is equal to the construction wavelength $\lambda_C$ and there is no need for wavelength correction or conversion, then the design parameters can be used for the construction parameters in a manner well known in the art.

Figure 4B:
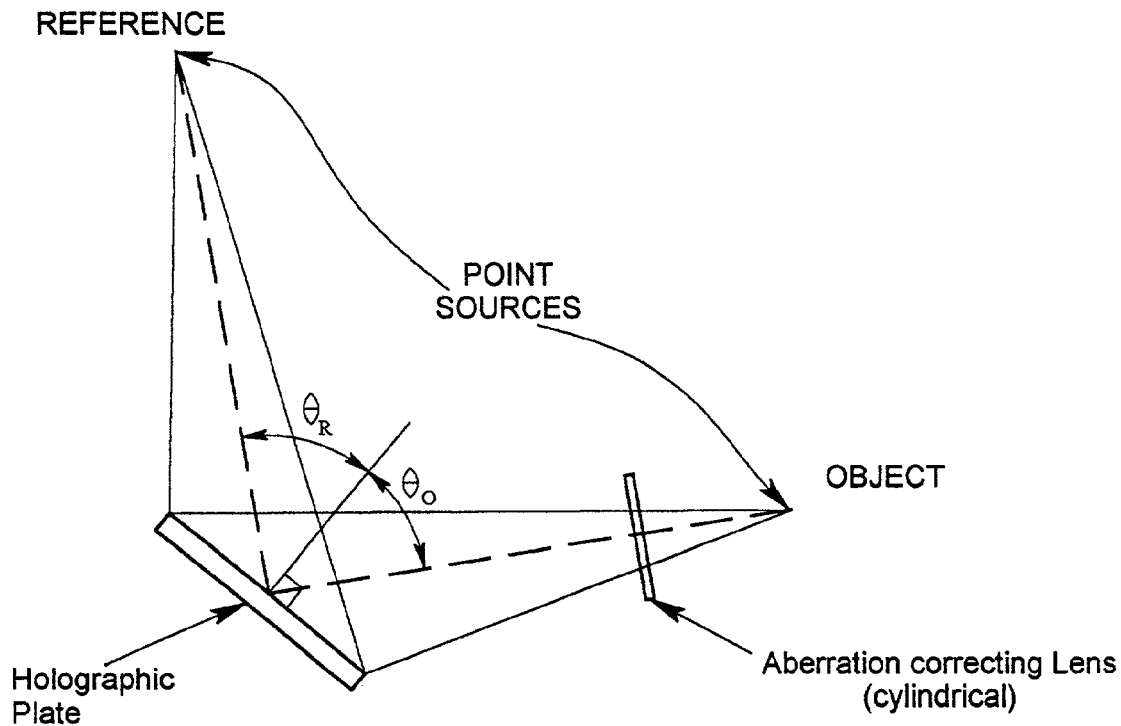
FIG. 4B is a schematic diagram showing apparatus for recording HOEs to be used in the dual-HOE subsystem specified in FIG. 4A.
Figure 4D:
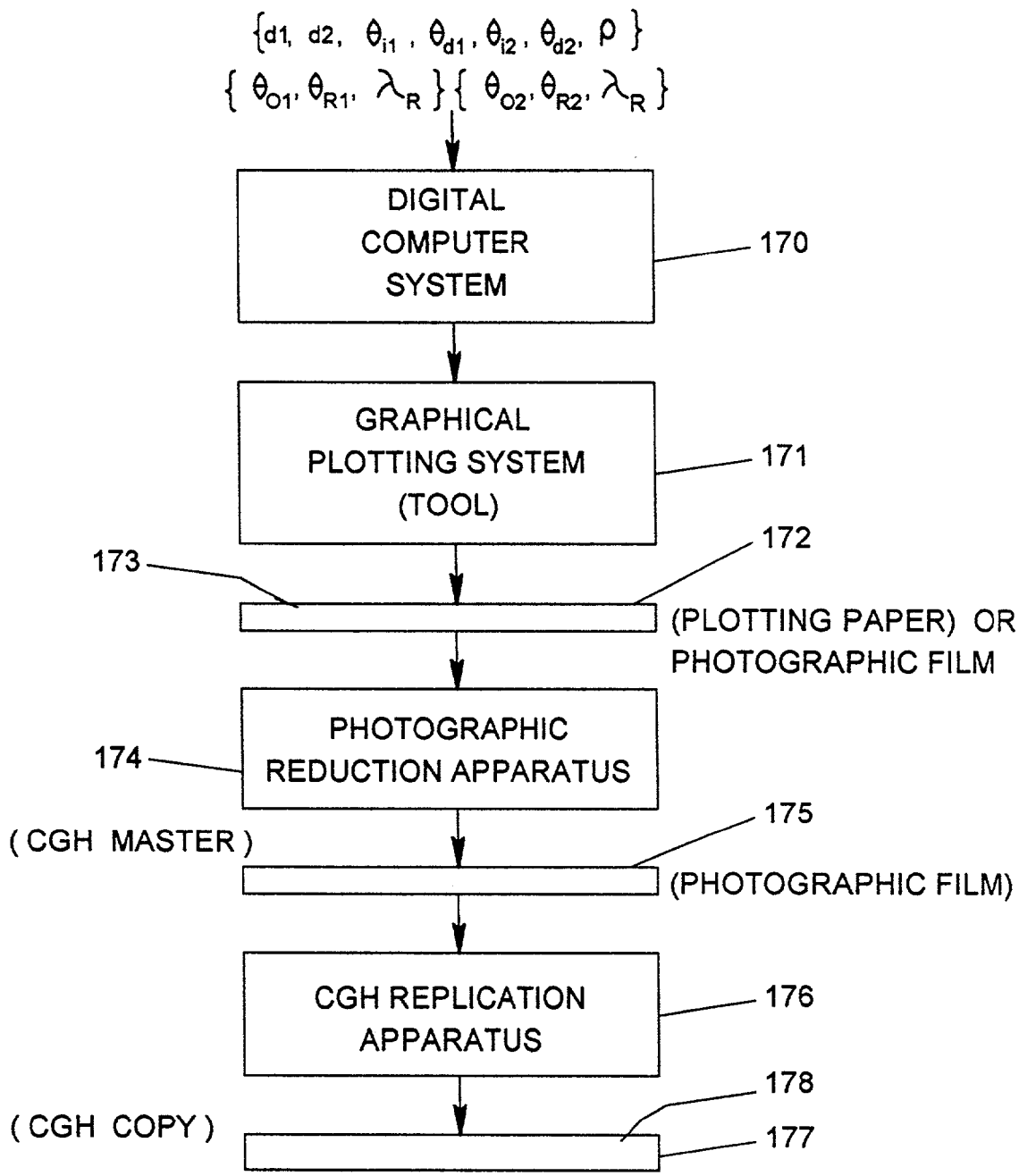
FIG. 4D is a schematic diagram showing apparatus for generating and recording master CGHs, and producing copies thereof for use in DOE-based subsystems in accordance with the principles of the present invention.

As indicated at Block B in FIG. 4A, it will be necessary, in the case of variable spatial frequency DOEs, to use computer ray-tracing analysis in order to determine the distances of the object and reference sources relative to the recording medium (as well as the distances of any aberration-correcting lenses therefrom) which are employed during the holographic recording process, schematically depicted in FIG. 4B for the case of a variable spatial frequency HOE. In the case of fixed spatial frequency DOEs, computer ray-tracing analysis is not necessary. Notably, in this case, the location of the object and reference sources relative to the recording medium will be effectively located at infinitely (e.g. realized by the use of collimating mirrors or the like).

Having computed the construction parameters for HOE H1 and HOE H2, the HOEs can then be constructed using the holographic recording system illustrated in FIG. 4B, using the volume holographic recording techniques detailed in International Publication No. WO/9722945, supra. Regarding, non-VLD type astigmatism, the method used to construct HOE H1 should seek to minimize the astigmatism that would normally occur when a widely diverging beam is incident on a glass plate with parallel surfaces. This type of astigmatism can be minimized in many instances if, for example, the HOE is constructed using: (1) the same type of laser as is used in the end-user scanning system; and (2) the same illumination geometry as is used in the end-user scanning system. While applying the above conditions is helpful in many instances, it is understood that it is not always necessary, nor is it always possible to do so.

Implementing the DOE-Based Subsystem Using Computer-Generated Holographic (CGH) Recording Techniques The values obtained for design parameters $\theta_{i1}$, $\theta_{d1}$, $\theta_{i2}$ and $\theta_{d2}$, $d_1$, $d_2$ and $f_2$ (focal length of variable frequency DOE) associated with the dual-DOE subsystem can be used to derive construction parameters necessary to construct a dual-CGH implementation thereof. A suitable procedure for this type of implementation will be described below.

As indicated at Block A in FIG. 4C1, the first step of the method involves formulating, within a digital computer system 170, a mathematical description of the object and reference beam wavefronts at the design wavelength $\lambda_R$. Typically, standard diffraction integrals, such as the Kirchhoff integral, can be used to produce mathematical descriptions of these wavefronts. Such mathematical descriptions can be derived from the design parameters {e.g., for DOE D1, such parameters include $\theta_{i1}$, $\theta_{d1}$, $\theta_{i2}$ and $\theta_{d2}$, the image produced by DOE D1 (i.e. reference source point) and image produced from DOE D2 (i.e. object source point)}. In particular, a mathematical description for the object and reference beam wavefronts at the design wavelengths $\lambda_R$ for DOE D1 can be formulated as Kirchhoff integrals using the design parameters for DOE D1, expressed at the reconstruction (i.e. design) wavelength $\lambda_R$. Also, a mathematical description for the object and reference beam wavefronts at the design wavelength for DOE D2 can be formulated as Kirchhoff integrals using the design parameters for DOE D2, expressed at the reconstruction wavelength $\lambda_R$. Notably, using the CGH implementation technique, there typically will be no need to make any corrections for the construction wavelength as the CGH has been previously constructed for aberration-free performance at the reconstruction wavelength (which is specified by the commercial-grade VLD selected for use in constructing the laser beam producing system).

As indicated at Block B in FIG. 4C1, the second step of the method involves using the digital computer system 170 to formulate a mathematical description of the "interference pattern" that is generated by mathematically superimposing the mathematical model of the object beam wavefront (e.g. represented by Kirchoff integrals) with the mathematical model of the reference beam wavefront (also represented by Kirchoff integrals). The mathematical description of the interference pattern generated by the computer system 170 provides a "spatial function" of the interference pattern. In cases where only fixed-spatial frequency DOEs are used to construct the laser beam modifying subsystem, the interference pattern generated by the reference and object wavefronts will be mathematically represented by a one-dimensional sinusoidal function, expressed in the form of $D=A+B \sin fx$, where A is a bias level; B is a modulation factor always less than A; and f is the spatial frequency. In cases where a variable spatial frequency DOE is used to construct the laser beam modifying subsystem, the interference pattern generated by the reference and object wavefronts can be mathematically represented by an infinite series of one-dimensional sinusoidal functions.

As indicated at Block C in FIG. 4C1, the third step of the method involves using the digital computer system 170 to sample the spatial function of the computer generated/represented interference pattern along the x and y directions in order to produce a large set of sampled values of varying light transmission associated with the computer generated interference pattern (represented within the computer system 170). These sampled values correspond to either the light transmittance of the computer generated/represented interference pattern over its x,y spatial extent.

As indicated at Block D in FIG. 4C2, the fourth step of the method involves transferring the sampled light transmittance values from the computer system 170 to the drivers of a graphical plotter or plotting tool 171 shown in FIG. 4C2.

As indicated at Block E in FIG. 4C2, the plotting system 171 uses the set of sampled amplitude transmittance values to plot the two-dimensional sampled interference pattern on paper or other recording medium 172, thereby creating a graphical representation thereof 173 consisting of fine (sampled) dots of particular density, in a way similar to that produced by a digital printing process. In general, the two-dimensional amplitude transmittance function 173 plotted on paper or other recording medium 172 by the plotting tool 171 is usually quite large (i.e. several orders larger than the final CGH master). The two-dimensional plot produced from this step of the method provides a graphical representation of the CGH under construction. For fixed spatial frequency DOEs, the 2-D plot provides a graphical representation of a CGH which functions as a planar diffraction grating. For variable spatial frequency DOEs, the 2-D plot provides a graphical representation of a CGH which functions with some degree of focal power.

As indicated at Block F in FIG. 4C2, two-dimensional amplitude transmittance function 173 plotted on paper at Block E can then be photographically reduced on some light transmissive or reflective recording medium, generally photographic film 175 using photographic reduction equipment 174. The output of this system is a master of the CGH which can be then bleached to improve its diffraction efficiency. However, its diffraction efficiency will always be low because the CGH is a surface relief hologram, not a volume hologram as produced by the optically-based Holographic Recording Method described above. As normal photographic film will often be the medium used for the first recording of the CGH (at Block F), it is expected that resolution of the CGH will not be very high.

As required by most embodiments of the DOE-based subsystem hereof, the CGH master obtained at Block F can be copied onto some higher efficiency medium, such as DCG, photoresist, or suitable surface relief material 177 using conventional copying apparatus 176 well known in the art. While such copying techniques enable the production of DOEs having greater diffraction efficiencies, these techniques are not without their problems, as explained below.

For example, copies of a CGH master can be made with high diffraction efficiency in surface relief material by standard pressing operations provided that the aspect ratio of the surface relief structure (groove depth/groove spacing) is on the order of one. However, it is very difficult to make such copies when the aspect ratio of the surface relief structure is that large.

Using photoresist CGH copies directly is also difficult because the material is susceptible to damage during handling. Also, sealing the photoresist CGH copies between glass will be required in many applications. However, this will drastically reduce the diffraction efficiency of the photoresist CGH copies if an index matching fluid is used to minimize reflection losses.

Making DCG copies of the CGH masters at the 488 nm Argon wavelength is a much better method, as the "nearly-contact" copy process will always faithfully reproduce the surface fringe structure of the master, regardless of the wavelength of the copying laser light source. Consequently, the copy holograms will be aberration-free at the wavelength at which the CGH masters were constructed (for use with conventional VLDs). The CGH HOEs will be essentially the same as the photographic plate masters.

Notably, however, the CGH fabrication technique described above will have little advantage over the optically-based Holographic Recording Method. In fact, this technique will have the significant disadvantage of producing holograms having a much lower resolution. In typical applications, the DOEs will require a resolution of at least 2000 cycles per mm. While the DCG copying method is capable of producing HOE having a resolution better than 2000 cycles per mm, the resolution of the DCG copy can be no greater than that of the CGH master, which, for normal photographic film, will be much less than 2000 cycles per mm. Consequently, when using the CGH implementation technique described hereinabove, it will be desirable (if not necessary) to first record the CGH master in a photographic medium having a very high resolution in order to produce CGH masters having diffraction efficiencies suitable for use in the DOE-based subsystem hereof.

Having produced a master CGH in the manner described above, copies thereof can be made using various copying techniques known in the art.

If the illuminating beam transmitted through the CGH copy (during reconstruction) is identical to the reference beam (modeled at Block A), then the object beam (modeled at Block A) will be reconstructed by the interference pattern embodied within the CGH copy. If the illuminating beam transmitted through the CGH copy (during reconstruction) is identical to the object beam (modeled at Block A), then the reference beam (modeled at Block A) will be reconstructed by the interference pattern embodied within the CGH copy.

Additional details regarding CGH implementation process can found with reference to: Chapter 19 of the book entitled "Optical Holography" by Collier, Burckhardt and Lin (1971), published by Academic Press, incorporated herein by reference.

Applications of the Laser Beam Producing System of the Present Invention

Figure 11A:
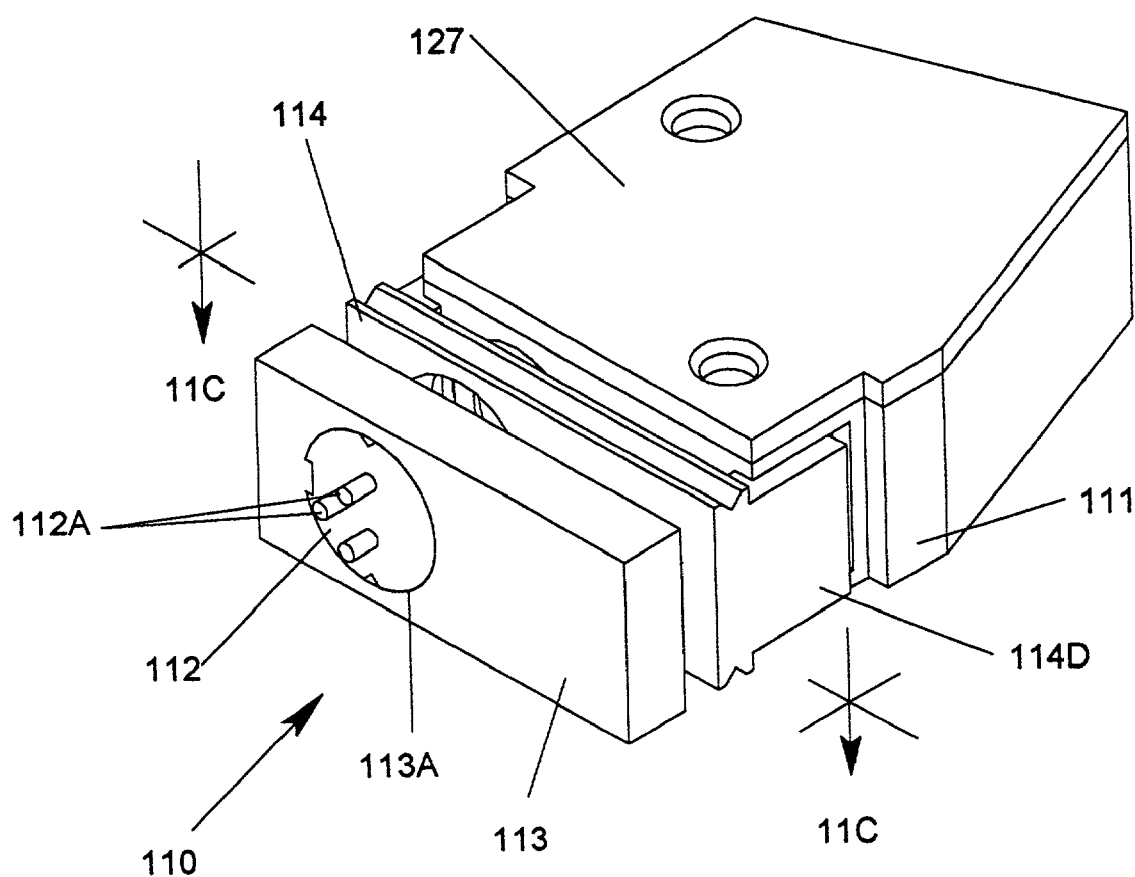
FIG. 11A is a perspective view of a fourth illustrative embodiment of the laser beam producing module of the present invention, wherein its VLD laser source is adjustable relative to its imaging lens (L1) and so that the inherently off-axis elliptical beam produced from the VLD is aligned relative to the optical axes of the HOEs in order to minimize laser beam dispersion, control the aspect-ratio of the output laser beam in a desired manner, and correct for astigmatism in the output laser beam, the focal length of the second lens (L2) is adjustable to fine-tune the focal-length of the output laser beam as required by the application to which the laser beam producing system is put.
Figure 11B:
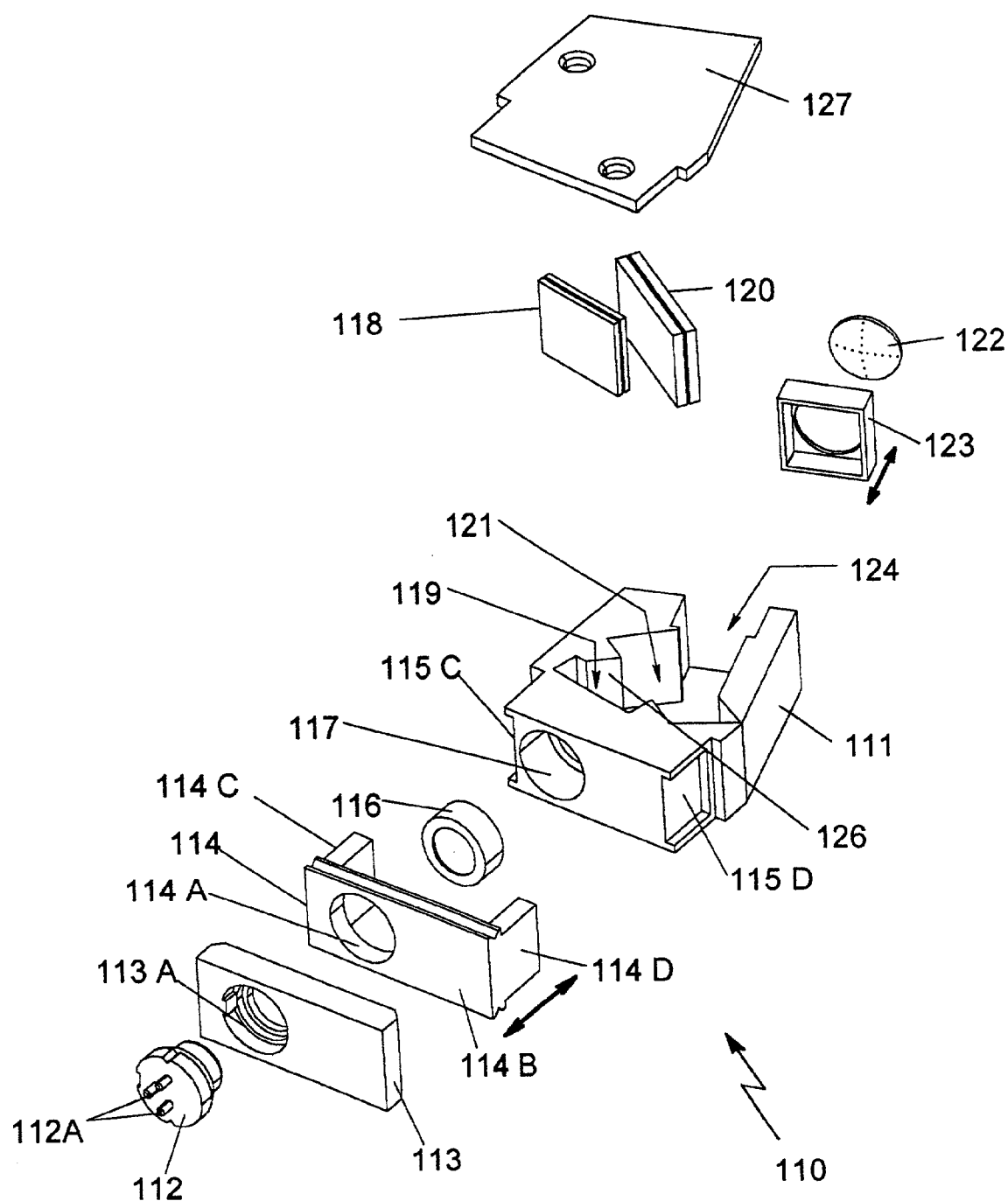
FIG. 11B is an exploded view of the laser beam producing module shown in FIG. 11A, showing its sub-components and mechanisms enabling the adjustment of the position of the VLD relative to the lens L1 and the position of HOE H2 relative to HOE H1.
Figure 11C:
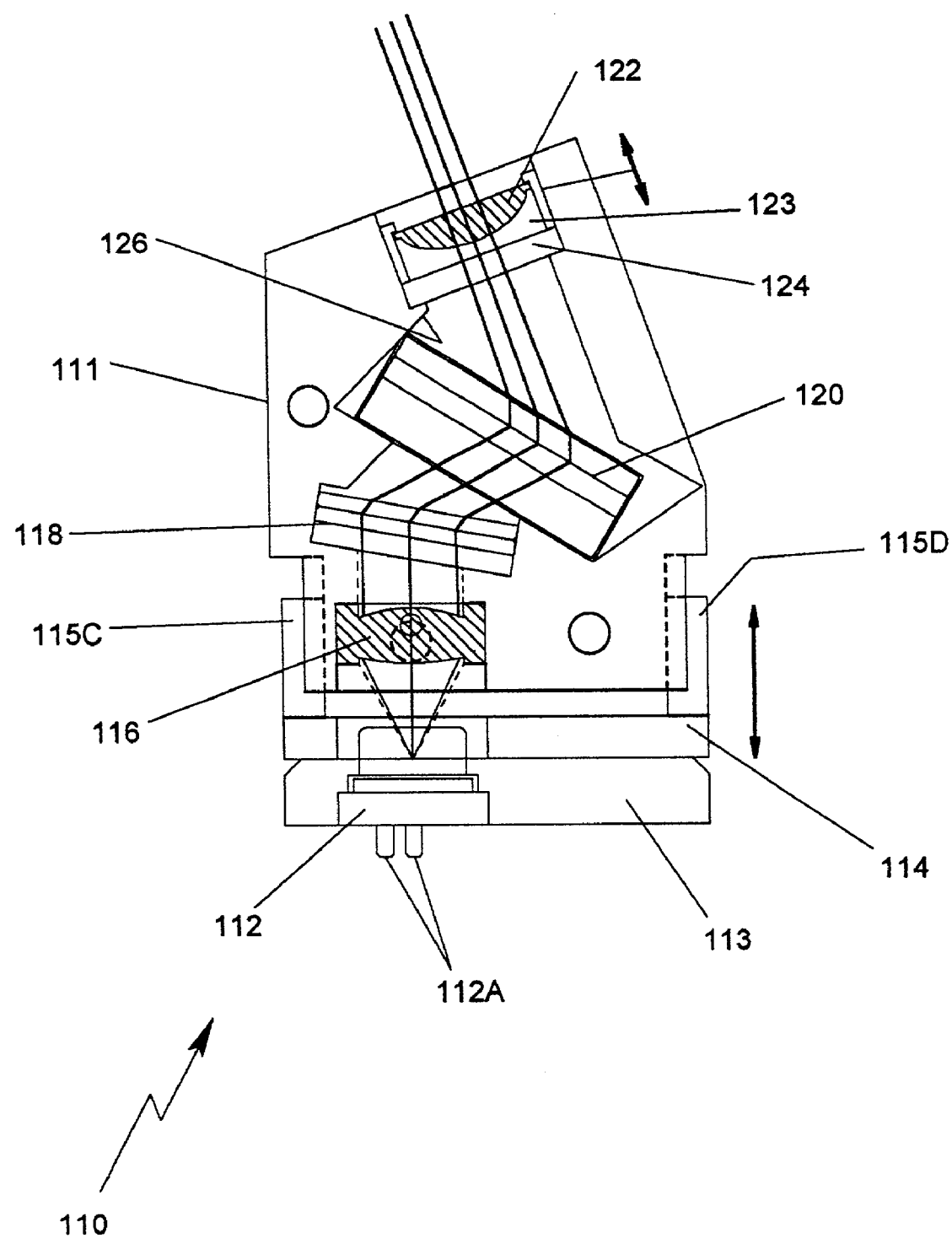
FIG. 11C is a cross-section view of the laser beam producing module taken along line 11C–1C shown in FIG. 11A.
Figure 12A:
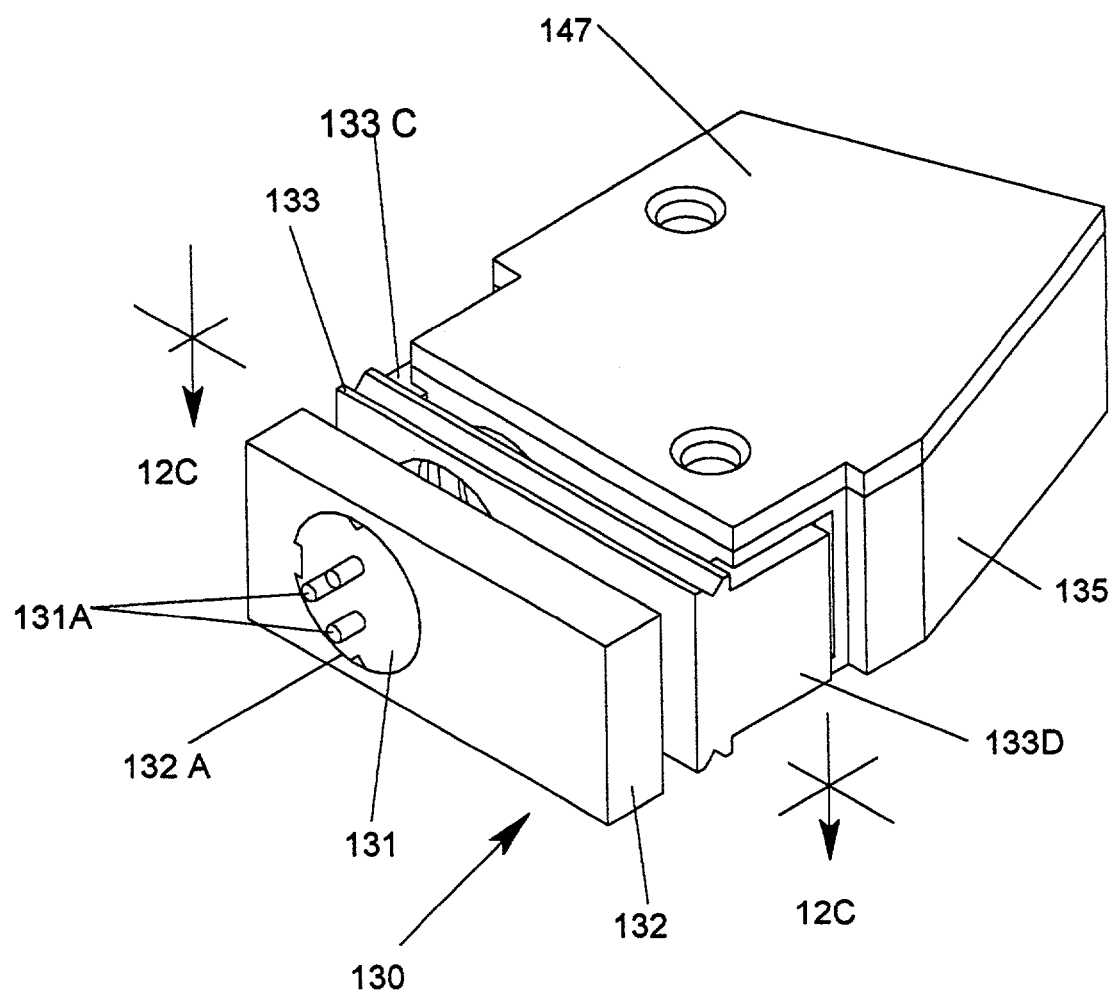
FIG. 12A is a perspective view of the fifth illustrative embodiment of the laser beam producing module of the present invention, wherein a laser beam scanning mechanism is integrated therein and its VLD laser source is adjustable relative to its imaging lens (L1) so that the inherently off-axis elliptical beam produced from the VLD is aligned relative to the optical axes of the HOEs in order to minimize laser beam dispersion, and control the aspect-ratio of the output laser beam in a desired manner, correction for astigmatism in the output laser beam.

In general, each illustrative embodiment of the laser beam producing system described above can be realized in a variety of different ways. For example, in FIGS. 6A through 10D, several laser beam production modules of the present invention are disclosed for producing a laser beam having a pre-specified beam aspect-ratio, zero beam dispersion and a predetermined focus. In FIGS. 11A through 11C, a laser beam production module of the present invention is shown for producing a laser beam, wherein a pre-specified beam aspect-ratio is achieved, its beam dispersion is zero (or minimized), its focus set to a predetermined distance, and its astigmatism corrected. In FIGS. 12A through 112C, a laser beam production module of the present invention is shown for producing a laser beam wherein its aspect-ratio is controlled, its beam dispersion is zero (or minimized), its astigmatism corrected, its focus set to a predetermined distance, and its focal length adjusted. With reference to modified system designs shown in FIGS. 7A through 7C, several laser beam production modules of the present invention are disclosed for producing a laser beam having a pre-specified beam aspect-ratio, zero beam dispersion and astigmatism control. For purposes of illustration, HOE-based implementations of these illustrative system embodiments will be described hereinbelow. Equivalent CGH-based implementations thereof can be readily made using the principles disclosed hereinabove.

Laser Beam Production Module of the First Illustrative System Embodiment for Producing a Stigmatic Laser Beam Having Zero Beam Dispersion, Predetermined Aspect Ratio and Preset Focus (CASE D)

Figure 6A:
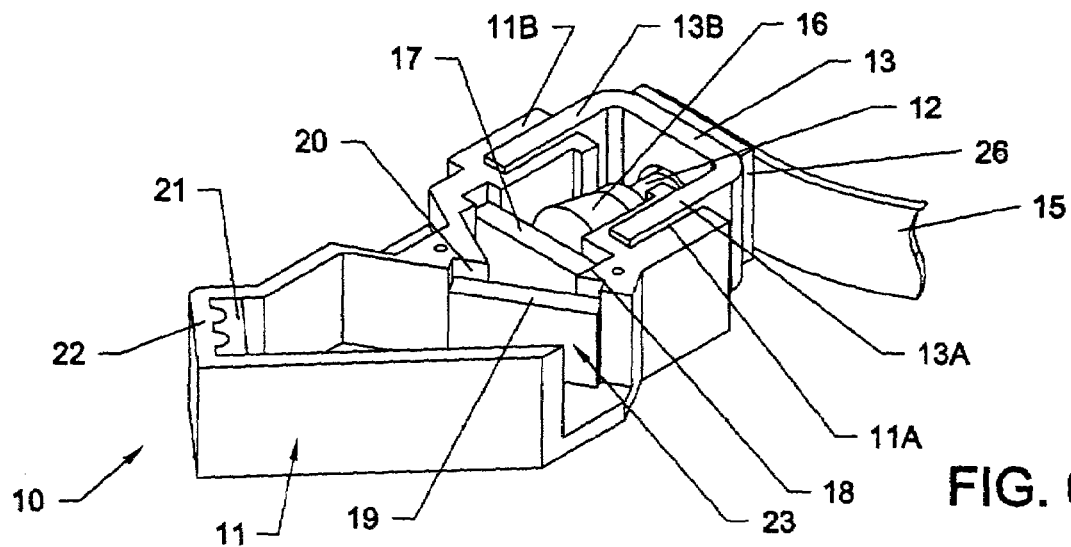
FIG. 6A is a first perspective view of a first illustrative embodiment of a laser beam producing module according to the present invention, wherein its VLD laser source is adjustable relative to its imaging lens (L1) and pair of stationary-mounted HOEs and beam directing mirror so that the elliptical beam produced from the VLD is aligned relative to the optical axes of the HOEs in order to minimize laser beam dispersion and to control the aspect-ratio of the output laser beam in a desired manner.
Figure 6B:
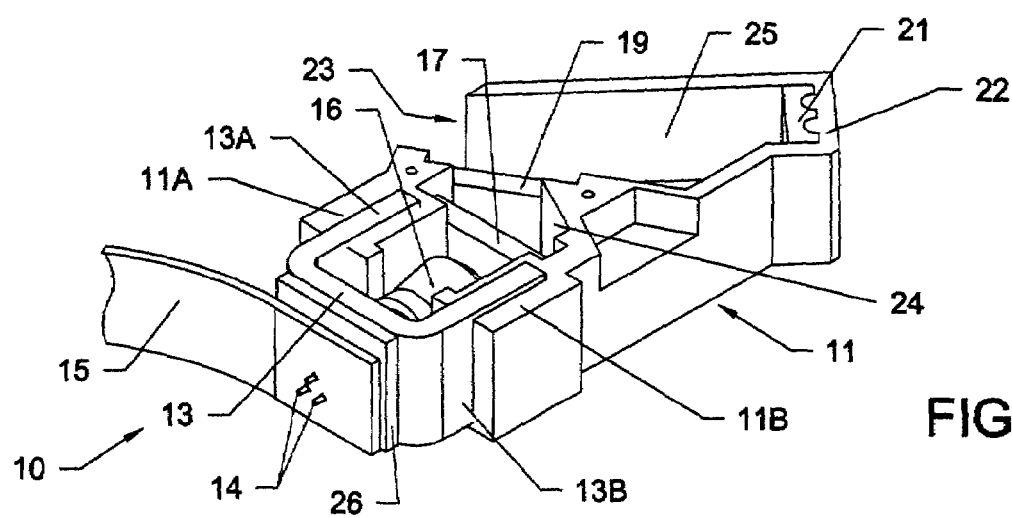
FIG. 6B is a second perspective view of the laser beam producing module shown in FIG. 6A.
Figure 6C:
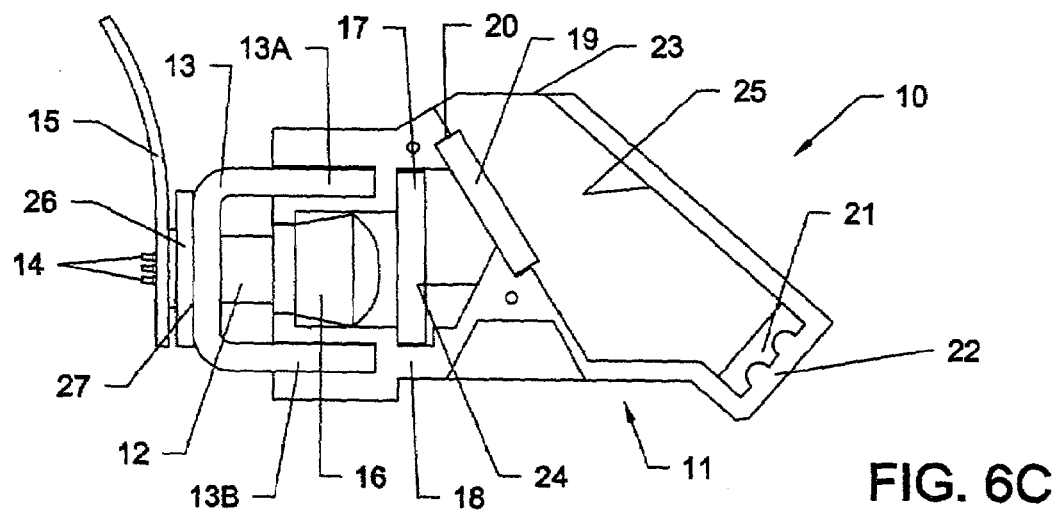
FIG. 6C is a plan view of the laser beam producing module shown in FIG. 6A.

In FIGS. 6A, 6B and 6C, a first illustrative embodiment of the laser beam production system of FIGS. 2M and 2N (System Embodiment Nos. 13 and 14) is disclosed. As shown, this optical system is realized in the form of a miniature laser beam producing module 10 comprising an assembly of subcomponents, namely: a module housing 11 made of lightweight plastic and serving as an optics bench for the optical components within the laser beam producing system; a VLD 12, press-fit mounted through a metal heat sinking plate 26; a VLD, mounting bracket (i.e. Yoke) 13, having side projecting 13A and 13B slidable within spaced apart recesses 11A and 11B respectively formed in the rear portion of the module housing: connected to the terminal 14 of the VLD, for applying a supply voltage and driving the VLD to produce a laser beam having elliptical, divergent, eccentric, and astigmatic characteristics, and a oversized aperture 27 for receiving the case portion (or beam emitting) portion of the VLD and allowing x, y positioning thereof relative to the VLD mounting bracket 13; a flexible circuit 15; a focusing lens L1 16 for focusing the laser beam produced from the VLD; fixed spatial-frequency HOE H1 17, securely mounted within a first mounting slot 18 formed in the module housing 11, for modifying the beam characteristics of the laser beam output from focusing lens L1 16; fixed spatial-frequency HOE H2 19, securely mounted within a second mounting slot 20 formed in the module housing 11, for modifying the beam characteristics of the laser beam produced from HOE H1 to produce the output laser beam; a beam folding mirror 21, mounted on side wall surface 22 of the module housing, for directing the output laser beam through the beam output window 23 formed in the side wall of the module housing; a first radiation-absorbing wall surface 24 formed in the module housing, aligned with the zeroeth-order diffraction beam from HOE H1, and absorbing the zeroeth-order diffraction beam produced from HOE H1; and second radiation-absorbing wall surface 25 formed in the module housing, aligned with the zeroeth-order diffraction beam from HOE H2, and absorbing the zeroeth-order diffraction beam produced from HOE H2.

In an illustrative embodiment of this system design, the VLD 12 can be realized using a SONY Model SLD1122VS laser diode, and the focusing lens L1 16 can be realized as a 4.35 mm lens made of an optically transparent plastic. The HOEs H1 17 and H2 19 can be made using DCG recording material of about 5 microns thick, a construction wavelength of 488 nanometers. These volume transmission holograms can be mounted between a pair of ultra-small plates made from float glass. It is understood, however, that other embodiments of this system design can be made using different types of components and materials, having different design parameters selected or determined for the particular application at hand.

As shown in FIG. 6C, during the alignment stage of the assembly process for the laser beam producing module 10, the distance between VLD 12 and lens L1 16 is adjusted by sliding the VLD mounting bracket 13 within the pair of recesses 11A and 11B. As will be explained in greater detail hereinafter, this parameter adjustment mechanism is employed while the system is mounted on a special design fixture specifically crafted for aligning such parameters. When the x, y position of the VLD is properly aligned relative to lens L1, by a translation of the VLD/heat-sinking plate subassembly relative to VLD mounting bracket 13 during the alignment stage of the module assembly process, then the output laser beam from the module will have the desired beam aspect-ratio and minimized (or zero) beam dispersion minimized in accordance with the design criteria for this laser beam producing module. Also, the (z) axis position of the VLD is relative to lens L1 can be adjusted during the alignment stage by sliding VLD mounting bracket 13 within recesses 11A and 11B in the module housing until beam astigmatism is eliminated. This parameter alignment process will be described in greater detail hereinafter.

Laser Beam Producing Module of the Second Illustrative System Embodiment for Producing a Laser Beam Having Focus Control, Controlled Aspect-Ratio and Zero Beam Dispersion: CASE A In FIGS. 7A, 7B and 7C, a second illustrative embodiment of the laser beam production System Embodiment No. 1) of FIG. 2M is disclosed. As shown, this optical system is realized in the form of a miniature laser beam producing module 30 comprising an assembly of subcomponents, namely: a module housing 31 made of lightweight plastic and serving as an optical bench for the optical components within the laser beam producing system; a VLD 32 mounted to a VLD heat-sinking plate 33 through aperture 33A and producing a visible laser beam having elliptical, divergent and astigmatic beam characteristics in response to a voltage source applied VLD terminal 34 by way of a flexible circuiter like connectors (not shown) well known in the art; a mounting bracket 36 having an aperture 36A for receiving the barrel portion of the casing of the VLD 32 and a mounting surface 36B for affixing the associated heat-sinking plate 33 and premounted VLD 32 thereto, and also having side projections 36C and 36D for slidable receipt within spaced apart recesses 37C and 37D formed in the rear portion of the module housing; a collimating lens L1 38 for focusing the laser beam produced from the VLD; fixed spatial-frequency HOE H1 39, securely mounted within a first mounting slot 40 formed in the module housing 31, for modifying the beam characteristics of the laser beam output from focusing lens L1 38; fixed spatial-frequency HOE H2 41, securely mounted within a second mounting slot 42 formed in the module housing 31, for modifying the beam characteristics of the laser beam produced from HOE H1 to produce the output laser beam; a radiation-absorbing wall surface 43 formed in the module housing, aligned with the zeroeth-order diffraction beam from HOE H1, and absorbing the same during operation of the device; and a housing cover plate 44 for attachment to the top portion of the module housing 31 and securing HOEs H1 and H2 therein.

In the illustrative embodiment, the VLD 32 can be realized using a SONY Model SLD1122VS laser diode, and the collimating lens L1 38 can be realized as a 4.35 mm lens made of an optically transparent plastic. The HOEs H1 39 and H2 41 can be made using DCG recording material of about 5 microns thickness, at a construction wavelength of 488 nanometers. These volume transmissions holograms can be mounted between a pair of ultra-small plates made from float glass. It is understood, however, that other embodiments of this system design can be made using different types of components and materials, having different design parameters selected or determined for the particular application at hand.

When the proper x, y position of the VLD 32 relative to the optical axis of lens L1 38 is set during the alignment stage of the module assembly process, then the output laser beam from the module will have the desired beam aspect-ratio and minimized (or zero) beam dispersion in accordance with the design criteria for this laser beam producing module. As shown in FIG. 7C, during assembly and construction of the laser beam producing module 30, the distance between VLD 32 and lens L1 38 (i.e. "d") is adjusted by sliding the VLD mounting bracket 36 within the pair of recesses 37C and 37D in the module housing. As will be explained in greater detail hereinafter, this parameter adjustment mechanism is employed while the system is mounted on an optical bench specially crafted for aligning such parameters.

Figure 8A:
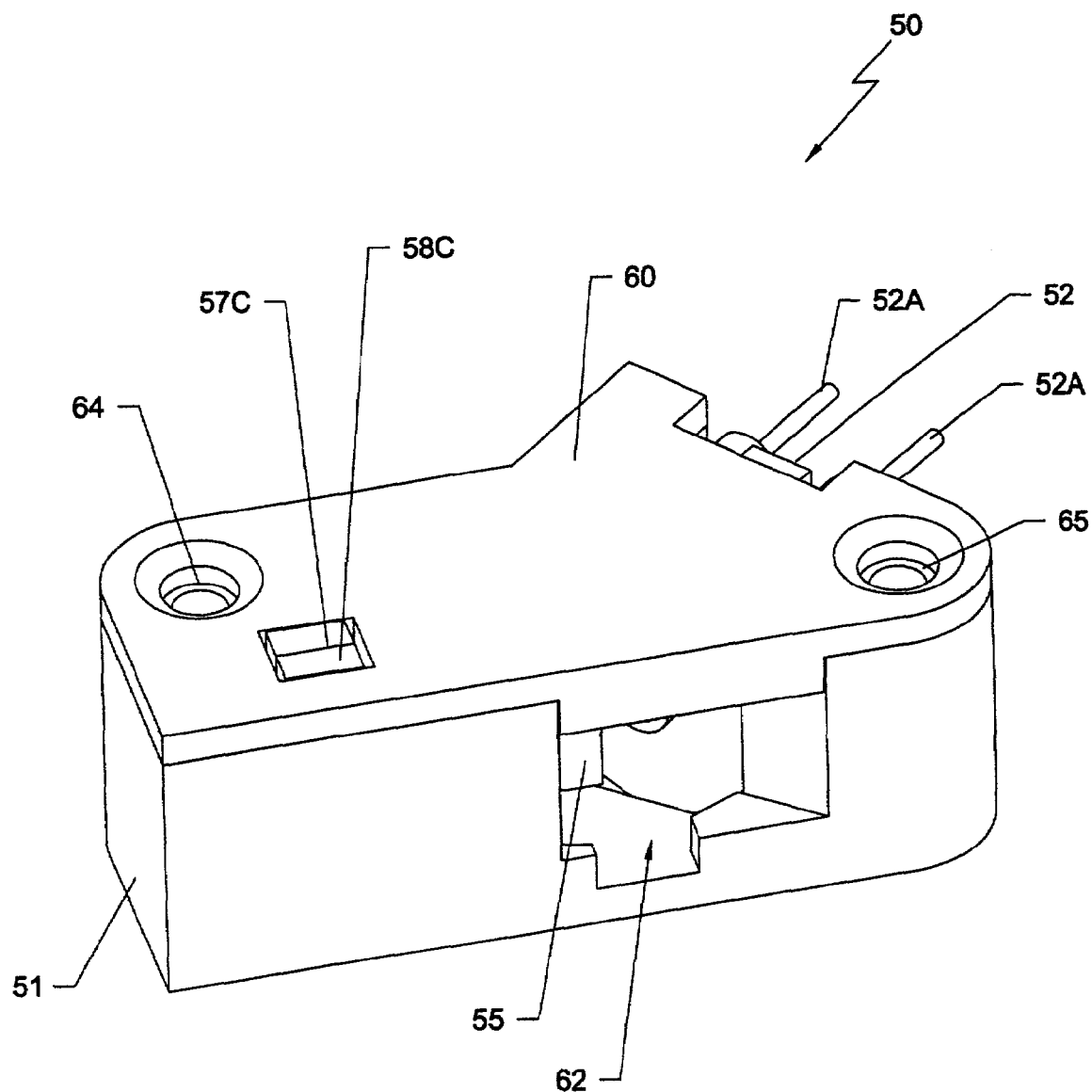
FIG. 8A is a perspective view of a miniature laser scanning module for use in connection with laser beam producing modules of the present invention.
Figure 8B:
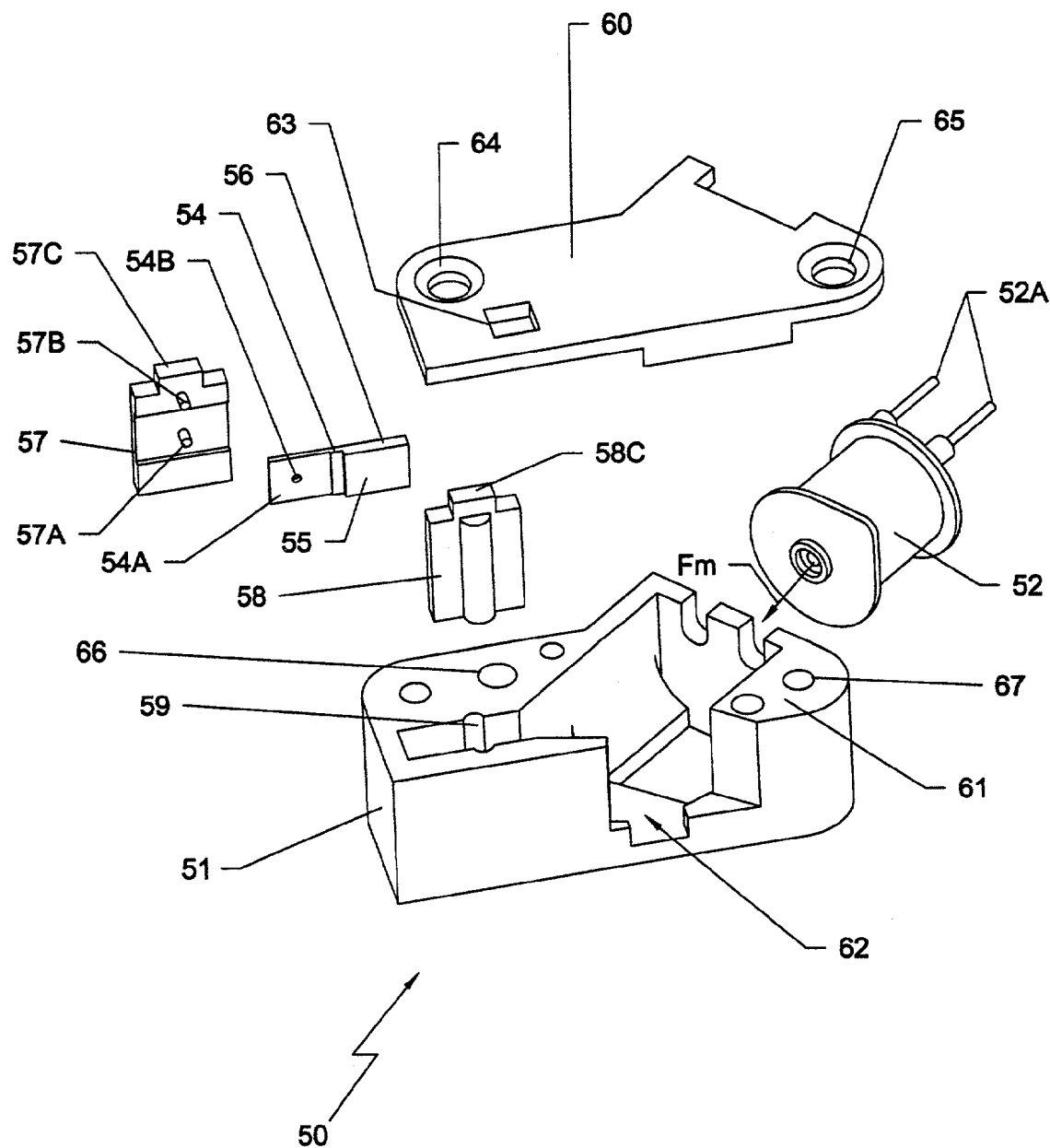
FIG. 8B is an exploded view of the laser beam scanning module of the present invention shown in FIG. 8A, showing its scanning element, mounting plates, electromagnet, support base, and cover plate.
Figure 9:
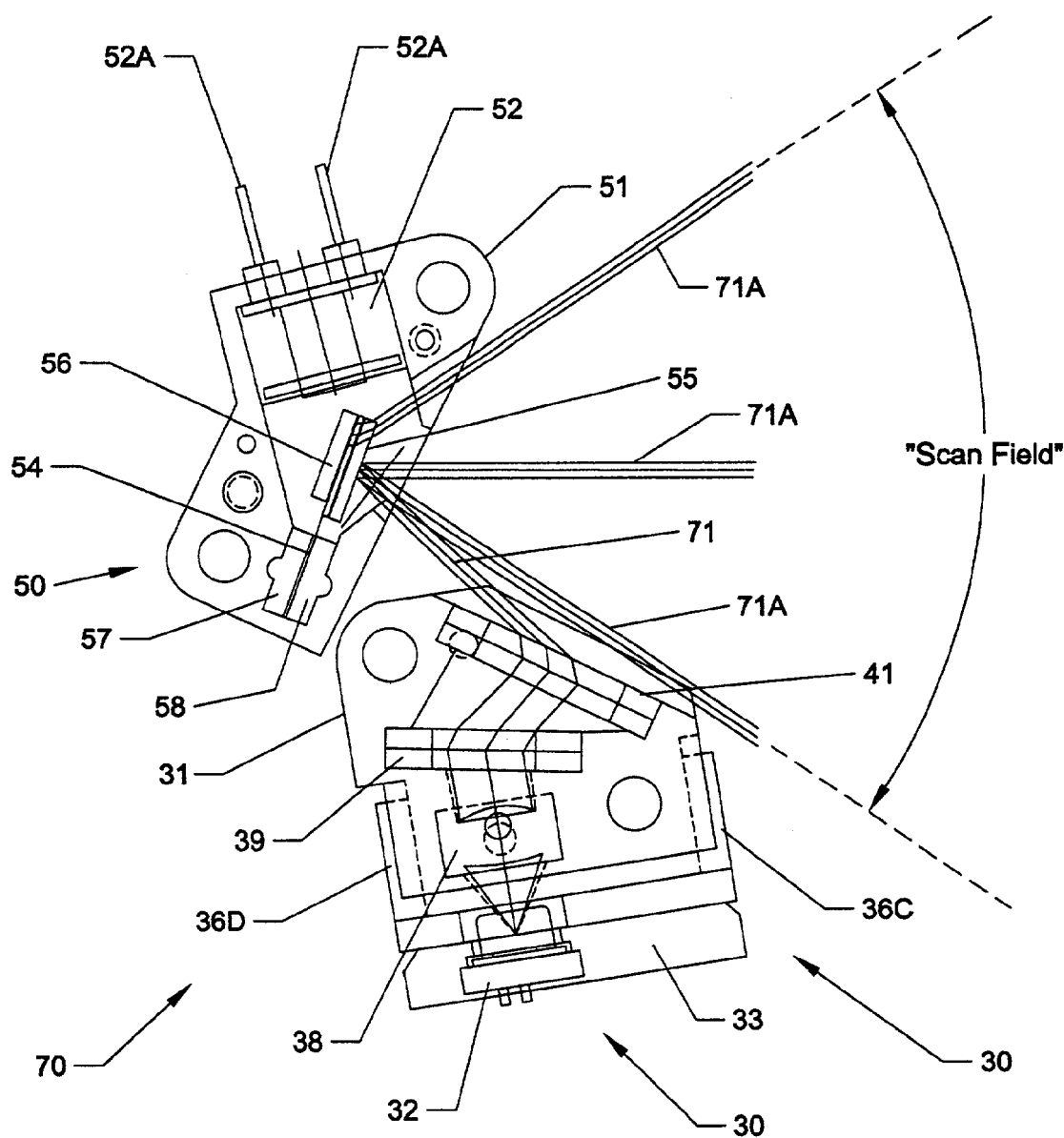
FIG. 9 is a plan view of the laser beam producing module of the present invention shown in FIG. 7A configured for cooperation with the laser beam scanning module shown in FIG. 8A.

Laser Beam Scanning Module Adapted for Use with the Laser Beam Producing Modules of the Present Invention In FIGS. 8A and 8B, a laser beam scanning module is disclosed for use with any of the laser beam producing modules of the present invention. As shown, the laser beam scanning module 50 comprising an assembly of subcomponents, namely: a module housing 51 made of lightweight plastic and serving as an optical bench for the optical components within the laser beam scanning system; an electromagnetic coil 52 mounted within recess 53 in the module housing, for producing a magnetic force field FM in response to electrical current supplied to the input terminals thereof 52A; a scanning element 54 supporting a light deflecting element (e.g. mirror, hologram, refractive element, etc.) 55 on the front surface of its free end, and a permanent magnetic element 56 on the rear surface of its free end; a pair of mounting plates 57 and 58 having projections 57A, 57B, and matching holes 58A, 58B respectively for clamping the base portion 54A of the scanning element 54, and securely mounting the same within recess 59 formed within the module housing 51, as shown in FIGS. 8B and 9; and a housing cover plate 60 for attachment to the top surface 61 of the module housing 51, and securing the scanning mechanism components therewithin, while forming a scanning window 62 through which a laser beam produced from a laser beam producing module hereof can pass to the scanning element and be deflected therefrom out through the scanning window across the scan field of the resulting scanning system. Details regarding the design and construction of the scanning mechanism formed by the electromagnet 52, the scanning element 54 and the scanning element anchoring mechanism (formed by plates 57 and 58, and recess 56) are disclosed in copending application Ser. No. 08/931,694 filed Sep. 16, 1997, and incorporated herein by reference in its entirety. It is understood, however, that there are other scanning mechanisms that may be embodied within the module housing 51 described above, for use in conjunction with the laser beam producing modules of the present invention.

As shown in FIG. 8A, when scanning element mounting plates 57 and 58 are inserted within the mounting recess 59 in the module housing, the top projections 57C and 58C thereof protrude slightly above the top surface of the module housing and through aperture 63 in the housing cover plate. Screws (not shown for clarity of illustration) can then be passed through holes formed in holes 64 and 65 in the cover plate 60 and inserted into threaded holes 66 and 67 in the module housing 51. In this assembled configuration, the scanning window 62 is completely formed and provides access to the scanning element disposed within the housing. In alternative embodiments, a transparent plate can be mounted over the scanning window to prevent dust, dirt and the like from entering the scanning mechanism embodied within the module housing.

Miniature Laser Beam Scanning System Formed by Arranging a Laser Beam Producing Module of the Present Invention with a Laser Beam Scanning Module In FIG. 9, there is shown a miniature laser beam scanning system formed by arranging the laser beam producing module 70 shown in FIG. 7 with the laser scanning module 50, shown in FIG. 8A. This novel arrangement provides a laser scanning system for use in laser scanning engines of the general type disclosed, for example, in copending application Ser. No. 08/292,237 filed Aug. 17, 1994, incorporated herein by reference. As shown in FIG. 9, the output laser beam 71 from the laser beam producing module 70 is directed onto the mirror on the light deflecting element (e.g. mirror) 55 within the laser scanning module 50. As the scanning element oscillates about its anchored base portion, the laser beam 71A reflected off the mirror element 55 is scanned over the scanning region of the scanning system. Modules 70 and 50 can be mounted upon optical bench of various types employed, for example, for bar code symbol scanning systems, and the like.

Figure 7A:
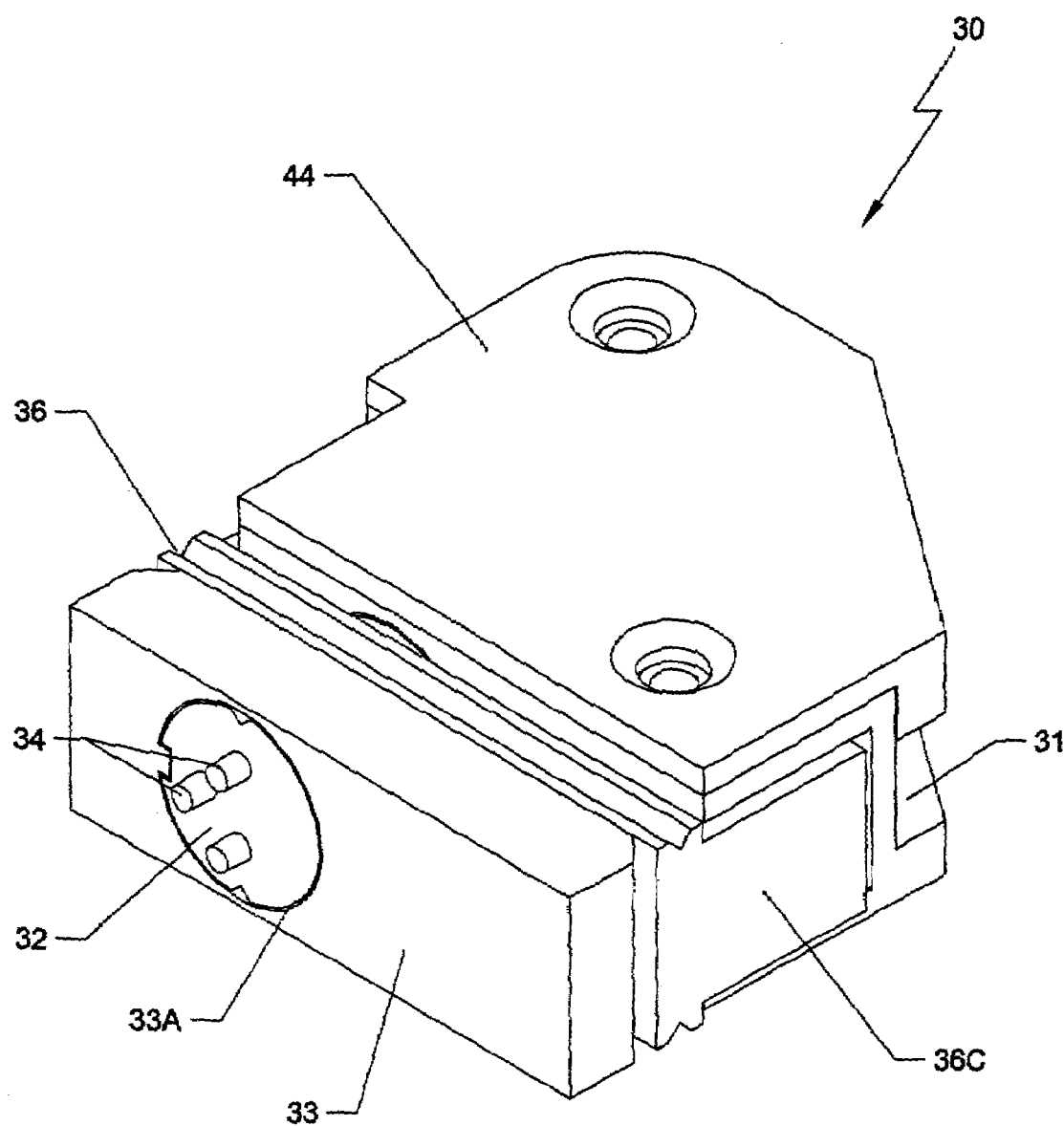
FIG. 7A is a perspective view of a second illustrative embodiment of the laser beam producing module of the present invention, wherein its VLD laser source is adjustable relative to its imaging lens (L1) and pair of stationary-mounted HOEs so that the inherently off-axis elliptical beam produced from the VLD is aligned relative to the optical axes of the HOEs in order to minimize beam dispersion and control the aspect ratio of the output laser beam in a desired manner.
Figure 10A:
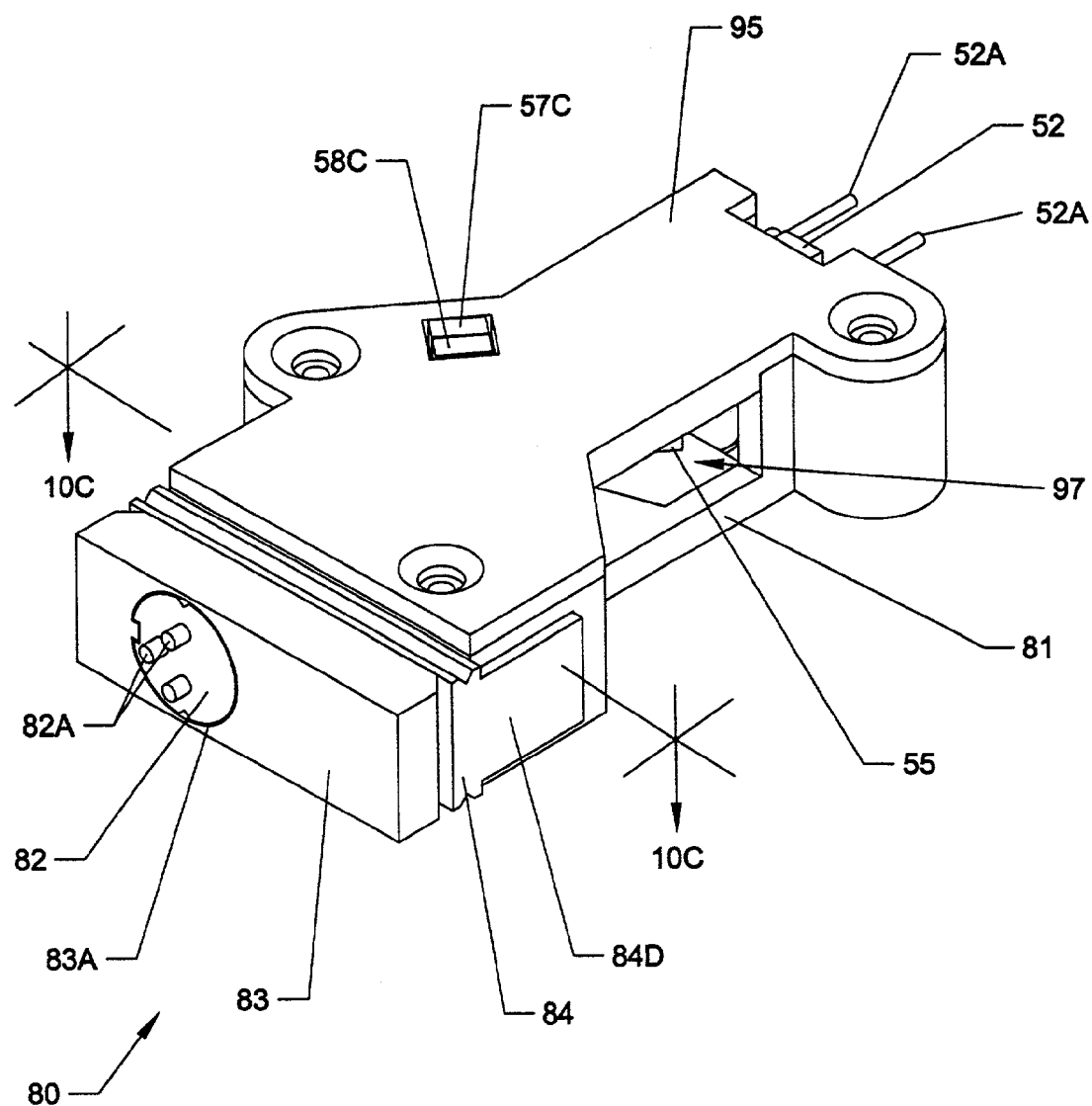
FIG. 10A is perspective view of the third illustrative embodiment of the laser beam producing module of the present invention, wherein a laser beam scanning mechanism is integrated therein and its VLD laser source is adjustable relative to its imaging lens (L1) and pair of stationary-mounted HOEs so that the inherently off-axis elliptical beam produced from the VLD is aligned relative to the optical axes of the HOEs in order to minimize laser beam dispersion, and control the aspect-ratio of the output laser beam in a desired manner.
Figure 10B:
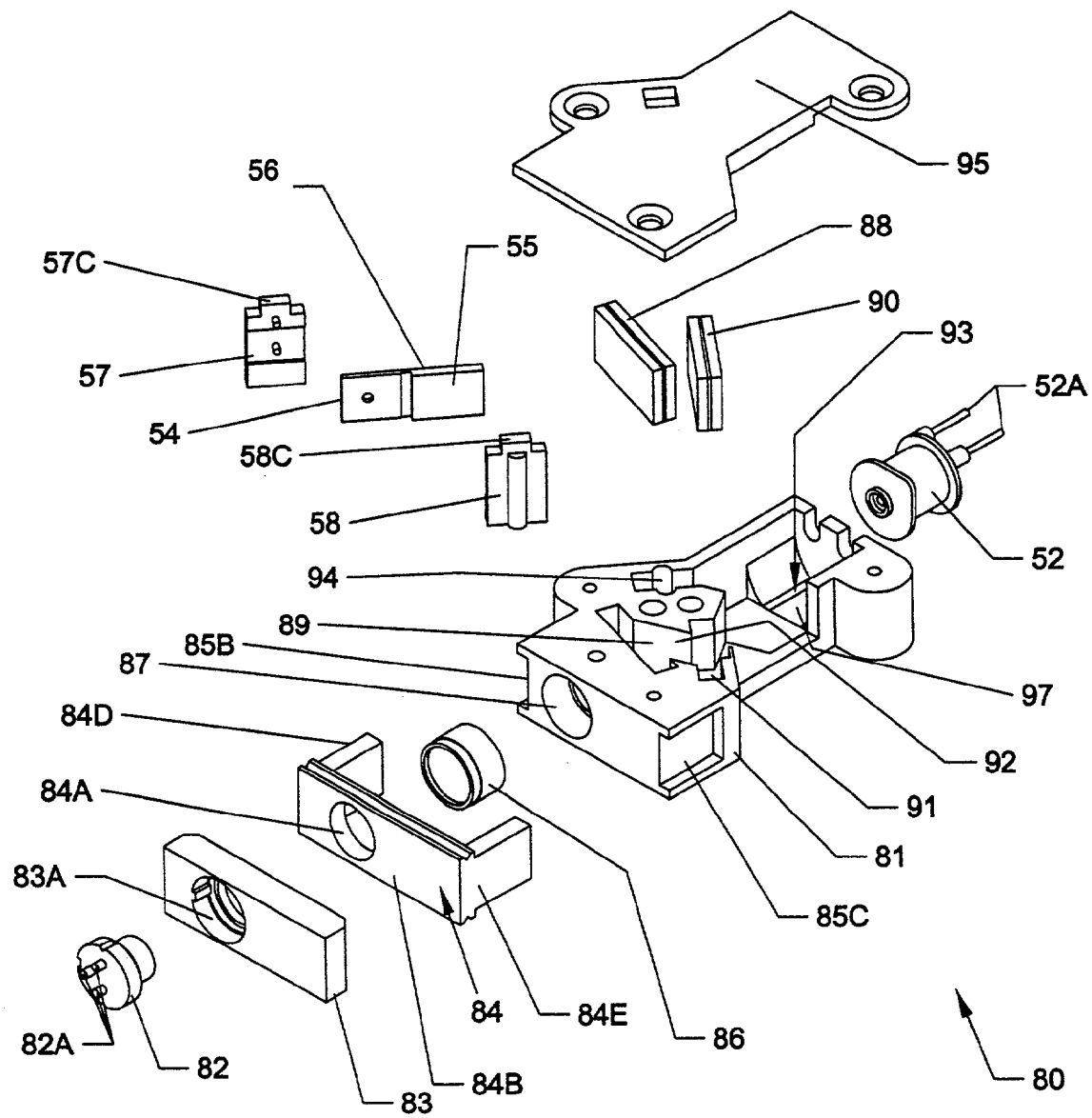
FIG. 10B is an exploded view of the laser beam producing module shown in FIG. 10A, showing its heat-sink plate, VLD, VLD-yoke, lens L1, HOES H1 and H2, optics module base, scanning element, mounting plates, electromagnet, and cover plate.
Figure 10C:
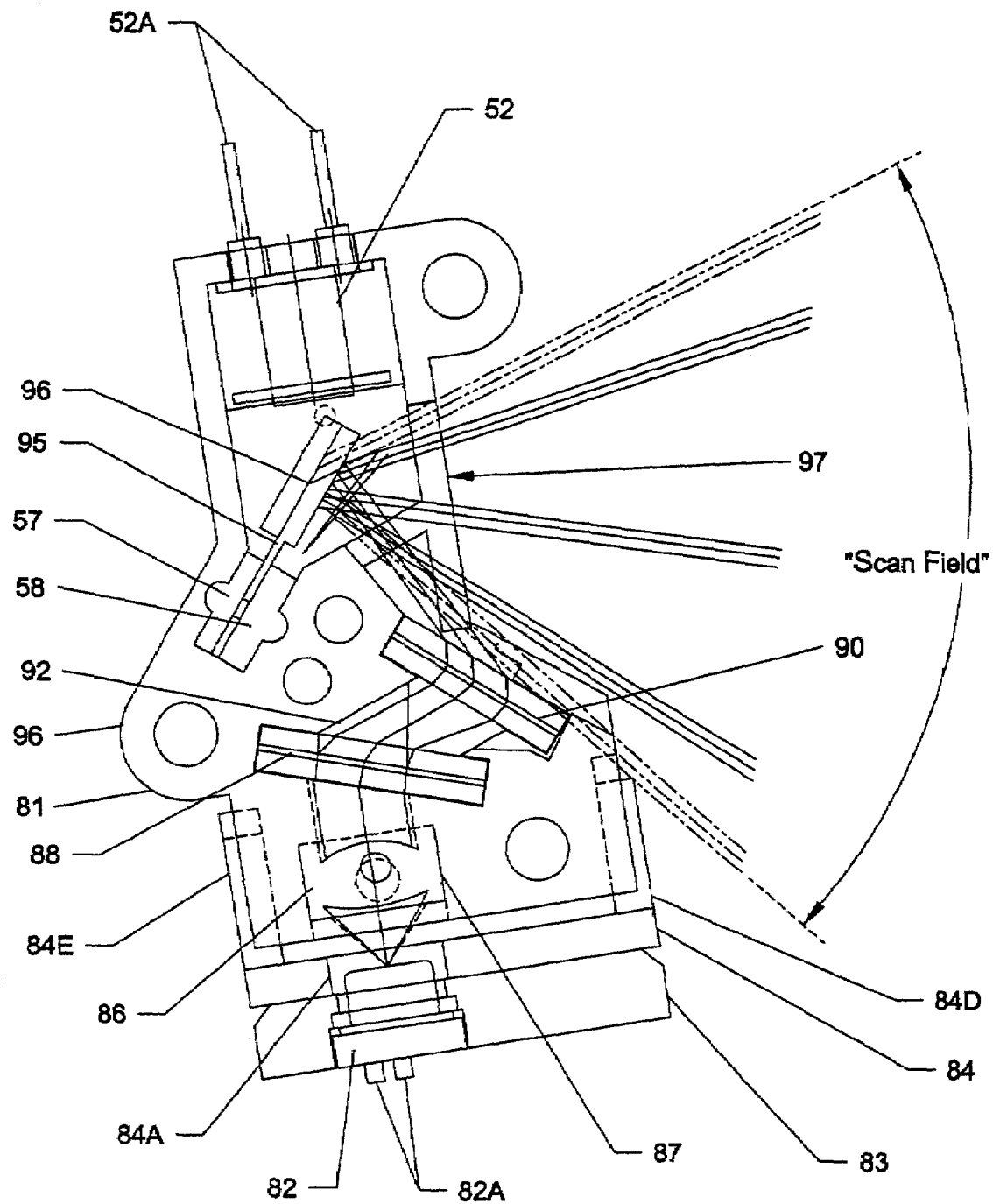
FIG. 10C is a cross-section view of the laser beam producing module taken along line 10C—10C.

Integrated Laser Beam Producing and Scanning Module According to a First Illustrative System Embodiment of the Present Invention In FIGS. 10A, 10B and 10C, a laser scanning device is shown, wherein the laser scanning subsystem shown in FIG. 8A is integrated with a laser beam producing subsystem of FIG. 7A. As shown, integrated scanning device 80 comprises an assembly of subcomponents, namely: a module housing 81 made of lightweight plastic and serving as an optical bench for the optical components within the laser beam producing and scanning systems alike; a VLD 82 mounted to a VLD heat-sinking plate 83 through aperture 83A and producing a visible laser beam having elliptical, eccentric, divergent, and astigmatic beam characteristics in response to a voltage source applied to terminals 82A by way of a flexible circuit or other conductive structures well known in the art; a mounting bracket 84 having an aperture 84A for receiving a portion of the casing of the VLD 82 and a plane surface 84B affixing the associated heat-sinking plate 83 thereto, and also having side projections 84D and 84E for slidable receipt within spaced apart recesses 85B and 85C formed in the rear portion of the module housing 81; a collimating lens L1 86 for focusing the laser beam produced from the VLD; fixed spatial-frequency HOE H1 88, securely mounted within a first mounting slot 89 formed in the module housing 81, for modifying the beam characteristics of the laser beam output from collimating lens L1 86; fixed spatial-frequency HOE H2 90, securely mounted within a second mounting slot 91 formed in the module housing 81, for modifying the beam characteristics of the laser beam produced from HOE H1 to produce the output laser beam; a radiation-absorbing wall surface 92 formed in the module housing, aligned with the zeroeth-order diffraction beam from HOE H1, and absorbing the zeroeth-order diffraction beam produced from HOE H1; electromagnetic (i.e. coil) 52 mounted within recess 93 in the module housing, for producing a magnetic force field in response to electrical current supplied to the input terminals thereof; scanning element 54 supporting light deflecting element (e.g. mirror, hologram, refractive element, etc.) 55 on the front surface of its free end, and permanent magnetic element 56 on the rear surface of its free end; mounting plates 57 and 58 for clamping the base portion of the scanning element 54, and mounting the same within recess 94 formed within the module housing 81; and a housing cover plate 95 for attachment to the top surface 96 of the module housing 81, and securing the laser beam producing and scanning mechanism components therewithin, while forming a scanning window 97 through which a scanned laser beam can be projected out into a scan field for scanning.

Figure 10D:
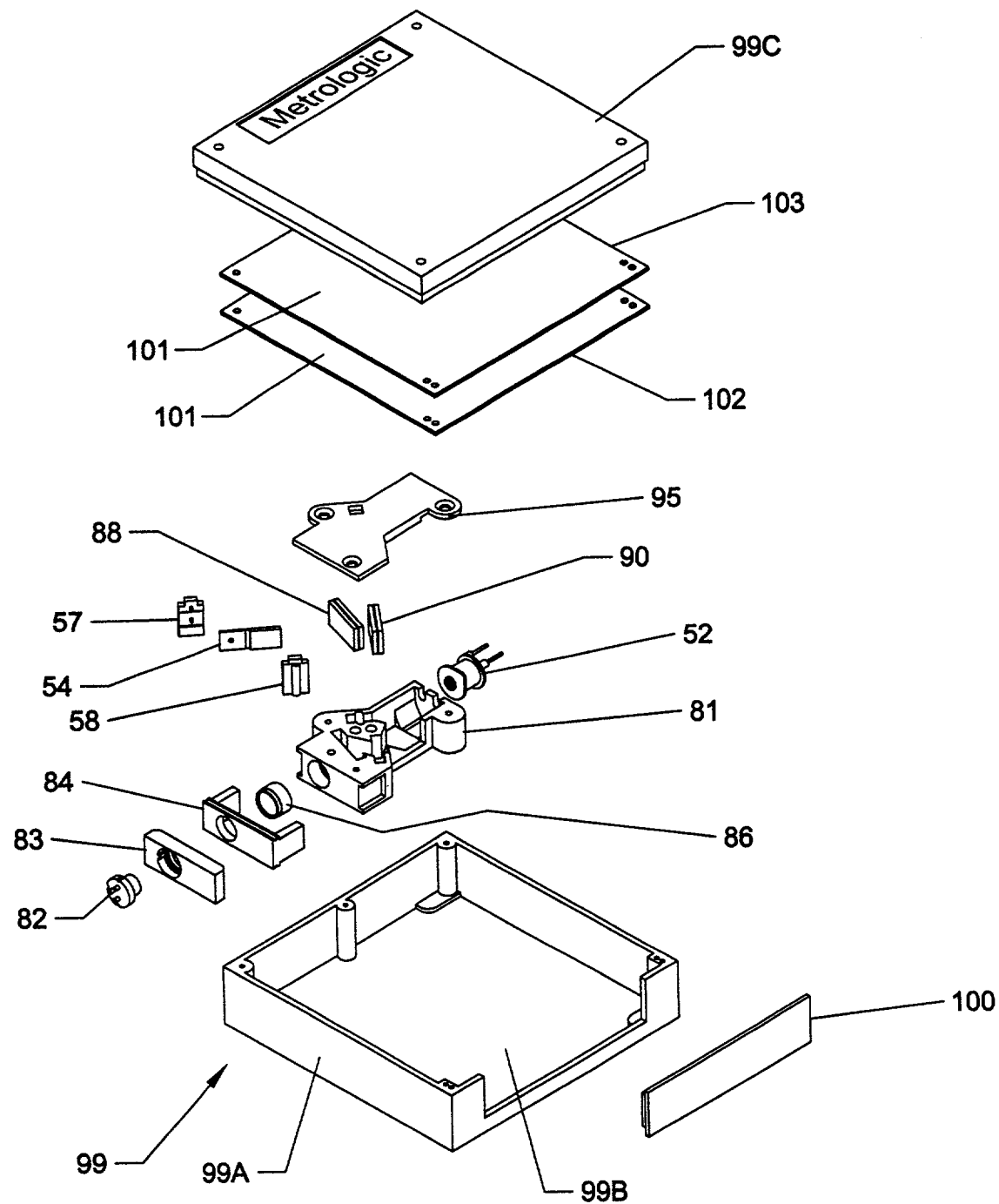
FIG. 10D is an exploded perspective view of the laser beam producing module of FIG. 10A mounted within a miniature housing of a laser beam scanning engine.

In FIG. 10D, the subcomponents of integrated scanning engine are shown mounted within a miniature housing 99 having a base portion 99A and cover plate 99C. Typically, the length, and width dimensions of the housing 99 will be substantially smaller than a matchbox and can be realized as small as a sugar-cube using presently available enabling technology. As shown, a plastic window or filter 100 can be mounted over the scanning window to protect entry of dust, dirt and the like into the interior of the scan engine where there are optical components. Module housing 81 can be mounted to the bottom half of the scan engine housing 99A shown in FIG. 10D. The scan engine can include a photodetector, analog and digital signal processing circuits 101 realized or printed circuit boards 102 and 103, as taught in copending application Ser. No. 08/292, 237 filed on Aug. 17, 1994.

Laser Beam Producing Module for Producing a Stigmatic Laser Beam Having Focus Control, Controlled Aspect-Ratio and Zero Beam Dispersion (CASE B)

In FIGS. 11A, 11B and 11C, an illustrative embodiment of the laser beam production System Embodiment Nos. 2 and 6 of FIGS. 2B and 2F) is disclosed. It is understood, however, that designs according to System Embodiments 3, 7, 9 and 11 may be used as well in the construction of this class of laser beam producing module.

As shown in FIGS. 11A through 11C, this optical system is realized in the form of a miniature laser beam producing module 110 comprising an assembly of subcomponents, namely: a module housing 111 made of lightweight plastic and serving as an optical bench for the optical components within the laser beam producing system; a VLD 112 mounted to a VLD heat sinking plate 113 through aperture 113A and producing a visible laser beam having elliptical, eccentric, divergent and astigmatic beam characteristics in response to a voltage source applied to terminals 112A by way of a flexible circuit or like structure well known in the art; a mounting bracket 114 having an oversized aperture 114A for receiving a portion of the casing of the VLD 112 and planar surface 114B for affixing the associated heat-sinking plate 113 thereto, and also having side projections 114C and 114D for slidable receipt within spaced apart recesses 115C and 115D formed in the rear portion of the module housing; a focusing lens L1 116 for focusing the laser beam produced from the VLD; a bore 117 formed in module housing 111 for mounting lens L1 116 therein; fixed spatial-frequency HOE H1 118, securely mounted within a first mounting slot 119 formed in the module housing 111, for modifying the beam characteristics of the laser beam output from focusing lens L1 116; fixed spatial-frequency HOE H2 120, fixedly mounted within a second mounting slot 121, formed in the module housing 111, for modifying the beam characteristics of the laser beam produced from HOE H1; a focusing lens L2 122 mounted within a lens-support bracket 123, slidably mounted within a third mounting slot 124 formed in the module housing, for adjustable movement of lens L2 122 along the optical axis of HOE H2 120 to adjust the focal-length of output laser beam; a radiation-absorbing wall surface 126 formed in the module housing, aligned with the zeroeth-order diffraction beam from HOE H1, and absorbing the zeroeth-order diffraction beam produced from HOE H1; and a housing cover plate 127 for attachment to the top portion of the module housing 111 and securing HOEs H1 and H2 and focusing lens L2 therein.

In an illustrative embodiment of this system design, VLD 112 can be realized using a SONY Model SLD1122VS laser diode, the focusing lens L1 116 can be realized using a 4.35 mm lens, and the focusing lens L2 122 can be realized using a 250 mm lens, to provide an output focal distance of about 10 inches from the module. The HOEs H1 and H2 can be made using DCG recording material, of 5 microns film thickness, at a construction wavelength of 480 nanometers. These volume transmission holograms can be mounted between a pair of ultra-small plates made from float glass. It is understood, however, that other embodiments of this system design can be made using different types of components and materials, having different design parameters selected or determined for the particular application at hand.

As shown in FIG. 11C, during assembly and alignment of the laser beam producing module 110, the distance between VLD 112 and lens L1 116 is adjusted by sliding the VLD mounting bracket 114 within the pair of recesses 115C and 115D in the module housing, and the distance between the lens L2 122 and HOE H2 120 is adjusted by sliding lens-support bracket 124 within the recess 124 in module housing along the optical axis of HOE H2. As will be explained in greater detail hereinafter, these parameter adjustment mechanisms are employed while the optics system is mounted on an optical bench specially crafted for aligning such parameters.

Laser Beam Producing Module for Producing a Stigmatic Laser Beam Having Focus Control, Controlled Aspect-Ratio, Zero Beam Dispersion, and Adjustable Focal-Length (CASE C)

Figure 12B:
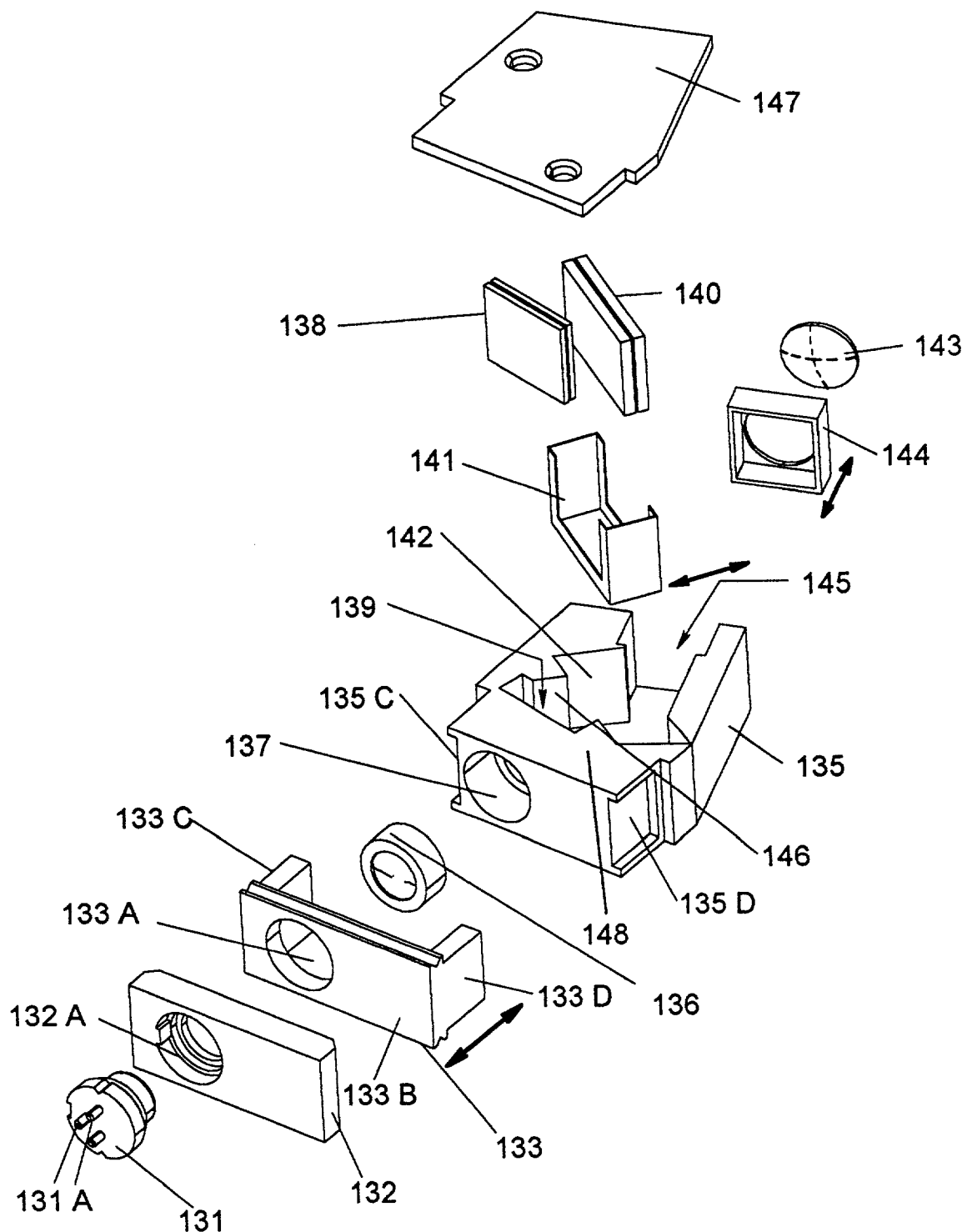
FIG. 12B is an exploded view of the laser beam producing module shown in FIG. 12A showing its subcomponents and mechanisms enabling the adjustment of the position of the VLD relative to the lens L1, the position of HOE H2 relative to HOE H1, and the focal length of lens L2 which can be realized as a compound lens system.
Figure 12C:
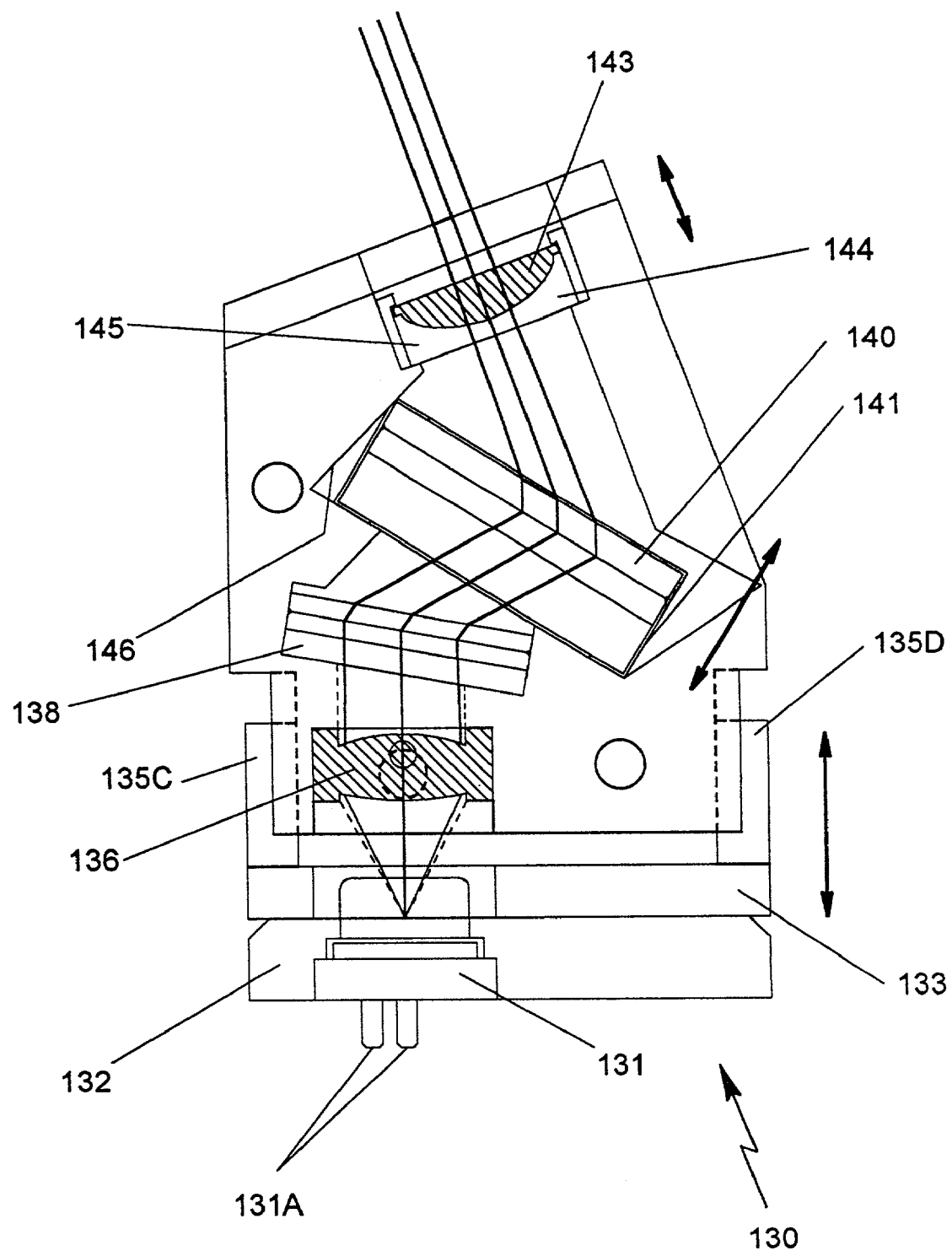
FIG. 12C is a cross-section view of the laser beam producing module taken along line 12C—12C shown in FIG. 12A.

In FIGS. 12A, 12B and 12C, an illustrative embodiment of the laser beam production System Embodiment Nos. 4 and 8 of FIGS. 2D and 2H) is disclosed. It is understood, however, that such a design can be realized using System Embodiment Nos. 10 and 12, as well.

As shown in FIGS. 12A, 12B and 12C, this optical system is realized in the form of a miniature laser beam producing module 130 comprising an assembly of subcomponents, namely: a module housing 135 made of lightweight plastic and serving as an optical bench for the optical components within the laser beam producing system; a VLD 131 mounted to a VLD heat sinking plate 132 through aperture 132A and producing a visible laser beam having elliptical, divergent, eccentric, and astigmatic beam characteristics in response to a voltage source applied to terminal 131A by way of a flexible circuit or like conductive elements well known in the art; a mounting bracket 133 having an aperture 133A for receiving a portion of the casing of the VLD 131 and, a planar surface 133B for affixing the associated heat-sinking plate 132 thereto, and also having side projections 133C and 133D for slidable receipt within spaced apart recesses 135C and 135D formed in the rear portion of the module housing; a focusing lens L1 136 for focusing the laser beam produced from the VLD; a bore 137 for mounting lens 136 within the module housing; fixed spatial-frequency HOE H1 138, securely mounted within a first mounting slot 139 formed in the module housing 135, for modifying the beam characteristics of the laser beam output from focusing lens L1 136; fixed spatial-frequency HOE H2 140, mounted within a HOE-support bracket 141 that is slidably mounted within a second mounting slot 142 formed in the module housing 135, for adjustable movement relative to HOE H1 138 (during assembly/alignment) in order to modify the beam characteristics of the laser beam produced from HOE H1; a focusing lens L2 143 mounted within a lens-support bracket 144 that is slidably mounted within a third mounting slot 145 formed in the module housing, for adjustable movement along the optical axis of the system; a radiation-absorbing wall surface 146 formed in the module housing, aligned with the zeroeth-order diffraction beam from HOE H1, and absorbing the zeroeth-order diffraction beam produced from HOE H1; and a housing cover plate 147 for attachment to the top portion 148 of the module housing 135 and securing HOEs H1 and H2 and focusing lens L2 therein.

In an illustrative embodiment, the VLD can be realized using a SONY Model SLD1122VS laser diode, the focusing lens L1 can be realized using a 4.35 mm lens, and the focusing lens L2 is realized using a 250 mm lens. The HOEs H1 and H2 can be made using DCG recording material, of about 5 microns thickness, at construction wavelength 488 nanometers. These volume transmission holograms can be mounted between a pair of ultra-small plates made from float glass. It is understood, however, that other embodiments of this system design can be made using different types of components and materials, having different design parameters selected or determined for the particular application at hand.

As shown in FIG. 12C, during assembly and alignment of the laser beam producing module 130, the distance between VLD 131 and lens L1 136 is adjusted by sliding the VLD mounting bracket 133 within the pair of recesses 135C and 135D in the module housing, and the distance between the lens L2 and HOE H2 140 is adjusted by sliding lens-support bracket 144 within the recess 145 in module housing, and the distance between HOE H2 and HOE H1 is adjusted by sliding HOE support bracket M1 within recess 142 in the module housing. As will be explained in greater detail hereinafter, these parameter adjustment mechanisms are employed while the system is mounted on an optical bench specially crafted for aligning such parameters.

The design methods of the present invention provide a way of determining the design and construction parameters for the laser beam producing system of the present invention. However, by virtue of the fact that properties of the VLD are not easily ascertainable in practice, such methods cannot be used to compute the distance between the VLD and lens L1 which results in an output laser beam having zero dispersion and a desired aspect ratio.

Figure 13:
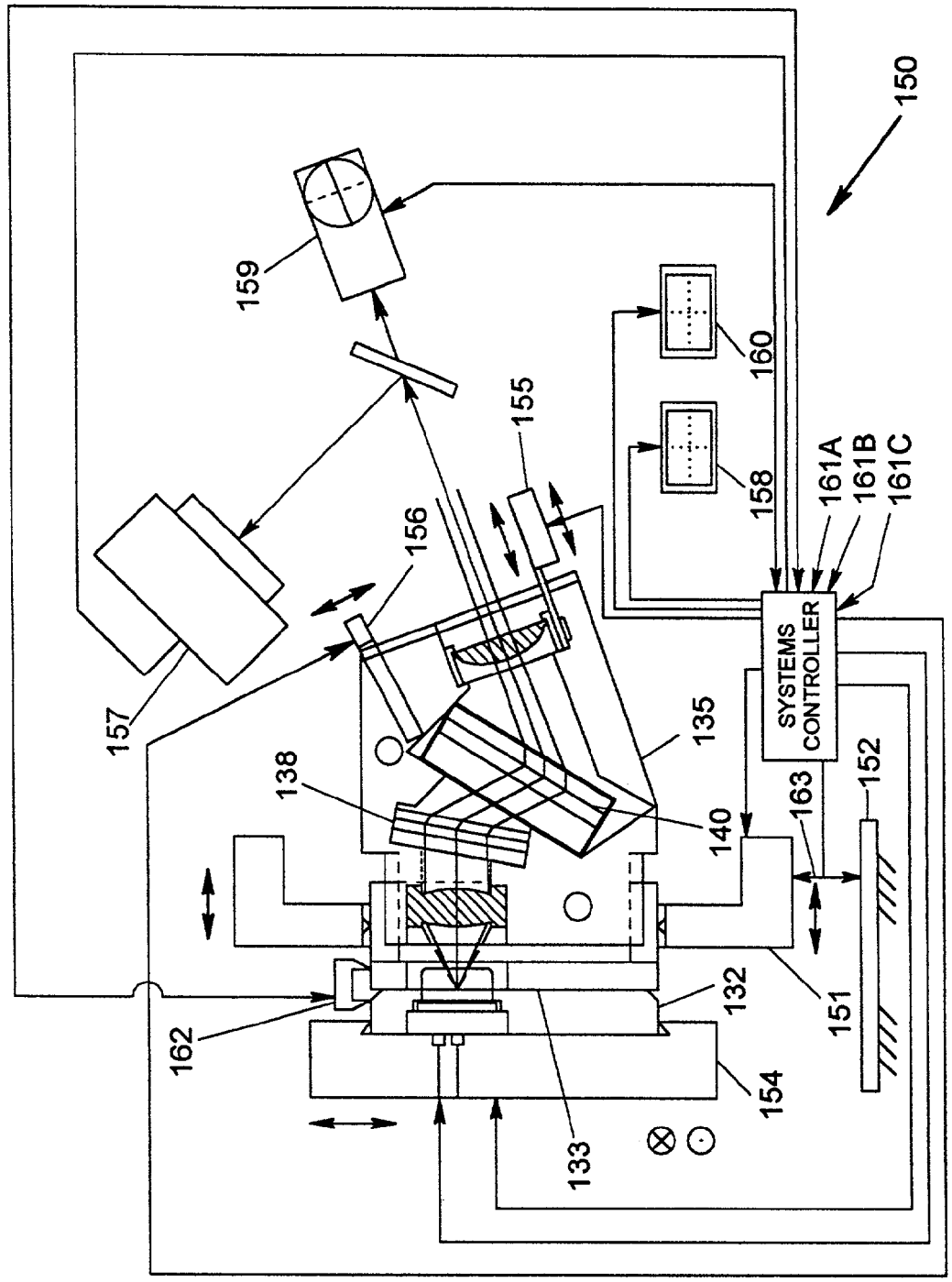
FIG. 13 is a schematic representation of a parameter adjustment system for aligning the optical components within the various types of laser beam producing modules of the present invention disclosed herein.

The Parameter Adjustment System Used During the Module Assembly and Alignment Procedure of the Present Invention In FIG. 13, a computer-controlled parameter adjustment system of the present invention is shown. For purposes of illustration only, this system is shown in FIG. 13 with a laser beam producing module of FIGS. 12A–12C (embodying System Embodiment No. 4 for illustration only) mounted to the fixtures of the system. This case was selected because this module requires the maximum number of parameters to be adjusted, thus implicating all of the functions of the parameter adjustment system. As will be illustrated, however, the parameter adjustment system can be used to adjust the parameters of any one of the illustrated embodiment of the present invention in a rapid, highly efficient manner, thereby making the laser beam producing modules hereof suitable for mass production.

As shown in FIG. 13, the parameter adjustment system 150 comprises a number of subsystems and subcomponents, namely: a module support platform 151 for supporting and translating (in the z direction during the "loading stage") the module housing (e.g. 135) of each laser beam producing module (being assembled and adjusted); a VLD support platform 154 for adjustably supporting the VLD (and its mounting structure) along three-coordinate axes relative to the stationary module housing support platform 151 and lens L1; a lens L2 support platform 155 for supporting and translating second lens L2 of the laser beam producing module along one-coordinate axis relative to the stationary module housing support platform 151; a HOE support platform 156 for supporting and translating HOE H2 of the laser beam producing module along one-coordinate axis (i.e. optical axis) relative to the module housing support platform 151 (i.e. along the optical axis of the system); a beam profiler 157 (such as, for example, Model 0180-XYS Beam Scan from Photon, Santa Clara, Calif.) having a beam scan display monitor 158 connected thereto; a quadrant detector 159 having a quadrant detector display 160 connected thereto; a first computer-controlled translation mechanism 161A for translating the VLD support platform 154 relative to module housing support platform 151 during analysis of the laser beam output from the HOE-based subsystem of the laser beam producing module 153 using the beam scanner 157 and quadrant detector 159; a second computer-controlled translation mechanism 161B for translating the lens L2 support platform 155 relative to module housing support platform 151 during analysis of the laser beam output from the HOE-based subsystem of the laser beam producing module 153 using the beam scanner 157 and the quadrant detector 159; and a third computer-controlled translation mechanism 161C for translating the HOE support platform 156 relative to module housing support platform 151 during analysis of the laser beam output from the HOE-based subsystem of the laser beam producing module 153 using the beam scanner 157 and the quadrant detector 159. As will be explained hereinafter, certain of these subsystems are not employed when adjusting the parameters of particular laser beam producing modules of the present invention, while other of these subsystem are employed when aligning the components of other types of laser beam producing modules. Such details will be described below.

Figure 7B:
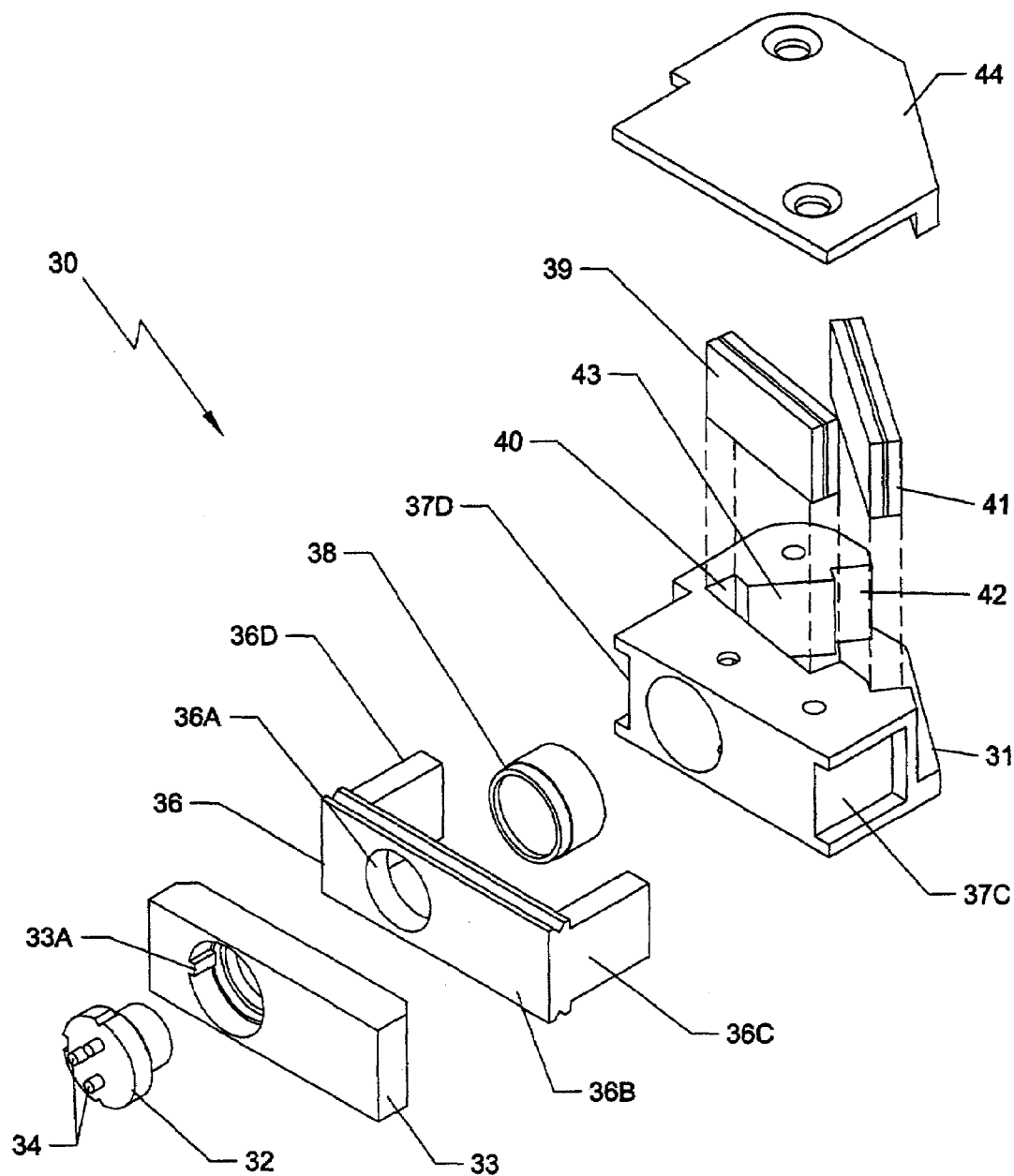
FIG. 7B is an exploded view of the laser beam producing module of the present invention shown in FIG. 7A, showing its heat-sink plate, VLD, VLD-yoke, lens L1, HOES H1 and H2, optics module base, and cover plate.
Figure 7C:
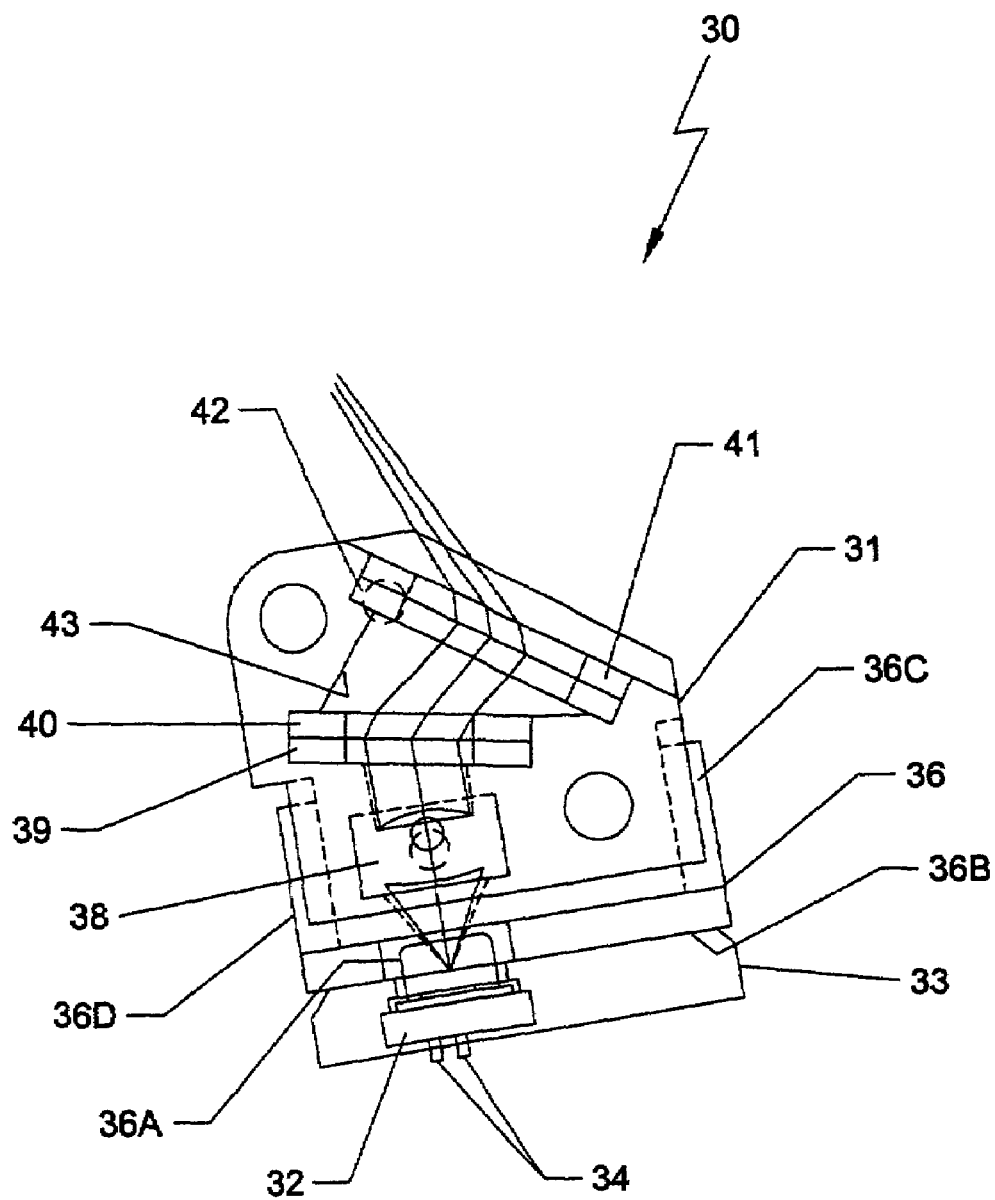
FIG. 7C is a plan view of the laser beam producing module shown in FIG. 7A.
Figure 14:
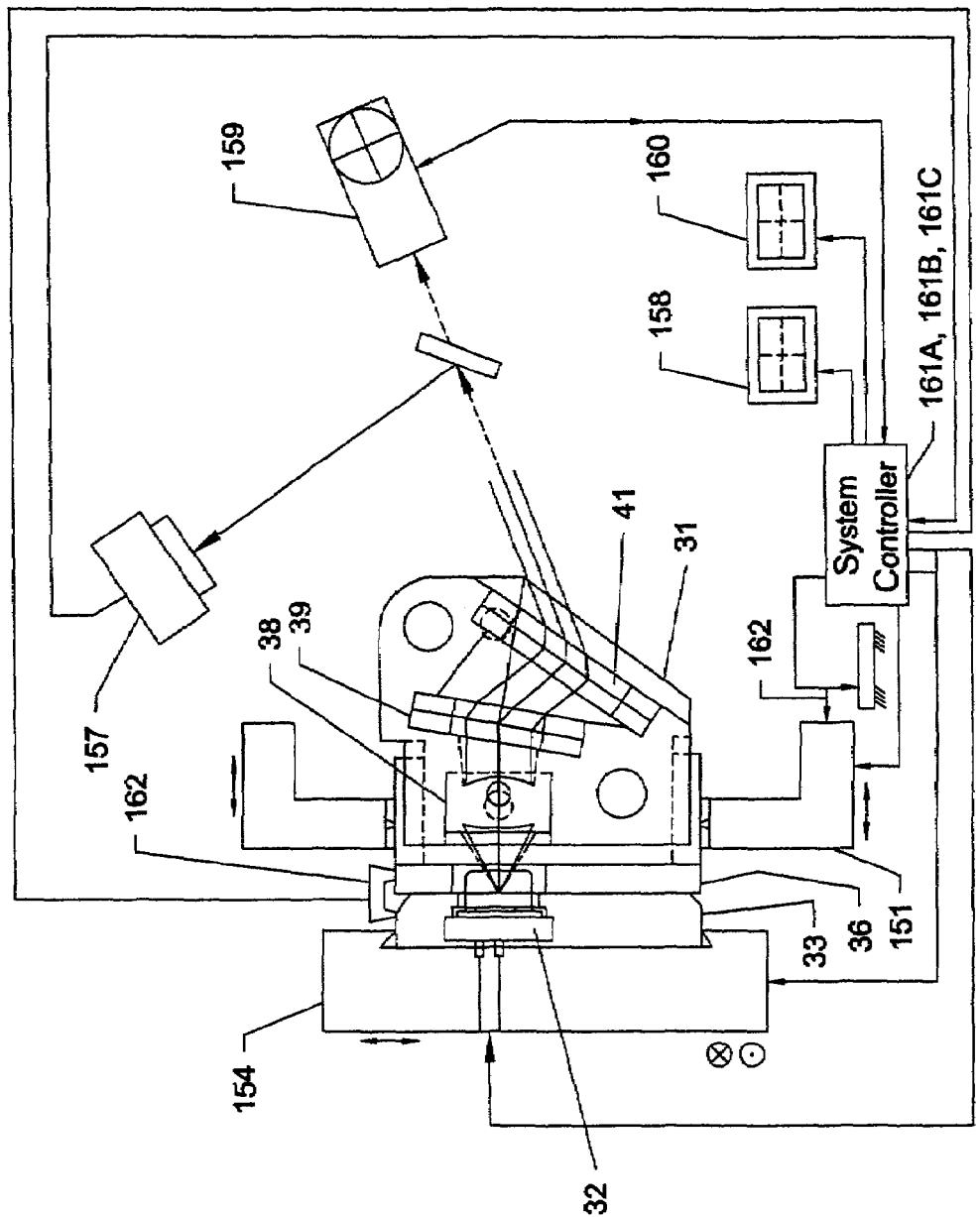
FIG. 14 is a schematic diagram of the laser beam producing module of FIG. 7A installed upon the parameter adjustment system of FIG. 13, for aligning optical components in the module so that laser beam dispersion is minimized and the aspect-ratio of the output laser beam is controlled in a desired manner.
Figure 15:
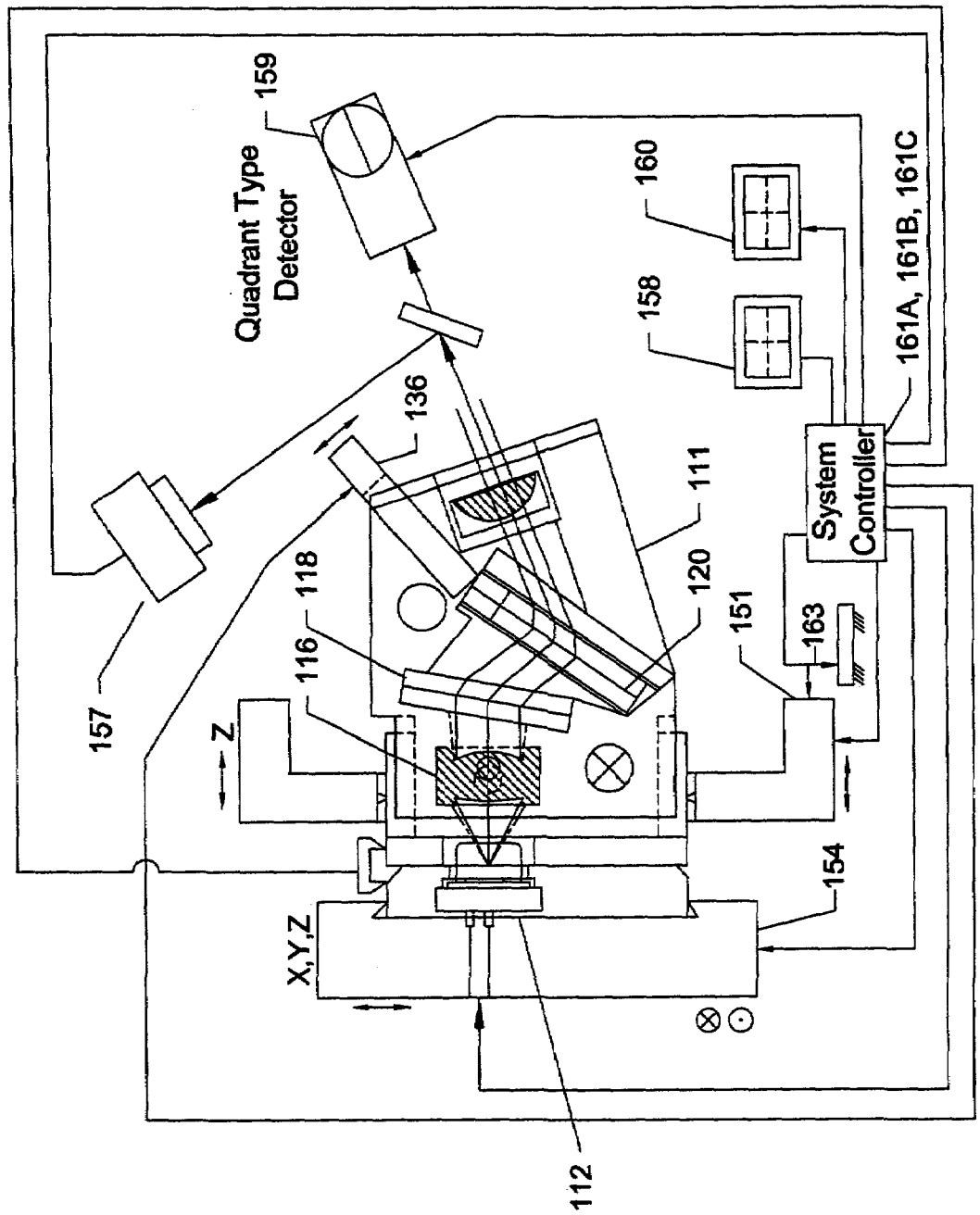
FIG. 15 is a schematic diagram of the laser beam producing module shown in FIG. 11A installed upon the parameter adjustment system of FIG. 13, for aligning optical components of the module so that laser beam dispersion is minimized, the aspect-ratio of the output laser beam is controlled in a desired manner, and astigmatism in the output laser beam is corrected, e.g. eliminated.
Figure 16:
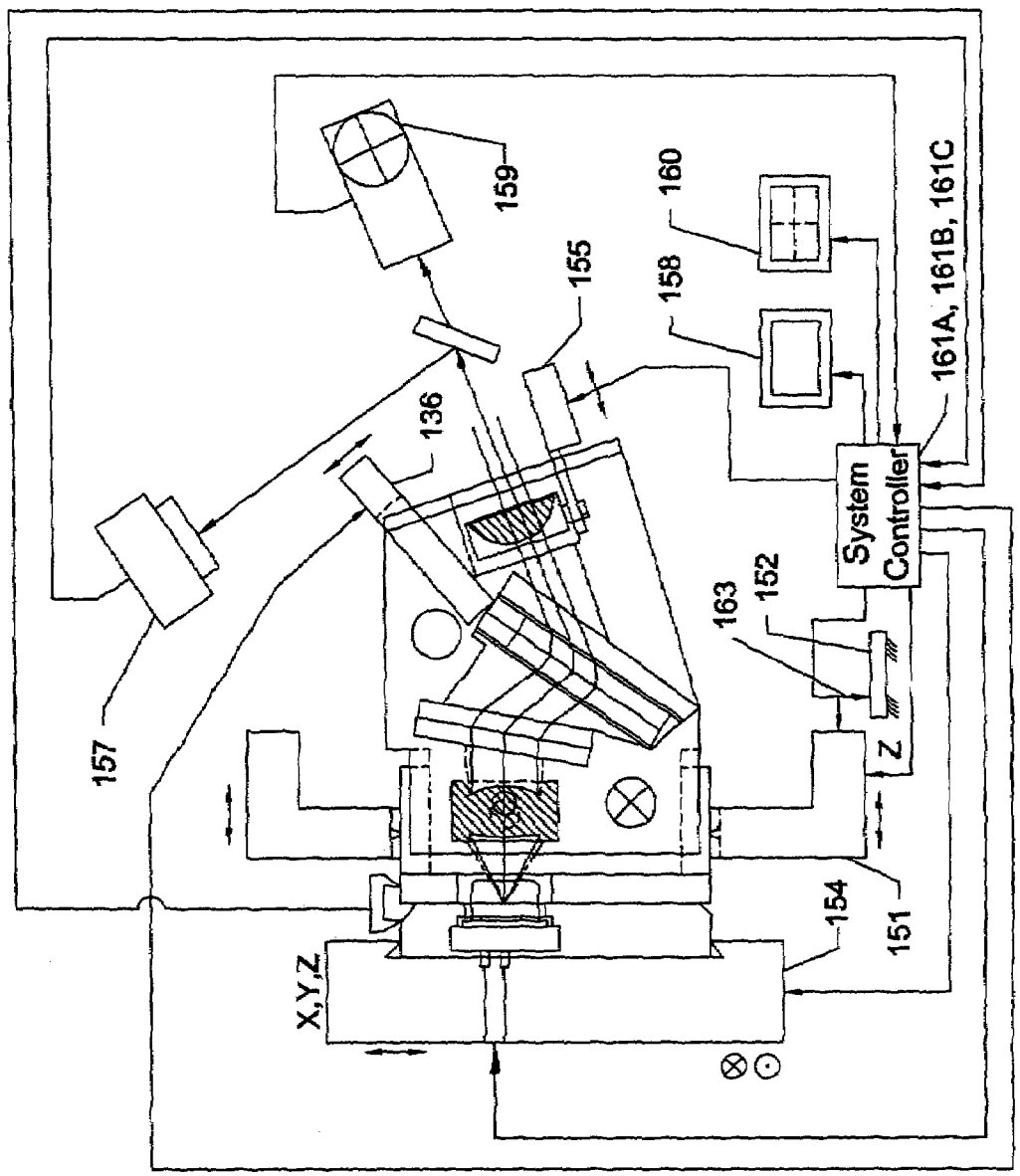
FIG. 16 is a schematic diagram of the laser beam producing module shown in FIG. 12A installed upon the parameter adjustment system of FIG. 13, for aligning the optical components of the module so that laser beam dispersion is minimized, the aspect-ratio of the output laser beam is controlled in a desired manner, astigmatism in the output laser beam is corrected, and adjustment of the focal-length of the resulting stigmatic beam is achieved.

Method of Assembling and Aligning the Subcomponents of Laser Beam Producing Systems of the Illustrative System Embodiments of the Present Invention Design for Instances where Focusing Control is Desired and Astigmatism Correction and Delta-Focusing are not Desired (System Embodiments Nos. (1) and (5): CASE A In general, when assembling a laser beam producing module based on System Embodiments Nos. 1 and 5, the below described parameter adjustment procedure can be used in conjunction with the parameter adjustment system of FIG. 13. The procedure comprises a prealignment stage and an alignment stage. During the prealignment stage, the various optical components of the laser beam producing module are installed within their respective mounting locations within the module housing, or within support structure associated with the parameter adjustment system 150. During the alignment stage, the VLD and lens L1 are aligned in order to achieve the performance characteristics considered during the design stage. Referring to FIG. 14, the details of each of these stages will be described below for System Embodiment Nos. 1 and 5. In FIG. 14, the module of FIGS. 7A–7C is shown mounted within the fixture of the parameter adjustment system as it embodies System Embodiment Nos. 1 and 5 in their entirety.

Pre-Alignment Stage of the Assembly Procedure for System Embodiment Nos. 1 and 5

The first step of the pre-alignment stage of the system assembly procedure involves press fitting the VLD 32 into VLD heat-sink plate 33 so that the VLD junction is arranged in a predetermined orientation relative to the VLD heat-sink plate.

The second step of the prealignment stage involves mounting HOE H1 (39) and HOE H2 (41) into their appropriate mounting slots 40 and 42 formed within module housing 31. Thereafter, the HOEs can be glued or otherwise fixed in position. The third step of the prealignment stage involves inserting lens L1 into the lens recess (e.g. pocket) formed within the module housing. Thereafter, the lens L1 can be glued or otherwise fixed in position.

The fourth step of the prealignment stage involves placing the VLD mounting bracket (i.e. yoke) 36 into appropriate recesses 37C and 37D formed in the module housing. Notably, the VLD mounting bracket is held within such recesses by frictional fit and can only be translated along (z) axis of the parameter alignment system (i.e. the x and y directions being fixed by the geometry of these recesses.

The fifth step of the prealignment stage involves placing the module housing 31 onto the module housing support platform 151 so that pins on the bottom surface of the housing module 31 align with corresponding holes formed on the housing module support platform 151. When housing module 31 is installed in the manner described above, the module housing 31 is then clamped to the module housing support platform 151 by way of screws, pressurized clamps or other releasable fastening devices.

The sixth step of the prealignment stage involves clamping the yoke 36 to affixed holder 164.

The seventh and last step of the prealignment stage involves attaching the VLD 32 to VLD support platform 154 of the parameter alignment system. In the preferred embodiment, this step can be achieved by sliding the leads of the VLD into a connector provided on the VLD support platform and secured by clamping, etc. The VLD support platform 154 is capable of movement along the x, y and z axes of the parameter adjustment system 150.

The Alignment Stage of the Assembly Procedure for System Embodiments Nos. 1 and 5

The first step of the alignment stage of the system assembly procedure involves sliding the module housing support platform 151 towards VLD support platform 151 under the control of microcontroller 161 until the VLD 32 is positioned within oversized aperture 36A formed within the VLD support 36 positioned within the recesses of the module housing. Notably, at this "load" position, the VLD 32 is free to move within the x and y plane by virtue of the oversized aperture in the VLD mounting yoke, and also along the z axis by virtue of clearance provided between the premounted lens L1 and the outer face of the VLD mounting yoke. As will become apparent hereinafter, such clearance enables the optical axis of each loaded VLD to be aligned with the optical axis of lens L1 as well as attaining the required distance which achieves the desired focus (for System Embodiment Nos. 1 and 5) or control of astigmatism (for all System Embodiments except Nos. 13 and 14) as specified during the design stage described in detail above.

The second step of the alignment stage of the procedure involves locking the position the module housing support platform 151 relative to the underlying optical bench 151 (arranged in its "loaded" configuration). This locking operation can be carried out using a computer-controlled locking mechanism 163 known in the art.

The third step of the alignment stage of the procedure involves locking the VLD heat-sink plate 32 to the VLD support platform 154 locking using mechanism 162 so that the VLD heat-sink plate is prevented from undergoing rotation in the x-y plane during alignment of the VLD relative to the lens L1 during the subsequent steps of the alignment procedure. This condition will ensure that the VLD junction is prevented from rotation during the alignment procedure, which may involve translation of the VLD junction in the x, y and/or z axes of the system in order to secure the performance parameters of the module established during the design stage.

The fourth step of the alignment stage of the procedure involves applying a biasing force on the VLD support yoke 36 (in the direction of the VLD heat-sink plate 33) so that the plate-like portion of the VLD support yoke gently engages the VLD heat-sink plate 33 in order that the surface of the VLD heat-sink plate and planar portion of the VLD support yoke assume the same z coordinate position during x, y alignment operations, while permitting relative movement between these two plate-like structures along the x-y plane of the system.

The fifth step of the alignment stage of the procedure involves supplying electrical power to the VLD 32 so that it produces a laser beam which is transmitted through lens L1 and HOEs H1 and H2.

The sixth step of the alignment stage of the procedure involves translating the VLD support platform 154 in the x-y plane until the output laser beam strikes the center of the quadrant detector 159, which has been prealigned relative to the locked-in-position module housing 31 so that first diffraction order beam from HOE H2 (i.e. the optical axis thereof disposed in the plane of diffraction at diffraction angle $\theta_{d2}$) passes through the center of the quadrant-type photodetector 159. When the output laser beam strikes the center of the quadrant-type photodetector, then the design geometry will be achieved, resulting in minimum beam dispersion and the desired amount of beam shaping by design. Also optimal output power will be transmitted from the module along the optical axis of the system. This condition is based on the reasonable assumption that the diffraction efficiency of HOEs H1 and H2 will be maximum along the first diffraction order by design, and characteristic wavelength of the VLD is substantially the same as the reconstruction wavelength of HOEs H1 and H2. Notably, this on-center aligned position can be visually detected when the indicator dot on the quadrant detector display unit 160 is aligned with the crosshair thereof. Completion of this step of the procedure will ensure that output power from the laser beam producing module will be as close to the output of the VLD as is practically possible, as well as ensuring that the design requirements have been satisfied.

The seventh step of the alignment stage of the procedure involves gluing or otherwise permanently securing the x-y position of the VLD heat-sinking plate 33 and VLD support bracket 36 in the position determined during the step above. Thereafter, the biasing force applied during the above step of the procedure can be removed.

The eighth step of the alignment stage of the procedure involves adjusting the position of the subassembly (comprising the VLD 32, the VLD heat-sink plate 32 and the VLD support yoke 36) along the z axis of the parameter adjustment system while monitoring the output laser spot at the desired focal length of the module using a beam profiler (i.e. profiling instrument) 157, as identified above. When the spot size of the output laser beam at the desired focal length is minimum (along either the x or y axis of the system, not both), then VLD support yoke 36 is glued or otherwise fixed in position relative to the module housing 31. Thereafter, the housing cover plate 44 is fastened upon the module housing and then the aligned laser beam producing module is removed from the parameter adjustment system and is ready for use in the system 150 for which it has been designed.

Method of Assembly and Aligning the Subcomponents of Laser Beam Producing Systems of the Illustrative System Embodiments of the Present Invention Designed for Instances where Astigmatism Correction and Focus Control are Desired, but not the Adjustment of the Laser Beam Focal Length: System Embodiment Nos. (2), (3), (6), (7), (9) and (11): CASE B In general, when assembling a laser beam producing module based on System Embodiments Nos. 2 and 6, the parameter adjustment procedure of the present invention can be carried out on the module design shown in FIGS. 11A–11C supported upon the parameter adjustment system of FIG. 13. When assembling a laser beam producing module based on System Embodiments Nos. 9 and 11, the parameter adjustment procedure of the present invention can be carried out on the module design similar to that shown in FIGS. 11A–11C (but with lens L2 disposed between H1 and h2) supported upon the parameter adjustment system of FIG. 13. Also, when assembling a laser beam producing module based on System Embodiments Nos. 3 and 7, the parameter adjustment procedure of the present invention can be carried out on the module design similar to the module shown in FIGS. 12A through 12C (without lens L2) supported upon the parameter adjustment system of FIG. 13.

For each of these groups of system embodiments, the assembly procedure comprises a realignment stage and an alignment stage. During the prealignment stage, the various optical components of the laser beam producing module are installed within their respective mounting locations within the module housing, or within support structure associated with the parameter adjustment system 150. During the alignment stage, the VLD and lens L1 are aligned, as well as HOE H2 relative to HOE H1 (and L2 where applicable) in order to achieve the performance characteristics specified during the design stage. Details of each of these stages will be described below for System Embodiment Nos. 2 and 6, 9 and 11, 3 and 7, with reference to FIG. 15.

Pre-Alignment Stage of the Assembly Procedure for System Embodiment Nos. 2 and 6

The first step of the prealignment stage of the system assembly procedure involves press fitting the VLD 112 into VLD heat-sink plate 113 so that the VLD junction is oriented in it predetermined orientation relative to the VLD heat-sink plate.

The second step of the prealignment stage involves mounting HOE H1 and HOE H2 into their appropriate mounting slots 115C and 115D formed within module housing 111. Thereafter, the HOEs can be glued or otherwise fixed in position.

The third step of the prealignment stage involves inserting lens L1 into the lens recess (e.g. bore) 117 formed within the module housing. Thereafter, the lens L1 can be glued or otherwise fixed in position.

The fourth step of the prealignment stage involves placing the VLD mounting yoke 114 into appropriate recesses 115C and 115D formed in the module housing. Notably, the VLD mounting yoke is held within recesses 115C and 115D by frictional fit and can only be translated along z axis of the parameter alignment system (i.e. the x and y directions being fixed by the geometry of the recesses.

The fifth step of the prealignment stage involves placing the module housing 111 into the module housing support platform 151 so that pins on the bottom surface of the housing module align with corresponding holes formed on the housing module support platform 151. When housing module 111 is installed in the manner described above, the module housing is then clamped to the module housing support platform 151 by way of screws, pressurized clamps or other releasable fastening devices.

The sixth step of the realignment stage involves placing the mounting yoke 114 on its support platform and clamping the same in place.

The seventh and last step of the prealignment stage involves attaching the VLD 112 to VLD support platform 151 of the parameter alignment system. In the preferred embodiment, this step can be achieved by sliding the leads of the VLD into a connector provided on the VLD support platform. The VLD support platform 154 is capable of movement along the x, y and z axes of the parameter adjustment system 150.

Alignment Stage of the Assembly Procedure for System Embodiment Nos. 2 and 6

The first step of the alignment stage of the system assembly procedure involves sliding the module housing support platform 151 towards VLD support platform 154 under the control of microcontroller 161 until the VLD is positioned within oversized aperture 114A formed within the VLD support yoke 114 positioned within the recesses of the module housing. Notably, at this "load" position, the VLD is free to move within the x and y plane by virtue of the oversized aperture in the VLD mounting yoke, and also along the z axis by virtue of clearance provided between the premounted lens L1 and the outer face of the VLD mounting yoke. As will become apparent hereinafter, such clearance enables the optical axis of each loaded VLD to be aligned with respect to the optical axis of lens L1.

The second step of the alignment stage of the procedure involves locking the position the module housing support platform 151 relative to the underlying optical bench (arranged in its "loaded" configuration). This locking operation can be carried out using locking mechanism 162 known under computer control.

The third step of the alignment stage of the procedure involves locking the VLD heat-sink plate to the VLD support platform 154 so that the VLD heat-sink plate is prevented from undergoing rotation in the x-y plane during alignment of the VLD relative to the lens L1 during the subsequent steps of the alignment procedure. This condition will ensure that the VLD unction is prevented from rotation during the alignment procedure, which may involve translation of the VLD junction in the x, y and/or z axes of the system in order to secure the performance parameters of the module established during the design stage.

The fourth step of the alignment stage of the procedure involves applying a biasing force on the VLD support yoke 114 (in the direction of the VLD heat-sink plate 113) so that the plate-like portion of the VLD support yoke gently engages the VLD heat-sink plate 113 in order that the surface of the VLD heat-sink plate and planar portion of the VLD support yoke assume the same z coordinate position during x, y alignment operations, while permitting relative movement between these two plate-like structures along the x-y plane of the system.

The fifth step of the alignment stage of the procedure involves supplying electrical power to the VLD 112 so that it produces an output laser beam which is transmitted through lens L1 and HOEs H1 and H2.

The sixth step of the alignment stage of the procedure involves translating the VLD support platform 154 in the x-y plane until the output laser beam strikes the center of the quadrant photodetector 159, which has been prealigned relative to the locked-in-position module housing 111 so that first diffraction order beam from HOE H2 (i.e. the optical axis thereof disposed in the plane of diffraction at diffraction angle $\theta_{d2}$) passes through the center of the quadrant-type photodetector. When the output laser beam strikes the center of the quadrant-type photodetector, then the design geometry will be achieved, resulting in minimum beam dispersion and the desired amount of beam shaping by design. Also optimal output power will be transmitted from the module along the optical axis of the system. This condition is based on the reasonable assumption that the diffraction efficiencies of HOEs H1 and H2 120 will be maximum along the first diffraction order by design, and characteristic wavelength of the VLD is substantially the same as the reconstruction wavelength of HOEs H1 and H2. Notably, this on-center aligned position can be visually detected when the indicator dot on the quadrant detector display unit 160 is aligned with the cross-hair on the display surface thereof. Completion of this step of the procedure will ensure that the output power of the laser beam producing module will be as close to the output of the VLD as is practically possible, as well as ensuring that the design requirements have been satisfied.

The seventh step of the alignment stage of the procedure involves gluing or otherwise permanently securing the x-y position of the VLD plate and VLD support yoke in the position determined during the step above. Thereafter, the biasing force applied during the above step of the procedure can be removed.

The eighth step of the alignment stage of the procedure involves adjusting the position of the subassembly (comprising the VLD 112, the VLD heat-sink plate 113 and the VLD support yoke 114) along the z axis of the parameter adjustment system while monitoring the output laser at the desired focal length of the module using beam profiling (scanning) instrument 157. When the spot size of the output laser beam (at some unknown location along the optical axis HOE H2) is minimum in both the x and y dimensions, then VLD support yoke 114 is glued or otherwise fixed in position relative to the module housing 111. Notably, the beam profiling instrument will have to be moved along the optical axis of HOE H2 to detect this condition, in which the output laser beam is free of astigmatism. While the output beam may still have elliptical cross-sectional characteristics along its direction of propagation, its beam cross-section will be minimum for both dimensions at this detected point which, by definition, is a stigmatic beam. Thereafter, the VLD support yoke is glued or otherwise fixed to the module housing 111.

The ninth step of the alignment stage of the procedure involves inserting lens support bracket 123, containing prespecified lens L2, into recess 124 formed within the front end of the module housing 111.

The tenth step of the alignment stage of the procedure involves adjusting the focal length of the module by translating lens L2 along the optical axis (or adjusting the combined focal length of a lens pair) while monitoring the output laser beam (at the desired focal length of the module set during design) until the spot size of the laser is minimum. In one illustrative embodiment, this is achieved by sliding lens L2 relative to HOE H2. In instances where multiple lens elements are used to construct L2, the spacing if such lenses can be varied to impart the desired focal length to the lens system L2. Notably, in some instances, it may also be desirable or necessary to adjust the (x,y) position of the L2 along the optical axis of the system. Thereafter, the lens L2 mounting bracket is glued or otherwise fixed relative to the module housing. Then the housing cover plate 127 is then fastened upon the top of the module housing and then the aligned laser beam producing module is removed from the parameter adjustment system and is ready for use in the system for which it has been designed.

Pre-Alignment/Alignment Stage of the Assembly Procedure for System Embodiment Nos. 9 and 11

The prealignment stage for System Embodiments Nos. 9 and 11 is similar to that described for System Embodiments 1, 5, 13 and 14 above with several exceptions. Foremost, in System Embodiment Nos. 9 and 11, second lens L2 is disposed between H1 and H2. Thus, a module similar to that shown in FIGS. 11A–11C, but with second lens L2 disposed between HOEs H1 and H2, could be used to realize such a system design. Notably, the design of such a module will enable the second lens L2 to be installed within its modified module housing after completing the alignment procedure described above. When the second lens L2 is installed within the module housing, the focal length of the output laser beam can be set by translating lens L2 along the optical axis (or adjusting the focal-length of second lens L2 in appropriate cases).

Pre-Alignment and Alignment Stages of the Assembly Procedure for System Embodiment Nos. 3 and 7

The prealignment stage of the assembly procedure for System Embodiment Nos. 3 and 7 is different than that described for System Embodiment Nos. 2 and 6 above, in two significant ways. First, HOE H2 is a variable spatial-frequency HOE (having focusing power) which is mounted in a HOE support bracket enabling its principal plane to be translated along its optical axis relative to the principal plane of HOE H1 without modifying the tilt angle ρ therebetween. Secondly, in System Embodiment Nos. 3 and 7, there is no second lens L2 as required in System Embodiments Nos. 2 and 6. While such structural differences simplify the pre-alignment stage of the assembly process, they do not alter the procedure for aligning the VLD junction along the x and y axes of the system to minimize beam dispersion, or along the z axis to eliminate beam astigmatism. Notably, after eliminating beam dispersion and correcting for astigmatism, HOE H2 can be translated along its optical axis to set the focal length (i.e. focus) of the output laser beam to that specified during design.

Method of Assembling and Aligning the Subcomponents of Laser Beam Producing Systems of the Illustrative System Embodiments of the Present Invention Designed for Instances where Focus Control, Astigmatism Correction and Delta-Focusing are Desired: System Embodiments Nos. (4), (8), (10) and (12): Case C In general, when assembling a laser beam producing module based on System Embodiments Nos. 4 and 8, the parameter adjustment procedure of the present invention can be carried out on the module design shown in FIGS. 11A–11C supported upon the parameter adjustment system of FIG. 13. When assembling a laser beam producing module based on System Embodiments Nos. 10 and 12, the parameter adjustment procedure of the present invention can be carried out on the module design similar to that shown in FIGS. 11A–11C (but with lens L2 disposed between H1 and H2) supported upon the parameter adjustment system of FIG. 13.

For each of these groups of system embodiments, the assembly procedure comprises a prealignment stage and an alignment stage. During the prealignment stage, various optical components of the laser beam producing module are installed within their respective mounting locations within the module housing, or within support structure associated with the parameter adjustment system 150. During the alignment stage, the VLD and lens L1 are aligned relative to each other, the focusing lens L2 is aligned relative to HOE H2, and the HOE H2 is aligned relative to HOE H1, in order to achieve the performance characteristics specified during the design stage. Details of each of these stages will be described below for System Embodiment Nos. 4, 8, 10 and 12, with reference to FIG. 16.

Pre-Alignment Stage of the Alignment Procedure for System Embodiment Nos. 4 and 8

The first step of the prealignment stage of the system assembly procedure involves press fitting the VLD 131 into VLD heat-sink plate 132 so that the VLD junction is oriented in it predetermined orientation relative to the VLD heat-sink plate.

The second step of the prealignment stage involves mounting HOE H1 and HOE H2 (supported in its mounting bracket 141) into their appropriate mounting slots 139 and 142 formed within module housing 135. Thereafter, HOE H1 can be glued or otherwise fixed in position, while HOE H2 is permitted to moved along its along its optical axis within the module housing.

The third step of the prealignment stage involves inserting lens L1 into the lens recess (e.g. pocket) formed within the module housing, so that the planar side of the lens L1 is mounted incident the VLD 131. Thereafter, the lens L1 can be glued or otherwise fixed in position.

The fourth step of the prealignment stage involves placing the VLD mounting bracket 133 into appropriate recesses 133C and 133D formed in the module housing. Notably, the VLD mounting yoke is held within recesses 133C and 133D by frictional fit and can only be translated along z axis of the parameter alignment system (i.e. the x and y directions being fixed by the geometry of the recesses.

The fifth step of the prealignment stage involves placing the module housing 135 into the module housing support platform 151 so that pins on the bottom surface of the housing module align with corresponding holes formed on the housing module support platform 151. When housing module 135 is installed in the manner described above, it is then clamped to the module housing support platform 151 by way of screws, pressurized clamps or other releasable fastening devices.

The sixth step of the prealignment stage involves placing the mounting yoke 114 on its support and clamping the same.

The seventh and last step of the prealignment stage involves attaching the VLD 131 to VLD support platform 154 of the parameter alignment system. In the preferred embodiment, this step can be achieved by sliding the leads of the VLD into a connector provided on the VLD support platform. The VLD support platform 154 is capable of movement along the x, y and z axes of the parameter adjustment system 150.

Alignment Stage of the Assembly Procedure for System Embodiment Nos. 4 and 8

The first step of the alignment stage of the procedure involves sliding the module housing support platform 151 towards VLD support platform 154 under the control of microcontroller 161 until the VLD is positioned within oversized aperture 133A formed within the VLD support bracket 133 positioned within the recesses of the module housing. Notably, at this "load" position, the VLD is free to move within the x and y plane by virtue of the oversized aperture in the VLD mounting yoke, and also along the z axis by virtue of clearance provided between the pre-mounted lens L1 and the outer face of the VLD mounting yoke. As will become apparent hereinafter, such clearance enables the optical axis of each loaded VLD to be aligned with respect to the optical axis of lens L1 in a manner required to achieve minimal beam dispersion and the desired aspect-ratio specified during the design stage described above.

The second step of the alignment stage of the procedure involves locking the position the module housing support platform 151 relative to the underlying optical bench 152 (arranged in its "loaded" configuration). This locking operation can be carried out using locking mechanism 162 computer control.

The third step of the alignment stage of the procedure involves locking the VLD heat-sink plate 132 to the VLD support platform 154 so that the VLD heat-sink plate is prevented from undergoing rotation in the x-y plane during alignment of the VLD 131 relative to the lens L1 during the subsequent steps of the alignment procedure. This condition will ensure that the VLD junction is prevented from rotation during the alignment procedure, which may involve translation of the VLD junction in the x, y and/or z axes of the system in order to secure the performance parameters of the module established during the design stage.

The fourth step of the alignment stage of the procedure involves applying a biasing force on the VLD support bracket 133 (in the direction of the VLD heat-sink plate) so that the plate-like portion of the VLD support yoke gently engages the VLD heat-sink plate 132 in order that the surface of the VLD heat-sink plate and planar portion of the VLD support bracket 133 assume the same z coordinate position during x, y alignment operations, while permitting relative movement between these two plate-like structures along the z-x plane of the system.

The fifth step of the alignment stage of the procedure involves supplying electrical power to the VLD 131 so that it produces an output laser beam which is transmitted through lens L1 and HOEs H1 and H2.

The sixth step of the alignment stage of the procedure involves translating the VLD support platform 154 in the x-y plane until the output laser beam strikes the center of the quadrant photodetector 159, which has been prealigned relative to the locked-in-position module housing 135 so that first diffraction order beam from HOE H2 (i.e. the optical axis thereof disposed in the plane of diffraction at diffraction angle $\theta_{d2}$) passes through the center of the quadrant-type detector 159. When the output laser beam strikes the center of the quadrant-type photodetector, then the design geometry will be achieved, resulting in minimum beam dispersion and the desired amount of beam shaping by design. Also optimal output power will be transmitted from the module along the optical axis of the system. This condition is based on the reasonable assumption that the diffraction efficiencies of HOEs H1 and H2 will be maximum along the first diffraction order by design, and characteristic wavelength of the VLD is substantially the same as the reconstruction wavelength of HOEs H1 and H2. Notably, this on-center aligned position can be visually detected when the indicator dot on the quadrant detector display unit 160 is aligned with the cross-hair on the display surface thereof. Completion of this step of the procedure will ensure that output power of the laser beam producing module will be as close to the output power of the VLD as is practically possible, as well as ensuring that the design requirements have been satisfied.

The seventh step of the alignment stage of the procedure involves gluing or otherwise permanently securing the x-y position of the VLD heat-sink plate 132 and VLD support bracket (yoke) 133 in the position determined during the step above. Thereafter, the biasing force applied during the above step of the procedure can be removed.

The eighth step of the alignment stage of the procedure involves adjusting the position of the subassembly (comprising the VLD 131, the VLD heat-sink plate 132 and the VLD support yoke 133) along the z axis of the parameter adjustment system while monitoring the output laser at the desired focal length of the module using beam profiling instrument 157. When the spot size of the output laser beam (at some unknown location along the optical axis HOE H2) is minimum in both the x and y dimensions, then VLD support yoke 133 is glued or otherwise fixed in position relative to the module housing 135. Notably, the beam profiling instrument will have to be moved along the optical axis of HOE H2 to detect this condition, in which the output laser beam is free of astigmatism. While the output beam may still have elliptical cross-sectional characteristics along its direction of propagation, its beam cross-section will be minimum for both dimensions at this detected point which, by definition, is stigmatic beam. Thereafter, the VLD support yoke is glued or otherwise fixed to the module housing 135.

The ninth step of the alignment stage of the procedure involves adjusting the position of HOE H2 relative to HOE H1 while monitoring the beam cross-section at a focal point determined during the process) using beam profiling instrument 157. When the output laser beam is focused to a predetermined focal point, then the position of HOE H2 is glued or otherwise fixed relative to HOE H1.

The tenth step of the alignment stage of the procedure would involve inserting lens support bracket 144, containing prespecified lens L2 143, into recess 145 formed within the front end of the module housing 135. In the illustrative embodiment, lens mounting bracket 144 can be manually adjusted by a small adjustment screw or like mechanism embodied within the module housing. This adjustment mechanism allows the end-user to fine-tune the resulting focal length of the laser beam producing module as required or desired by the application at hand. In some instances, it is contemplated that the laser beam producing module will be installed within a larger system, in which the output stigmatic laser beam from the module will be further modified for a particular application (e.g. scanning). In such cases, it is understood that the laser beam producing module may be first removed from the module housing support platform 151 of the parameter adjustment system described above, and then installed within the larger system. Thereafter, the resulting larger system can be mounted to a parameter adjustment system of the general type described above in order to set the focal length of the laser beam producing module so that the focal length of the resulting system is achieved. Clearly, there will be may ways in which to fine-tune the focal length of the laser beam producing module of System Embodiment Nos. 4 and 8.

Then the housing cover plate 147 is fastened upon the top of the module housing, and thereafter the aligned laser beam producing module is removed from the parameter adjustment system and is ready for use in the system 150 for which it has been designed.

Pre-Alignment and Alignment Stages of the Assembly Procedure for System Embodiment Nos. 10 and 12

The prealignment stage of the assembly procedure for System Embodiment Nos. 10 and 12 is different than that described for System Embodiment Nos. 4 and 8 above, in one significant way. In particular, in System Embodiment Nos. 10 and 12, the second lens L2 is disposed between the HOEs H1 and H2, rather than beyond the HOE H2, as shown in FIGS. 2J and 2L. Such structural differences alter the prealignment stage of the assembly process slightly, as well as the procedure for aligning the VLD junction along the x and y axes of the system to minimize beam dispersion, or along the z axis to eliminate beam astigmatism. In particular, beam dispersion is minimized while an "alignment HOE" with no optical power installed in the position of HOE H2, when the position-adjustable lens L2 is not yet installed within the module housing. Astigmatism is corrected by adjusting the position of the VLD relative to fixed lens L1 136. Then an average focal distance for the laser beam producing module is set by inserting lens L2 and adjusting its position within its mounting recess. At this stage, the alignment HOE is removed and HOE H2 is put into place and can be adjusted while on the module housing platform to set a finely tuned focal distance for the laser beam producing module, or alternatively, first installed within a larger optical system, and thereafter adjusted to fine tune the focal length of the module to achieve a particular design objective for the larger optical system, as described hereinabove.

Figure 17:
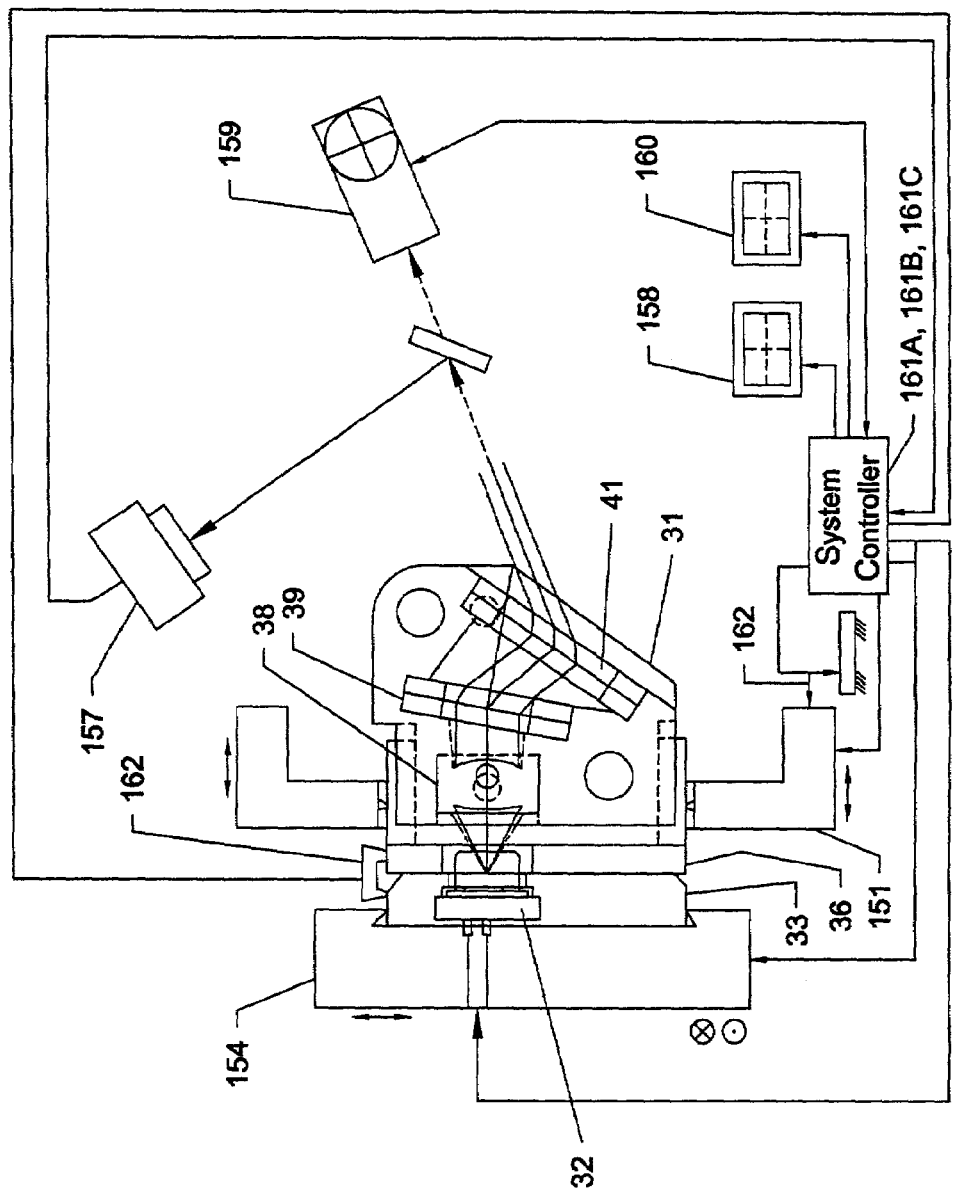
FIG. 17 is a schematic diagram of the laser beam producing module shown in FIG. 12A installed upon the parameter adjustment system of FIG. 13, for aligning the optical components of the module so that laser beam dispersion is minimized, and astigmatism in the output laser beam is corrected, without focus control or focal length adjustment.

Method of Assembly and Aligning the Subcomponents of Laser Beam Producing Systems of the Illustrative System Embodiments of the Present Invention Designed for Instances where Astigmatism Correction is Desired But Neither Focus Control Nor Delta-Focusing are Required: System Embodiment Nos. (13) and (14): CASE D In general, when assembling a laser beam producing module based on System Embodiments Nos. 13 and 14, the parameter adjustment procedure of the present invention can be carried out on the module design similar to that shown in FIGS. 7A–7C (but with lens L1 being a focusing lens) supported upon the parameter adjustment system of FIG. 13, as shown in FIG. 17.

For this group of system embodiments, the assembly procedure comprises a prealignment stage and an alignment stage. During the prealignment stage, various optical components of the laser beam producing module are installed within their respective mounting locations within the module housing, or within support structure associated with the parameter adjustment system 150, as described in connection with System Embodiment Nos. 1 and 5. During the alignment stage, the (x,y) position of the VLD is aligned relative to the focusing lens L1 in order to achieve zero beam dispersion for the central ray of the beam and minimized for all others, using the (x,y) alignment procedure described hereinabove. Thereafter, the position of the VLD is adjusted along the z axis in order to eliminate astigmatism in the output laser beam using the z axis alignment procedure described above. Notably, in this System Embodiment, astigmatism elimination is achieved at the expense of the focus control, while minimizing beam dispersion and achieving a limited degree of aspect-ratio control.

Exemplary Systems and Devices within which the Laser Beam Producing System of the Present Invention can be Embodied The laser beam producing system of the present invention described in detail hereinabove may, in all of its various embodiments, be embodied within an infinite variety of systems requiring the production of a laser beam having predetermined beam characteristics, substantially free of dispersion. Hereinbelow are just a few exemplary systems and devices within which the laser beam production system can be embodied in accordance with the principles of the present invention. As such, each such system provides a further embodiment of the present invention.

Figure 18:
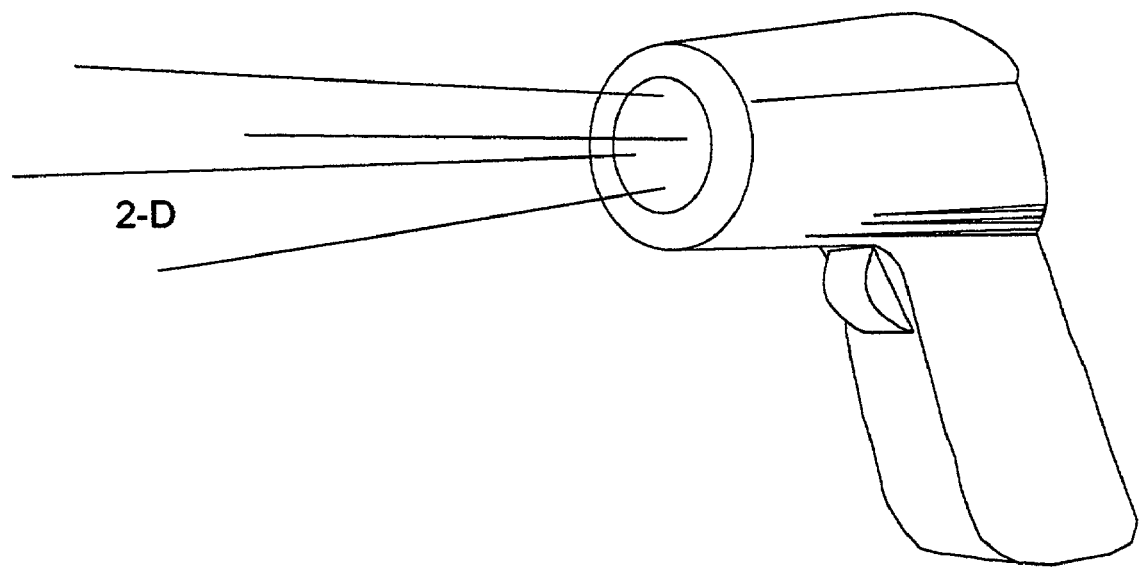
FIG. 18 is a schematic representation of a hand-supportable laser scanning system constructed in accordance with the present invention, wherein one or more DOE-based laser beam producing systems of the present invention are configured and driven by a synchronized driver circuit for producing a 2-D laser scanning pattern suitable for omni-directional or raster scanning of bar code symbols.
Figure 19:
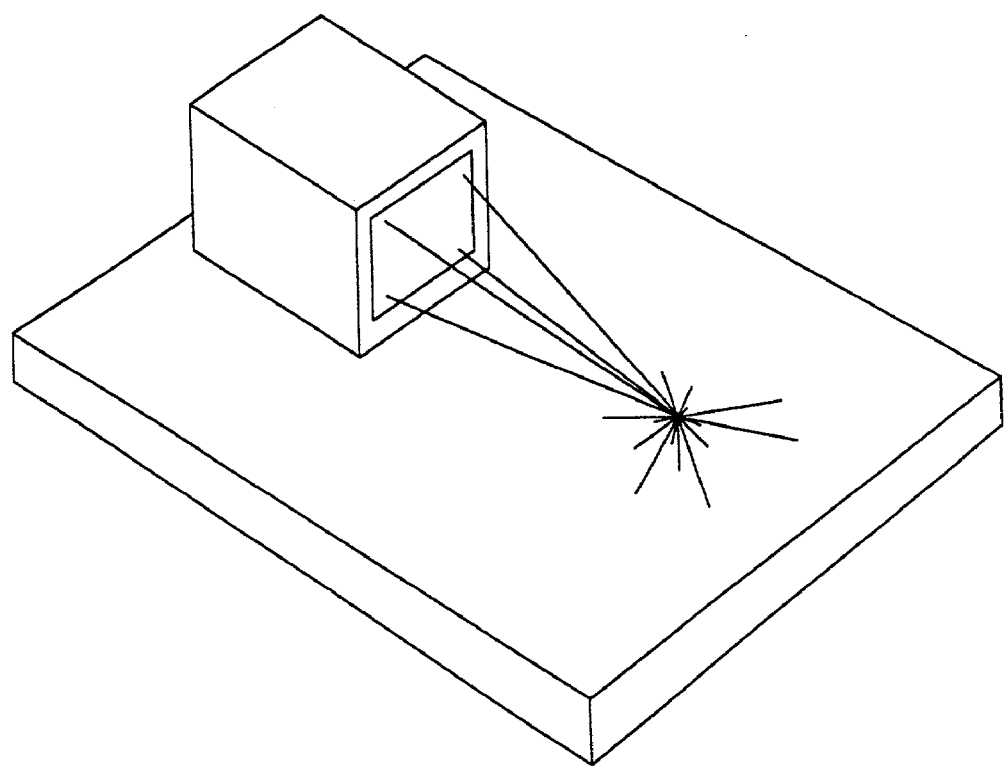
FIG. 19 is a schematic representation of a fixed-type projection laser scanning system, wherein a laser beam producing subsystem of the present invention is used to produce a laser beam having desired beam characteristics for omni-directional laser scanning.

As illustrated in FIG. 18, any one of the laser beam producing devices of the present invention can be incorporated in a hand-supportable laser scanning device As illustrated in FIG. 19, any one of the laser beam producing devices of the present invention can be incorporated a fixed-projection type laser scanning system.

Figure 20:
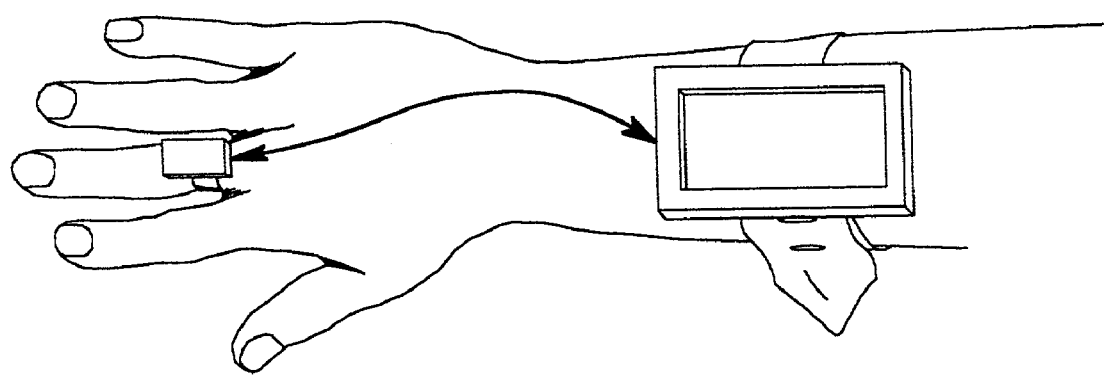
FIG. 20 is a schematic representation of a body-wearable laser scanning system which embodies an DOE-based laser beam producing module of the present invention within its finger-mounted scanning module.

As illustrated in FIG. 20, any one of the laser beam producing devices of the present invention can be incorporated a body-wearable laser scanning system, as well as a finger-mounted laser scanning system.

As illustrated in FIG. 21, any one of the laser beam producing devices of the present invention can be incorporated a holographic laser scanning system.

Figure 22:
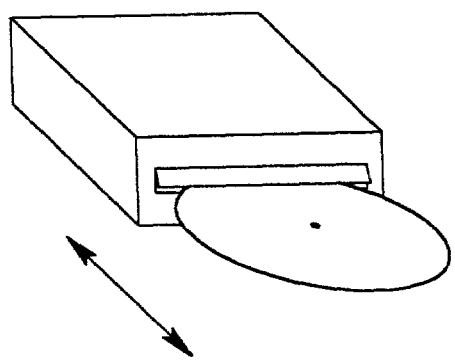
FIG. 22 is a schematic representation of a CD-ROM player in which a laser beam producing module according to the present invention is integrated.

As illustrated in FIG. 22, any one of the laser beam producing devices of the present invention can be incorporated a CD-ROM disc playback system.

Figure 23:
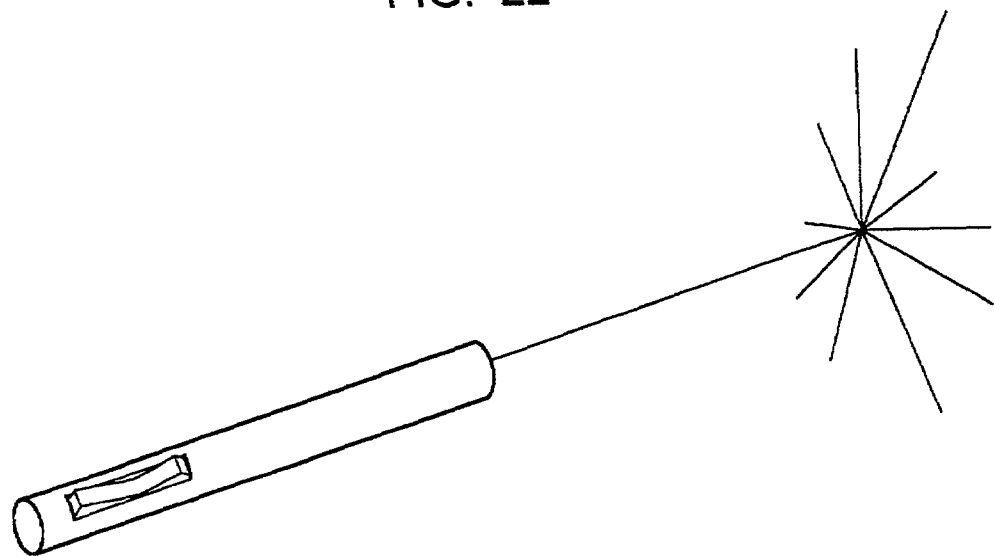
FIG. 23 is a schematic representation of a laser beam pointing device, wherein a laser beam producing module according to the present invention is embodied.

As illustrated in FIG. 23, any one of the laser beam producing devices of the present invention can be incorporated a laser pointing device.

Figure 24:
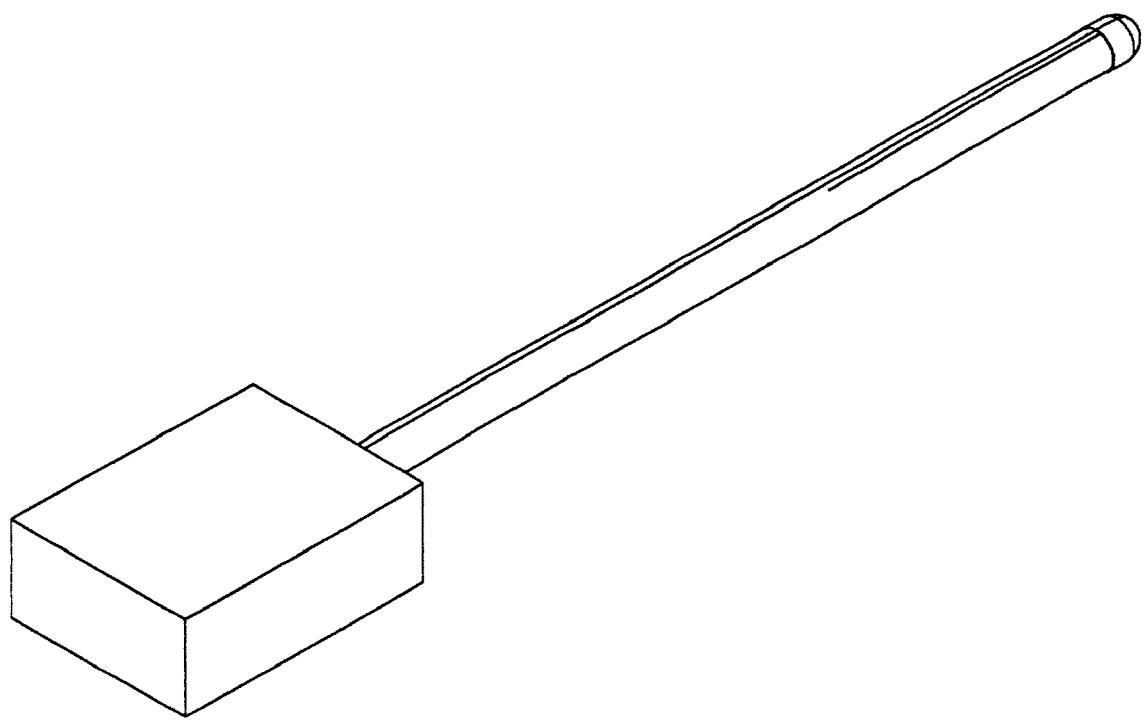
FIG. 24 is a schematic representation of an analytical instrument, in which a laser beam producing module according to the present invention is employed for detection or diagnosis of a particular condition.

As illustrated in FIG. 24, any one of the laser beam producing devices of the present invention can be incorporated a medical laser sculpturing system.

Any of the hand-supportable, body-wearable, or other scanning systems described hereinabove may embody one or more of the following functionalities: the spatially overlapping object detection and laser scan fields taught in U.S. Pat. No. 5,468,951; the long-range/short-range modes of programmable scanning operation taught in U.S. Pat. No. 5,340,971; the power-conserving system-control architecture taught in U.S. Pat. No. 5,424,525; and the RF signal transmission functionalities and acoustical acknowledgement signaling taught in copending U.S. patent application Ser. No. 08/292,237, each of which is commonly owned by Metrologic Instruments, Inc. of Blackwood, N.J.

Some Modifications that Readily Come to Mind

While each of the previous module designs has two DOE's, it is possible to design a module with three or more DOE's if desired or required by a particular application. One possible reason for desiring additional DOEs might be a need for more beam shaping than can reasonably be provided by only two DOE's. While three or more DOEs would be acceptable, one DOE would not be acceptable, due to the excessive amount of dispersion produced by diffractive optics. This is not a problem for multiple DOE's because they can be specifically designed to have a net dispersion of zero when combined together.

While the illustrative embodiments described hereinabove make reference to using DCG material to fabricate the DOEs within modules, devices and systems of the present invention, it is understood that other types of recording materials such as photo-polymer recording materials (e.g. photo-polymer DMP 128 from DuPont and other vendors) can be used with excellent results. One advantage of using a photo-polymer recording material (e.g. photo-polymer DMP 128 from Dupont) to fabricate the DOEs is that, unlike DCG material, photo-polymer recording materials are easier to handle and less sensitive to moisture.

In general, the refractive optical elements L1 and L2 employed in the illustrative embodiments disclosed hereinabove can be realized using any suitable optically-transparent material including glass and plastic. In applications having insignificant temperature changes and where manufacturing cost is an issue, it will be preferred to make lens L1 entirely from plastic material. However, in many applications, wherein the ambient temperature is expected to cycle over a substantial temperature range, it will be preferable to construct such lens from glass material rather than a plastic material, as glass material is less susceptible to thermal variations than plastic material. Consequently, the focal length of lens L1 (which is typically quite short) will not change nearly as much in response to a given temperature change, as compared to a lens L1 made from a plastic material.

In order to make inexpensive aspheric lens (e.g. L1) which is less sensitive to thermal changes, it is possible to mount an aspherical surface element made from a material other than glass (e.g. molded plastic) onto a spherical lens made from glass. Mounting of the aspherical surface element can be carried out using a suitable optical cement. In general, thermal-related effects in such optical components are proportional to the Temperature Coefficient of Expansion (TCE) and Temperature Coefficient of Refractive Index (TCRI) of the optical material being used. Both of these constants are much greater for plastic than for glass. Thermal-related effects are also a function of the thickness of the material and the relative optical power of the optical element.

Most of the thickness and thus most of the optical power provided by a two-part lens device (L1) as described above is contained in the glass element component thereof. In this two-part lens device, the plastic aspheric element is made very thin and contains, theoretically, only the amount of aspherical component needed to provide correction of spherical aberration in the incident laser beam. Thus, the plastic aspheric component mounted to the glass component will have very little optical power. Therefore, the overall two-part lens L1 will have thermal properties much closer to a pure glass lens than to a pure plastic lens.

Alternatively, in applications having significant ambient temperature changes and where the cost of manufacture of the lens L1 is not critical design constraint, it will be preferred to make lens L1 entirely from glass material.

In the second illustrative embodiment shown in FIGS. 2B, 2B1, 2B2 and 2B3 and described hereinabove (i.e. System Embodiment No. 2), Applicants have taught how DOEs D1 and D2 employed therein can be realized using either transmission-type and/or reflection-type volume holograms (HOEs) for DOE1 and DOE2. It is understood, however, that the other illustrative embodiments of the present invention (System Embodiments Nos. 1 and 3–14) disclosed herein can be realized as well using reflection-type and/or transmission-type volume HOEs. In such alternative realizations of these system embodiments, the only requirement is that the angle of diffraction be different than the angle of incidence for each light diffractive element of the DOE-based device. In general, this requirement can be met using either a transmissive DOE (e.g. transmission HOE) or a reflective DOE (e.g. reflection HOE).

The various embodiments of the laser beam producing system hereof have been described in connection with linear (1-D) and 2-D code symbol scanning applications. It should be clear, however, that the apparatus and methods of the present invention are equally suited for use in other applications including, for example, scanning alphanumeric characters (e.g. textual information) in optical character recognition (OCR) applications.

Several modifications to the illustrative embodiments have been described above. It is understood, however, that various other modifications to the illustrative embodiment of the present invention will readily occur to persons with ordinary skill in the art. All such modifications and variations are deemed to be within the scope and spirit of the present invention as defined by the accompanying Claims to Invention.

What is claimed is:

1. A laser beam production module for producing a laser beam having a desired beam aspect-ratio, a minimized or reduced to zero beam dispersion, and corrected astigmatism, said laser beam producing module comprising:
   a module housing;
   a visible laser diode (VLD), mounted within said module housing, for producing a laser beam from its junction having divergent and elliptical beam characteristics;
   a collimating lens (L1), mounted in said module housing, spaced from said VLD by a distance D, for collimating the laser beam as it is transmitted through said collimating lens L1 and through components in said module;
   a first fixed spatial-frequency diffractive optical element (DOE), mounted in said module housing, having a beam expansion factor M1; and
   a second fixed spatial-frequency diffractive optical element (DOE), mounted in said module housing, having a beam expansion factor M2,
   wherein the collimated laser beam exiting said collimating lens L1 is transmitted through said first DOE, and the collimated laser beam exiting said first DOE is transmitted through said second DOE, and wherein:
   (a) the collimating lens has a downstream focus location, in the direction of said collimating lens L1, that is calculated to adjust or eliminate astigmatism in the beam propagating beyond the second DOE;
   (b) for the calculated downstream focus location, D is selected to provide a desired beam spot size, thereby determining an upstream focus location for the lens, in the direction of said VLD; and
   (d) the focal length of the collimating lens is selected according to the upstream and downstream focus locations,
   whereby the collimated laser beam exiting said second DOE exits has a controlled beam aspect-ratio, a minimized or reduced to zero beam dispersion, and corrected astigmatism; and
   wherein said laser beam is transmitted through said collimating lens L1 and through said module in a S-incident manner; and wherein the total beam-shaping factor (M=M1M2) for the laser beam producing module is less than unity, and the laser beam leaving said collimating lens (L1) is compressed in one dimension, and has a circularized beam aspect-ratio, minimized (or reduced to zero beam dispersion, and corrected astigmatism.

2. The laser beam production module of claim 1, wherein said collimating lens (L1) is realized by an optical element selected from the group consisting of a refractive lens, a HOE, a CGH, other type of DOE, a grin lens, and one or more zone plate(s).

3. The laser beam production module of claim 1, wherein each said DOE is realized by an optical element selected from the group consisting of a HOE, a computer-generated hologram (CGHs), and a surface-relief hologram.

4. The laser beam production module of claim 1, wherein said collimating lens (L1) is realized by an optical element selected from the group consisting of a refractive lens, a HOE, a CGH, other type of DOE, a grin lens, and one or more zone plate(s).

5. The laser beam production module of claim 1, wherein each said DOE is realized by an optical element selected from the group consisting of a HOE, a computer-generated hologram (CGHs), and a surface-relief hologram.

6. The laser beam production module of claim 1,
   wherein the first fixed spatial-frequency diffractive optical element (DOE) has fringe surface spacing $d_1$ and is mounted in said module housing such that the angle of diffraction of the laser beam from the first DOE is $\theta_{d1}$; and
   wherein the second fixed spatial-frequency diffractive optical element (DOE) has a fringe surface spacing $d_2$ and is mounted in said module housing, such that the angle of incidence of the laser beam on the second DOE is $\theta_{i2}$;
   and where $d_2 \cos \theta_{i2} = d_1 \cos \theta_{d1}$.

7. The laser beam production module of claim 1, which further comprises a blocking plate or surface between the first DOE and the second DOE to block any zero-order beam from the first DOE.

8. A laser beam production module for producing a laser beam having a desired beam aspect-ratio, a minimized or reduced to zero beam dispersion, and corrected astigmatism, said laser beam producing module comprising:

a module housing;

a visible laser diode (VLD), mounted within said module housing, for producing a laser beam from its junction having divergent and elliptical beam characteristics;

a collimating lens (L1), mounted in said module housing, spaced from said VLD by a distance D, for collimating the laser beam as it is transmitted through said collimating lens L1 and through components in said module;

a first fixed spatial-frequency diffractive optical element (DOE), mounted in said module housing, having a beam expansion factor M1; and a second fixed spatial-frequency diffractive optical element (DOE), mounted in said module housing, having a beam expansion factor M2, wherein the collimated laser beam exiting said collimating lens L1 is transmitted through said first DOE, and the collimated laser beam exiting said first DOE is transmitted through said second DOE, and wherein:

(a) the collimating lens has a downstream focus location, in the direction of said collimating lens L1, that is calculated to adjust or eliminate astigmatism in the beam propagating beyond the second DOE;

(b) for the calculated downstream focus location, D is selected to provide a desired beam spot size, thereby determining an upstream focus location for the lens, in the direction of said VLD; and (d) the focal length of the collimating lens is selected according to the upstream and downstream focus locations, whereby the collimated laser beam exiting said second DOE exits has a controlled beam aspect-ratio, a minimized or reduced to zero beam dispersion, and corrected astigmatism; and wherein said laser beam is transmitted through said collimating lens L1 and through said module in a P-incident manner; and wherein the total beam-shaping factor (M=M1M2) for the laser beam producing module is greater than unity (1), and thus the laser beam leaving said collimating lens (L1) is expanded in one dimension and has a circularized beam aspect-ratio, minimized (or reduced to zero) beam dispersion, and corrected astigmatism.

9. The laser beam producing module of claim 8, wherein said collimating lens (L1) is realized by an optical element selected from the group consisting of a refractive lens, a HOE, a CGH, other type of DOE, a grin lens, and one or more zone plate(s).

10. A laser beam production module for producing a laser beam having a desired beam aspect-ratio, a minimized or reduced to zero beam dispersion, and corrected astigmatism, said laser beam producing module comprising:

a module housing;

a visible laser diode (VLD), mounted within said module housing, for producing a laser beam from its junction having divergent and elliptical beam characteristics;

a collimating lens (L1), mounted in said module housing, spaced from said VLD by a distance D, for collimating the laser beam as it is transmitted through said collimating lens L1 and through components in said module;

a first fixed spatial-frequency diffractive optical element (DOE), mounted in said module housing, having a beam expansion factor M1; and a second fixed spatial-frequency diffractive optical element (DOE), mounted in said module housing, having a beam expansion factor M2, wherein the collimated laser beam exiting said collimating lens L1 is transmitted through said first DOE, and the collimated laser beam exiting said first DOE is transmitted through said second DOE, and wherein:

(a) the collimating lens has a downstream focus location, in the direction of said collimating lens L1, that is calculated to adjust or eliminate astigmatism in the beam propagating beyond the second DOE;

(b) for the calculated downstream focus location, D is selected to provide a desired beam spot size, thereby determining an upstream focus location for the lens, in the direction of said VLD; and (d) the focal length of the collimating lens is selected according to the upstream and downstream focus locations, whereby the collimated laser beam exiting said second DOE exits has a controlled beam aspect-ratio, a minimized or reduced to zero beam dispersion, and corrected astigmatism;

wherein said laser beam is transmitted through said collimating lens L1 and through said module in a P-incident manner;

wherein the total beam-shaping factor (M=M1M2) for the laser beam producing module is greater than unity (1), and thus the laser beam leaving said collimating lens (L1) is expanded in one dimension and has a circularized beam aspect-ratio, minimized or reduced to zero beam dispersion, and corrected astigmatism; and wherein each said DOE is realized by an optical element selected from the group consisting of a HOE, a computer-generated hologram (CGHs), a surface-relief hologram, and other diffractive optical element.

11. The laser beam producing module of claim 10, wherein the first fixed spatial-frequency diffractive optical element (DOE) has fringe surface spacing $d_1$ and is mounted in said module housing such that the angle of diffraction of the laser beam from the first DOE is $\theta_{d1}$; and wherein the second fixed spatial frequency diffractive optical element (DOE) has a fringe surface spacing $d_2$ and is mounted in said module housing, such that the angle of incidence of the laser beam on the second DOE is $\theta_{i2}$;

and where $d_2 \cos \theta_{i2} = d_1 \cos \theta_{d1}$.

12. The laser beam production module of claim 10, which further comprises a blocking plate or surface between the first DOE and the second DOE to block any zero-order beam from the first DOE.

13. A laser beam production module for producing a laser beam having a controlled beam aspect-ratio, a minimized or reduced to zero beam dispersion, and corrected astigmatism, said laser beam producing module comprising:

a module housing;

a visible laser diode (VLD), mounted within said module housing, for producing a laser beam from its junction having divergent and elliptical beam characteristics and having a narrower dimension and a wider dimension;

a collimating lens (L1), mounted in said module housing, for collimating the laser beam as it is transmitted through said collimating lens L1 and through components in said module;

a first fixed spatial-frequency diffractive optical element (DOE), mounted in said module housing, having a beam expansion factor M1; and a second fixed spatial-frequency diffractive optical element (DOE), mounted in said module housing, having a beam expansion factor M2, wherein the collimated laser beam exiting said collimating lens L1 is transmitted through said first DOE, and the collimated laser beam exiting said first DOE is transmitted through said second DOE, and wherein (a) the first and second DOEs expand the narrower dimension or compress the wider dimension and (b) the lens causes the beam incident on the first DOE to converge, such that the collimated laser beam exiting said second DOE exits having a controlled beam aspect-ratio, a minimized or reduced to zero beam dispersion, and corrected astigmatism; and wherein the first fixed spatial-frequency diffractive optical element (DOE) has fringe surface spacing $d_1$ and is mounted in said module housing such that the angle of diffraction of the laser beam from the first DOE is $\theta_{d1}$; and wherein the second fixed spatial-frequency diffractive optical element (DOE) has a fringe surface spacing $d_2$ and is mounted in said module housing, such that the angle of incidence of the laser beam on the second DOE is $\theta_{i2}$;

and where $d_2 \cos \theta_{i2} = d_1 \cos \theta_{d1}$.

14. The laser beam production module of claim 13, wherein said collimating lens (L1) is realized by an optical element selected from the group consisting of a refractive lens, a HOE, a CGH, other type of DOE, a grin lens, and one or more zone plate(s).

15. The laser beam production module of claim 13, wherein each said DOE is realized by an optical element selected from the group consisting of a HOE, a computer-generated hologram (CGHs), and a surface-relief hologram.

16. A laser beam production module for producing a laser beam having a controlled beam aspect-ratio, a minimized or reduced to zero beam dispersion, and corrected astigmatism said laser beam producing module comprising:

a module housing;

a visible laser diode (VLD) mounted within said module housing, for producing a laser beam from its junction having divergent and elliptical beam characteristics and having a narrower dimension and a wider dimension;

a collimating lens (L1) mounted in said module housing, for collimating the laser beam as it is transmitted through said collimating lens L1 and through components in said module;

a first fixed spatial-frequency diffractive optical element (DOE) mounted in said module housing, having a beam expansion factor M1; and a second fixed spatial-frequency diffractive optical element (DOE), mounted in said module housing, having a beam expansion factor M2, wherein the collimated laser beam exiting said collimating lens L1 is transmitted through said first DOE, and the collimated laser beam exiting said first DOE is transmitted through said second DOE, and wherein (a) the first and second DOEs compress the narrower dimension or expand the wider dimension and (b) the lens causes the beam incident on the first DOE to diverge, such that the collimated laser beam exiting said second DOE exits having a controlled beam aspect-ratio, a minimized or reduced to zero beam dispersion, and corrected astigmatism;

wherein the first fixed spatial-frequency diffractive optical element (DOE) has fringe surface spacing $d_1$ and is mounted in said module housing such that the angle of diffraction of the laser beam from the first DOE is $\theta_{d1}$; and wherein the second fixed spatial-frequency diffractive optical element (DOE) has a fringe surface spacing $d_2$ and is mounted in said module housing, such that the angle of incidence of the laser beam on the second DOE is $\theta_{i2}$;

and where $d_2 \cos \theta_{i2} = d_1 \cos \theta_{d1}$.

17. The laser beam production module of claim 16, wherein said collimating lens (L1) is realized by an optical element selected from the group consisting of a refractive lens, a HOE, a CGH, other type of DOE, a grin lens, and one or more zone plate(s).

18. The laser beam production module of claim 16, wherein each said DOE is realized by an optical element selected from the group consisting of a HOE, a computer-generated hologram (CGHs), and a surface-relief hologram.

19. The laser beam production module of claim 16, which further comprises a blocking plate or surface between the first DOE and the second DOE to block any zero-order beam from the first DOE.

20. The laser beam production module of claim 16, which further comprises a blocking plate or surface between the first DOE and the second DOE to block any zero-order beam from the first DOE.

21. A method of manufacturing a laser beam production module to have a module housing; a visible laser diode (VLD) to be mounted within said module housing, for producing a laser beam from its junction having divergent and elliptical beam characteristics; a collimating lens (L1) to be mounted in said module housing, spaced from said VLD by a distance D, for collimating the laser beam, a first fixed spatial-frequency diffractive optical element (DOE) to be mounted in said module housing, having a beam expansion factor M1; and a second fixed spatial-frequency diffractive optical element (DOE) to be mounted in said module housing, having a beam expansion factor M2, such that, in operation, the collimated laser beam exiting said collimating lens L1 is transmitted through said first DOE, and the collimated laser beam exiting said first DOE is transmitted through said second DOE, wherein the first fixed spatial-frequency diffractive optical element (DOE) has fringe surface spacing $d_1$ and is to be mounted in said module housing such that the angle of diffraction of the laser beam from the first DOE is $\theta_{d1}$; and wherein the second fixed spatial-frequency diffractive optical element (DOE) has a fringe surface spacing $d_2$ and is to be mounted in said module housing, such that the angle of incidence of the laser beam on the second DOE is $\theta_{i2}$; wherein the method is characterized by:

(a) calculating a downstream focus location for the collimating lens to adjust or eliminate astigmatism in the beam propagating beyond the second DOE;

(b) calculating values for $d_1$, $d_2$, $\theta_{i2}$, and $\theta_{d1}$ such that $d_2 \cos \theta_{i2} = d_1 \cos \theta_{d1}$;

(c) selecting a value for D according to the calculated downstream focus location, to provide a desired beam spot size, (d) determining an upstream focus location for the lens;
(e) selecting a collimating lens according to the upstream and downstream focus locations; and
(f) manufacturing the laser beam production module in accordance with the selected value for D and the selected lens and values for $d_1$, $d_2$, $\theta_{i2}$, and $\theta_{d1}$, such that a collimated laser beam exiting said second DOE has a controlled beam aspect-ratio, a minimized (or reduced to zero) beam dispersion, and corrected astigmatism.

22. The laser beam producing module manufactured according to claim 21.

* * * * *